United States Patent
Tachibana et al.

(10) Patent No.: US 9,902,875 B2
(45) Date of Patent: *Feb. 27, 2018

(54) COMPOSITION FOR FORMING A COATING TYPE BPSG FILM, SUBSTRATE, AND PATTERNING PROCESS

(71) Applicant: SHIN-ETSU CHEMICAL CO., LTD., Tokyo (JP)

(72) Inventors: Seiichiro Tachibana, Jyoetsu (JP); Yoshinori Taneda, Jyoetsu (JP); Rie Kikuchi, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/851,792

(22) Filed: Sep. 11, 2015

(65) Prior Publication Data

US 2016/0096978 A1   Apr. 7, 2016

(30) Foreign Application Priority Data

Oct. 3, 2014   (JP) .................................. 2014-204545

(51) Int. Cl.
  *C09D 185/04* (2006.01)
  *G03F 7/11* (2006.01)
  (Continued)

(52) U.S. Cl.
  CPC .......... *C09D 185/04* (2013.01); *G03F 7/0752* (2013.01); *G03F 7/11* (2013.01); *H01L 21/02129* (2013.01); *H01L 21/02211* (2013.01); *H01L 21/02216* (2013.01); *H01L 21/02282* (2013.01); *H01L 21/0332* (2013.01); *H01L 21/31111* (2013.01); *H01L 21/31144* (2013.01);
  (Continued)

(58) Field of Classification Search
  CPC .. C09D 185/04; C09D 185/02; C09D 183/06; C09D 183/14; H01L 21/02211; H01L 21/02216; H01L 21/31111; H01L 21/0332; H01L 21/02282; H01L 21/31144; H01L 21/02129; G03F 7/11
  See application file for complete search history.

(56) References Cited

U.S. PATENT DOCUMENTS

2002/0137260 A1* 9/2002 Leung ............... H01L 21/02126 438/118
2007/0117252 A1* 5/2007 Ogihara ................. C08G 77/48 438/72

(Continued)

FOREIGN PATENT DOCUMENTS

EP   2500775 A2 * 9/2012
JP   S55-034258 A   3/1980
(Continued)

OTHER PUBLICATIONS

Full English translation of JP 2006-23706 a (year publishted 2006) generated from machine translation from AIPN Japan Patent Office National Center for Industrial Property Information and Training, generated Oct. 11, 2017, 27 pages.*

(Continued)

*Primary Examiner* — Cynthia Hamilton
(74) *Attorney, Agent, or Firm* — Oliff PLC

(57) ABSTRACT

A composition for forming a coating type BPSG film, containing one or more silicic acid skeletal structures represented by formula (1), one or more phosphoric acid skeletal structures represented by formula (2), one or more boric acid skeletal structures represented by formula (3), and one or more silicon skeletal structures represented by formula (4), wherein the composition contains a coupling between units in formula (4). The composition is capable of forming a BPSG film that has excellent adhesiveness in fine patterning, can be easily wet etched by a removing liquid which does not cause damage to a semiconductor substrate and a coating type organic film or a CVD film mainly consisting of carbon which is required in the patterning process, can maintain the peelability even after dry etching, and can suppress generation of particles by forming it in the coating process.

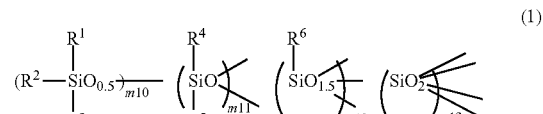

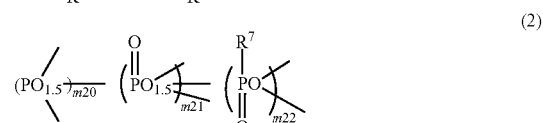

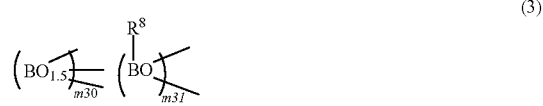

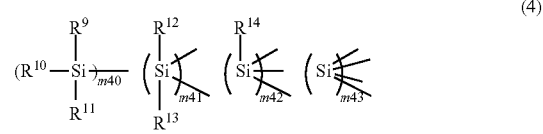

27 Claims, No Drawings

(51) Int. Cl.
  *H01L 21/02* (2006.01)
  *H01L 21/027* (2006.01)
  *H01L 21/033* (2006.01)
  *H01L 21/308* (2006.01)
  *H01L 21/311* (2006.01)
  *H01L 21/3213* (2006.01)
  *G03F 7/075* (2006.01)
  *C09D 183/14* (2006.01)
  *C09D 183/06* (2006.01)
  *C09D 185/02* (2006.01)

(52) U.S. Cl.
  CPC ......... *C09D 183/06* (2013.01); *C09D 183/14* (2013.01); *C09D 185/02* (2013.01)

(56) References Cited

U.S. PATENT DOCUMENTS

| | | |
|---|---|---|
| 2007/0238300 A1 | 10/2007 | Ogihara et al. |
| 2009/0136869 A1 | 5/2009 | Ogihara et al. |
| 2010/0086870 A1 | 4/2010 | Ogihara et al. |
| 2010/0086872 A1 | 4/2010 | Ogihara et al. |
| 2010/0147334 A1 | 6/2010 | Ogihara et al. |
| 2010/0285407 A1 | 11/2010 | Ogihara et al. |
| 2013/0137271 A1 | 5/2013 | Ogihara et al. |
| 2015/0004791 A1* | 1/2015 | Ogihara .............. G03F 7/11 438/703 |
| 2016/0096977 A1* | 4/2016 | Tachibana ........... C09D 183/10 257/618 |

FOREIGN PATENT DOCUMENTS

| | | |
|---|---|---|
| JP | S55-034276 A | 3/1980 |
| JP | S64-49037 A | 2/1989 |
| JP | 2006-023706 A | 1/2006 |
| JP | 2006-139083 A | 6/2006 |
| JP | 2007-302873 A | 11/2007 |
| JP | 2008-52203 A | 3/2008 |
| JP | 2009-126940 A | 6/2009 |
| JP | 2010-085893 A | 4/2010 |
| JP | 2010-085912 A | 4/2010 |
| JP | 2010-139764 A | 6/2010 |
| JP | 2010-262230 A | 11/2010 |
| JP | 2013-137512 A | 7/2013 |

OTHER PUBLICATIONS

Nakamura et al.,"Contact Hole Formation by Multiple Exposure Technique in Ultra-low k1 Lithography," Optical Microlithography, 2004, vol. 5377, pp. 255-263.

Jun. 20, 2017 Office Action issued in Japanese Application No. 2014-204545.

* cited by examiner

COMPOSITION FOR FORMING A COATING TYPE BPSG FILM, SUBSTRATE, AND PATTERNING PROCESS

BACKGROUND OF THE INVENTION

Field of the Invention

The present invention relates to a composition for forming a coating type BPSG film usable in a process for producing a semiconductor device and so forth, a substrate having a film formed from the composition, and a patterning process using the composition.

Description of the Related Art

In 1980s, photo-exposure using g-beam (436 nm) or i-beam (365 nm) of mercury lamp as a light source had been widely used in the resist patterning. As a means for finer patterning, shifting to a exposure light having shorter wavelength was assumed to be effective, so that, for the mass production process of DRAM (Dynamic Random Access Memory) with 64 MB (work size of 0.25 µm or less) in 1990s and later ones, KrF excimer laser (248 nm), whose wavelength is shorter than i-beam (365 nm), had been used in place of i-beam as the exposure light source.

However, for production of DRAM with integration of 256 MB and 1 GB or higher requiring further finer processing technologies (work size of 0.2 µm or less), a light source having a further shorter wavelength was required, and thus, a photolithography using ArF excimer laser (193 nm) has been investigated seriously over a decade. It was expected at first that the ArF lithography would be applied to the fabrication of 180 nm-node devices. However, the KrF excimer lithography survived to the mass production of 130 nm-node devices, so that a full-fledged application of the ArF lithography started from the 90 nm-node.

Furthermore, mass production of the 65 nm-node devices is now underway by combining the ArF lithography with a lens having an increased numerical aperture (NA) of 0.9. For the next 45 nm-node devices, further shortening the wavelength of exposure light is progressing, and the $F_2$ lithography with 157 nm wavelength became a candidate. However, there are many problems in the $F_2$ lithography: cost-up of a scanner due to use of a large quantities of expensive $CaF_2$ single crystal for a projection lens; extremely poor durability of a soft pellicle, which leads to change of an optical system due to introduction of a hard pellicle; decrease in etching resistance of a resist film, and so forth. Because of these problems, development of the $F_2$ lithography was suspended, and ArF immersion lithography was introduced. In the ArF immersion lithography, water having a refractive index of 1.44 is introduced between a projection lens and a wafer by a partial fill method. This enables high speed scanning, and further, mass production of the 45 nm-node devices is now underway by using a lens with a NA of 1.3.

For the 32 nm-node lithography, which is a next promising fine processing technology, a lithography with an extreme-ultraviolet beam (EUV) of 13.5 nm-wavelength is considered to be a candidate. Unfortunately, this technology has problems such as needs for a higher output power of the laser, a higher sensitivity of the resist film, a higher resolution, a lower line edge roughness (LER), a non-defect MoSi laminate mask, a lower aberration of the reflective mirror, and so forth; and thus, there are innumerable problems to be solved at present. Development of the immersion lithography with a high refractive index, which is another candidate for the 32 nm-node, was suspended because of low transmittance of LUAG, a candidate for a high refractive index lens, and an inability to obtain a target value of a liquid's refractive index at 1.8. As mentioned above, in the photo-exposure used as a general technology, resolution based on the wavelength of a light source is approaching to its inherent limit.

Accordingly, development has been promoted in fine processing technology for obtaining a work size exceeding a limiting resolution of the existing ArF-immersion exposure technology. As this technology, double patterning technology is proposed. One example of the double patterning technology is a method (1) that includes forming a first photoresist pattern by first exposure and development with an interval rate of a line to a space of 1:3; processing an under layer hard mask by dry etching; laying another hard mask thereon; forming a second line pattern by subjecting the photoresist film to second exposure and development at a space obtained by the first exposure; processing the hard mask by dry etching to form the first pattern and the second pattern alternately. This method allows to form a line and space pattern with half pitch of the exposure pattern.

Also, there is another method (2) that includes forming a first photoresist pattern by first exposure and development with an interval rate of a line to a space of 3:1; processing an under layer hard mask by dry etching; forming a photoresist film thereon; forming a pattern on a remaining portion of the hard mask by second exposure; and processing the hard mask by dry etching using the pattern as a mask. In both methods, the hard mask is processed by dry etching twice, and a pattern with half pitch of the exposure pattern can be formed. The method (1) requires hard mask formation twice, while the method (2) requires hard mask formation only once, but further requires additional formation of a trench pattern which is more difficult to resolve than a line pattern.

As another example, there has been proposed a method (3) that includes forming a line pattern in X direction with a positive resist film by using a dipole light; curing the resist pattern; applying a resist composition thereon again; exposing a line pattern in Y direction by using a dipole light to form a hole pattern from the gap of the grid-like line pattern (Non-Patent Document 1). Moreover, there has also been proposed a method for halving a pitch by one-time pattern exposure by using spacer technology in which a resist pattern, an organic hard mask, or a polysilicon film having a transferred pattern is used as a core pattern, and after forming a silicon oxide film around the core pattern at a low temperature, the core pattern is removed by dry etching or other method.

Accordingly, finer processing is difficult to achieve only by using a resist film present in the upper layer, and a finer patterning process cannot be readily introduced without using a hard mask formed under the resist film. Under the circumstances, multilayer resist method is known as a method in which a hard mask is used as a resist under layer film. In this method, an intermediate film (e.g. a silicon-containing resist under layer film) whose etching selectivity is different from a photoresist film (i.e. an upper layer resist film) is formed between the upper layer resist film and a substrate to be processed, then a pattern is formed with the upper layer resist film, and the pattern is transferred to the resist under layer film by dry etching using the upper layer resist pattern as a dry etching mask, and further the pattern is transferred to the substrate to be processed or a core film of the spacer process by dry etching using the resist under layer film as a dry etching mask.

The present inventors have proposed a composition for forming a silicon-containing resist under layer film as disclosed in Patent Documents 1 and 2 for a patterning in the semiconductor manufacturing process which exceeds the limit of resolution of ArF liquid immersion lithography in recent years. However, it has inherently been used in a process exceeding the limit of resolution of the ArF liquid immersion lithography, whose difficulty is extremely high; therefore it is virtually impossible to pass through the patterning with a yield of 100%, which may result in a retry of the application of upper layer resist due to abnormalities in application of the upper layer resist or in exposure. If the above-mentioned double patterning process becomes the mainstream of the patterning process in the future, difficulty of the patterning process is further increased, and the frequency of the retrying process is expected to be higher.

The retrying process until now is to remove all the multilayered resist under layer film by dry etching, or to remove the silicon-containing resist under layer film by a removing liquid containing hydrofluoric acid, etc., after peeling the upper layer resist by a solvent, so that damage to the substrate to be processed is concerned.

On the other hand, in the cutting-edge semiconductor, technologies such as three-dimensional transistor and through interconnection, etc., have been used to improve properties of the semiconductor. In a patterning process to be used for forming such a structure in the semiconductor, patterning by the multilayer resist method has been employed. In such a patterning, after pattern formation, a step of removing the silicon-containing resist under layer film without causing damage to the pattern is occasionally required. However, main constitutional elements of the conventional silicon-containing resist under layer film and main constitutional elements of the pattern are both silicon in many cases, so that even if one wishes to selectively remove the resist under layer film, it is difficult to suppress the damage to the pattern by either of dry etching or wet etching using a hydrofluoric acid type removing liquid, because these constitutional components are similar.

In addition, there is another problem that if a silicon-containing resist under layer film is used as a mask to process an organic under layer film just under the same by dry etching, the silicon-containing resist under layer film is modified by the dry etching, and thereby hardly removed by wet etching.

Further, after forming a structure in the so-called front-end of the semiconductor, there is a process which facilitates a wiring process by flattening the structure before forming a wire on the structure. So far, a BPSG (boron phosphorus silicon glass) film is formed by the CVD method, and then the BPSG film is flattened by thermo-fusion with a heat treatment. However, in the CVD method, generation of fine grains, so-called particles cannot be avoided principally, and a special cleaning process for removing the particles is required, so that the process is inefficient.

PRIOR ART DOCUMENTS

Patent Documents

Patent Document 1: Japanese Patent Laid-Open Publication No. 2007-302873
Patent Document 2: Japanese Patent Laid-Open Publication No. 2010-262230
Patent Document 3: Japanese Patent Laid-Open Publication No. 2009-126940
Patent Document 4: Japanese Patent Laid-Open Publication No. 2010-085893
Patent Document 5: Japanese Patent Laid-Open Publication No. 2010-085912

Patent Document 6: Japanese Patent Laid-Open Publication No. 2010-139764
Non-Patent Document 1: Proc. SPIE Vol. 5377 p 255 (2004)

SUMMARY OF THE INVENTION

As mentioned above, when the conventional silicon-containing resist under layer film is used, problems arise that dry etching or a hydrofluoric acid type removing liquid causes damage to the substrate in the retrying process of patterning or in the manufacturing process of the semiconductor structure; and that if an organic under layer film just under the same is processed by dry etching, the silicon-containing resist under layer film after dry etching is modified, and thereby hardly removed by wet etching. Further, in the conventional BPSG film formation by CVD, there is a problem that a large amount of particles are generated, so that a process for washing and removing these particles is required, which makes the process inefficient.

The present invention has been accomplished in view of the above-mentioned problems, and an object thereof is to provide a composition for forming a coating type BPSG film that has excellent adhesiveness in fine pattern, can be easily wet etched by a removing liquid which does not cause damage to a semiconductor substrate and a coating type organic film or a CVD film mainly consisting of carbon which are necessary in the patterning process, can maintain the peelability even after dry etching, and can suppress generation of particles by forming it in the coating process.

To accomplish the above-mentioned object, the present invention provides a composition for forming a coating type BPSG film, comprising:

one or more silicic acid skeletal structures represented by the formula (1); one or more phosphoric acid skeletal structures represented by the formula (2); one or more boric acid skeletal structures represented by the formula (3); and one or more silicon skeletal structures represented by the formula (4); wherein the composition contains a coupling between units in the formula (4),

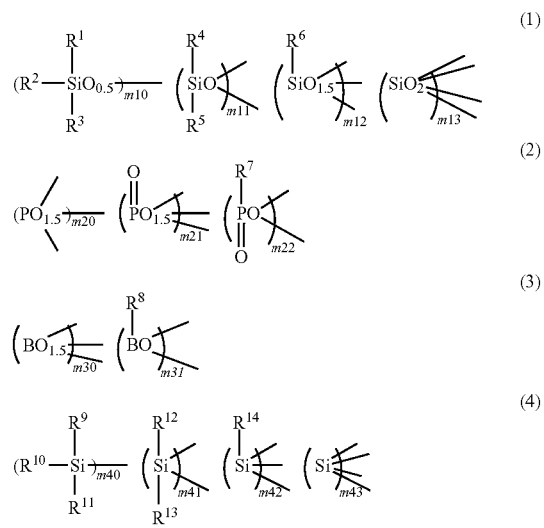

wherein $R^1$, $R^2$, $R^3$, $R^4$, $R^5$, $R^6$, $R^7$, and $R^8$ each represent a hydrogen atom or an organic group having 1 to 30 carbon atoms, wherein a hydrogen atom(s) in the organic group may be substituted by a halogen atom(s); $R^9$, $R^{10}$, $R^{11}$, $R^{12}$, $R^{13}$, and $R^{14}$ each represent a methyl group, a phenyl group, or a hydroxyl group; m10, m11, m12, and m13 each represent a molar fraction in the silicic acid skeletal structure, and satisfy m10+m11+m12+m13=1, 0≤m10≤0.3, 0≤m11≤0.5, 0≤m12≤0.7, and 0<m13≤1; m20, m21, and m22 each represent a molar fraction in the phosphoric acid skeletal structure, and satisfy m20+m21+m22=1, 0≤m20≤1, 0≤m21≤1, and 0≤m22<1; m30 and m31 each represent a molar fraction in the boric acid skeletal structure, and satisfy m30+m31=1, 0≤m30≤1, and 0≤m31≤1; and m40, m41, m42, and m43 each represent a molar fraction in the silicon skeletal structure, and satisfy m40+m41+m42+m43=1, 0≤m40≤1, 0≤m41≤1, 0≤m42≤1, and 0≤m43≤1.

The composition for forming a coating type BPSG film of the present invention can give a BPSG film that has excellent adhesiveness in fine pattern and can be easily wet etched by a removing liquid which does not cause damage to a semiconductor substrate and a coating type organic film or a CVD film mainly consisting of carbon which is required in the patterning process. Moreover, the composition for forming a coating type BPSG film can give a BPSG film in which generation of particles is suppressed by forming it in the coating process. Particularly, when an organic group substituted by a halogen atom is introduced thereinto, the peelability is improved. In addition, the Si—Si bond obtained when units constituting the silicon skeletal structures represented by the formula (4) are bonded to each other is cleaved under alkaline conditions, so that the introduction thereof can enhance the peelability by an alkaline chemical solution.

In this case, the composition for forming a coating type BPSG film preferably comprises a solvent and (A) one or more polymers selected from a hydrolysate, a condensate, and a hydrolysis condensate of a mixture containing one or more silicon compounds represented by the formulae (A-1-1) to (A-1-4), one or more phosphorus compounds represented by the formulae (A-2-1) to (A-2-6), one or more boron compounds represented by the formulae (A-3-1) to (A-3-3), and one or more polysilane compounds represented by the formula (A-4-1), $$R^1R^2R^3SiOR \qquad (A\text{-}1\text{-}1)$$

$$R^4R^5Si(OR)_2 \qquad (A\text{-}1\text{-}2)$$

$$R^6Si(OR)_3 \qquad (A\text{-}1\text{-}3)$$

$$Si(OR)_4 \qquad (A\text{-}1\text{-}4)$$

wherein R represents a hydrocarbon group having 1 to 6 carbon atoms; and $R^1$, $R^2$, $R^3$, $R^4$, $R^5$, and $R^6$ have the same meanings as defined above, $$PX_3 \qquad (A\text{-}2\text{-}1)$$

$$POX_3 \qquad (A\text{-}2\text{-}2)$$

$$P_2O_5 \qquad (A\text{-}2\text{-}3)$$

$$H(HPO_3)_{a1}OH \qquad (A\text{-}2\text{-}4)$$

$$R^7PX_2 \qquad (A\text{-}2\text{-}5)$$

$$R^7POX_2 \qquad (A\text{-}2\text{-}6)$$

wherein $R^7$ has the same meaning as defined above; X represents a halogen atom, a hydroxyl group, or an alkoxy group having 1 to 6 carbon atoms; and a1 is an integer of 1 or more, $$BX_3 \qquad (A\text{-}3\text{-}1)$$

$$B_2O_3 \qquad (A\text{-}3\text{-}2)$$

$$R^8BX_2 \qquad (A\text{-}3\text{-}3)$$

wherein $R^8$ and X have the same meanings as defined above, $$(R^9R^{10}R^{11}Si)_{a2}(R^{12}R^{13}Si)_{a3}(R^{14}Si)_{a4}(Si)_{a5} \qquad (A\text{-}4\text{-}1)$$

wherein $R^9$, $R^{10}$, $R^{11}$, $R^{12}$, $R^{13}$, and $R^{14}$ have the same meanings as defined above; and a2, a3, a4, and a5 each represent a molar fraction, and satisfy a2+a3+a4+a5=1, 0≤a2≤1, 0≤a3≤1, 0≤a4≤1, and 0≤a5≤1.

By using such silicon compounds, phosphorus compounds, boron compounds, and polysilane compounds for component (A), the composition for forming a coating type BPSG film having the silicic acid skeletal structure, the phosphoric acid skeletal structure, the boric acid skeletal structure, and the silicon skeletal structure as mentioned above can be obtained.

Further, it is preferred that the compound represented by the formula (A-4-1) to be used for the manufacture of the composition for forming a coating type BPSG film have a weight average molecular weight of 1,000 or less.

When the weight average molecular weight is 1,000 or less, a hydrolysate, a condensate, and a hydrolysis condensate of a mixture containing the polysilane compound represented by the formula (A-4-1) easily dissolves in a solvent component in the composition for forming a coating type BPSG film, and generation of particles during film formation can be prevented.

Alternatively, the composition for forming a coating type BPSG film may comprise a solvent; (A) one or more polymers selected from a hydrolysate, a condensate, and a hydrolysis condensate of a mixture containing one or more silicon compounds represented by the formulae (A-1-1) to (A-1-4), one or more phosphorus compounds represented by the formulae (A-2-1) to (A-2-6), and one or more boron compounds represented by the formulae (A-3-1) to (A-3-3); and (B) one or more polysilane compounds represented by the formula (B-1), $$R^1R^2R^3SiOR \qquad (A\text{-}1\text{-}1)$$

$$R^4R^5Si(OR)_2 \qquad (A\text{-}1\text{-}2)$$

$$R^6Si(OR)_3 \qquad (A\text{-}1\text{-}3)$$

$$Si(OR)_4 \qquad (A\text{-}1\text{-}4)$$

wherein R represents a hydrocarbon group having 1 to 6 carbon atoms; and $R^1$, $R^2$, $R^3$, $R^4$, $R^5$, and $R^6$ have the same meanings as defined above, $$PX_3 \qquad (A\text{-}2\text{-}1)$$

$$POX_3 \qquad (A\text{-}2\text{-}2)$$

$$P_2O_5 \qquad (A\text{-}2\text{-}3)$$

$$H(HPO_3)_{a1}OH \qquad (A\text{-}2\text{-}4)$$

$$R^7PX_2 \qquad (A\text{-}2\text{-}5)$$

$$R^7POX_2 \qquad (A\text{-}2\text{-}6)$$

wherein $R^7$ has the same meaning as defined above; X represents a halogen atom, a hydroxyl group, or an alkoxy group having 1 to 6 carbon atoms; and a1 is an integer of 1 or more, $$BX_3 \qquad (A\text{-}3\text{-}1)$$

$$B_2O_3 \qquad (A\text{-}3\text{-}2)$$

$$R^8BX_2 \qquad (A\text{-}3\text{-}3)$$

wherein $R^8$ and X have the same meanings as defined above, $$(R^9R^{10}R^{11}Si)_{a2}(R^{12}R^{13}Si)_{a3}(R^{14}Si)_{a4}(Si)_{a5} \qquad (B\text{-}1)$$

wherein $R^9$, $R^{10}$, $R^{11}$, $R^{12}$, $R^{13}$, and $R^{14}$ have the same meanings as defined above; and a2, a3, a4, and a5 each represent a molar fraction, and satisfy a2+a3+a4+a5=1, 0≤a2≤1, 0≤a3≤1, 0≤a4≤1, and 0≤a5≤1.

By using such silicon compounds, phosphorus compounds, and boron compounds for component (A), and further adding the polysilane compounds represented by the formula (B-1) as component (B), the composition for forming a coating type BPSG film having the silicic acid skeletal structure, the phosphoric acid skeletal structure, the boric acid skeletal structure, and the silicon skeletal structure as mentioned above can be obtained.

Further, it is preferred that the compound represented by the formula (B-1) have a weight average molecular weight of 1,000 or less.

When the weight average molecular weight is 1,000 or less, the compound of formula (B-1) easily dissolves in a solvent component in the composition for forming a coating type BPSG film, and generation of particles during film formation can be prevented.

Also, the composition for forming a coating type BPSG film preferably further comprises (C) one or more members selected from one or more silicon compounds represented by the formula (C-1), a hydrolysate, a condensate, and a hydrolysis condensate thereof,

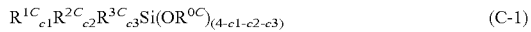

wherein $R^{OC}$ represents a hydrocarbon group having 1 to 6 carbon atoms; $R^{1C}$, $R^{2C}$, and $R^{3C}$ each represent a hydrogen atom or a monovalent organic group having 1 to 30 carbon atoms; and c1, c2, and c3 are each 0 or 1, and satisfy 1≤c1+c2+c3≤3.

By using the component (C), the composition for forming a coating type BPSG film can give a film that has an improved adhesiveness to a photoresist pattern and does not cause a pattern collapse even in a fine patterning when used as a resist under layer film.

In this case, one or more of $R^{1C}$, $R^{2C}$, and $R^{3C}$ in the formula (C-1) are preferably an organic group having a hydroxyl group or a carboxyl group each substituted by an acid-labile group.

If such component (C) is used, the pattern adhesiveness to a fine pattern can be more improved.

Also, the component (C) preferably contains one or more members selected from one or more silicon compounds represented by the formulae (A-1-1) to (A-1-4), one or more phosphorus compounds represented by the formulae (A-2-1) to (A-2-6), and one or more boron compounds represented by the formulae (A-3-1) to (A-3-3) each alone, a mixture thereof, and a hydrolysate, a condensate, and a hydrolysis condensate thereof.

In this way, the component (C) may also contain the silicon compound, the phosphorus compound, and the boron compound, whereby the composition for forming a coating type BPSG film can exhibit the inventive effect more surely.

Further, the composition for forming a coating type BPSG film preferably further comprises an organic compound having 2 or more hydroxyl groups or carboxyl groups in one molecule.

By adding such an organic compound, collapse of the BPSG film is promoted during wet etching whereby peeling becomes easy.

Also, the present invention provides a substrate for use in a semiconductor manufacturing process, comprising a BPSG film formed on a body to be processed by applying the above-mentioned composition for forming a coating type BPSG film.

At this time, the BPSG film may function as at least one of a resist under layer film, a flattening film, and an insulating film.

Thus, the composition for forming a coating type BPSG film of the present invention can be applied onto the body to be processed to obtain a substrate using it as a resist under layer film, a flattening film, or an insulating film.

In the substrate, the body to be processed may be a semiconductor substrate on which a part or whole of semiconductor circuits have been formed, and the BPSG film may be formed by applying the composition for forming a coating type BPSG film by spin-coating onto the semiconductor substrate and then baking the same.

By applying the composition for forming a coating type BPSG film of the present invention by spin coating onto the semiconductor substrate on which a part or whole of semiconductor circuits have been formed, and then baking the same, a BPSG film can be formed on such a substrate.

Also, the present invention provides a patterning process comprising: forming an organic under layer film on a body to be processed by using a coating type organic under layer film material; forming a BPSG film on the organic under layer film by using the above-mentioned composition for forming a coating type BPSG film; forming an upper layer resist film on the BPSG film; forming a pattern with the upper layer resist film; transferring the pattern to the BPSG film by etching using the upper layer resist film having the formed pattern as a mask; and transferring the pattern to the organic under layer film by etching using the BPSG film having the transferred pattern as a mask to form a mask pattern for processing the body to be processed.

Furthermore, the present invention provides a patterning process comprising: forming a hard mask mainly consisting of carbon on a body to be processed by a CVD method; forming a BPSG film on the hard mask by using the above-mentioned composition for forming a coating type BPSG film; forming an upper layer resist film on the BPSG film; forming a pattern with the upper layer resist film; transferring the pattern to the BPSG film by etching using the upper layer resist film having the formed pattern as a mask; and transferring the pattern to the hard mask by etching using the BPSG film having the transferred pattern as a mask to form a mask pattern for processing the body to be processed.

When pattern formation is carried out by using the composition for forming a coating type BPSG film of the present invention, by optimizing the combination of the coating type organic under layer film or the CVD film mainly consisting of carbon as mentioned above, the pattern formed at the upper layer resist film can be transferred to the body to be processed without generating the difference in size conversion.

After forming the mask pattern for processing the body to be processed, the BPSG film may be removed by wet etching.

When a pattern is formed by using the composition for forming a coating type BPSG film of the present invention, the BPSG film can be readily removed by wet etching without causing damage to the coating type organic under layer film or the CVD film mainly consisting of carbon. Also, the BPSG film obtained from the composition for forming a coating type BPSG film of the present invention exhibits an excellent peelability by wet etching even after an organic under layer film right under the same is processed by dry etching.

The wet etching is preferably performed by an alkaline solution.

A BPSG film obtained from the composition for forming a coating type BPSG film of the present invention has a Si—Si bond to be cleaved under alkaline conditions, so that it exhibits good peelability particularly when treated with an alkaline solution.

The body to be processed may be a material in which any of a metal film, an amorphous metal film, a metal carbide film, a metal oxide film, a metal nitride film, a metal oxycarbide film or a metal oxynitride film is formed on a semiconductor substrate on which a part or whole of semiconductor circuits have been formed, as a layer to be processed.

Further, the metal constituting the body to be processed may comprise silicon, titanium, tungsten, hafnium, zirconium, chromium, germanium, copper, aluminum, indium, gallium, arsenic, palladium, iron, tantalum, iridium, molybdenum, or an alloy thereof.

Accordingly, the patterning process of the present invention can form a pattern by processing the body to be processed as mentioned above.

Further, the pattern formation of the upper layer resist film is preferably carried out by a lithography method using light with a wavelength of 300 nm or less or EUV light, an electron beam direct drawing method, a directed self-assembly method or a nano-imprinting lithography method.

By using these methods, a fine pattern can be formed with an upper layer resist film.

The coating type BPSG film formed by using the composition for forming a coating type BPSG film of the present invention may serve as a resist under layer film that has excellent adhesiveness to a photoresist pattern formed thereon and does not cause a pattern collapse even in a fine pattern. Moreover, this coating type BPSG film shows high etching selectivity to both of a resist pattern formed at the upper side and an organic film formed at the lower side, so that a formed photoresist pattern can be transferred to the substrate by dry etching process. Moreover, it can be easily wet etched by a removing liquid which does not cause damage to the semiconductor substrate and the coating type organic under layer film or the CVD film mainly consisting of carbon, and the BPSG film can be easily wet etched also in the retrying process. Further, this BPSG film can maintain wet-etching property even after the organic under layer film just under the same is processed by dry etching so that film removal after pattern formation is realized.

Further, when a flattening film or an insulating film is formed by using the composition for forming a coating type BPSG film of the present invention, the BPSG film can be formed without generating particles during film formation.

Moreover, when a pattern is formed by using the composition for forming a coating type BPSG film of the present invention, by optimizing the combination of the coating type organic under layer film or the CVD film mainly consisting of carbon, a pattern formed with the photoresist can be transferred to the substrate without generating the difference in size conversion.

DETAILED DESCRIPTION OF THE PREFERRED EMBODIMENTS

As mentioned above, when the conventional silicon-containing resist under layer film is used, problems arise that dry etching or a hydrofluoric acid type removing liquid causes damage to the substrate in the retrying process of patterning or in the manufacturing process of the semiconductor structure. In addition, although the silicon-containing resist under layer film needs to be removed by wet etching after pattern formation in the manufacture of semiconductor structure, there is a problem that if the organic under layer film just under the same is processed by dry etching, the silicon-containing resist under layer film after dry etching is modified, and thereby hardly removed by wet etching. Further, in the conventional BPSG film formation by CVD, there is a problem that a large amount of particles are generated, so that a process for washing and removing these particles is required, which makes the process inefficient.

Thus, it has been desired to develop a composition for forming a coating type BPSG film that has excellent adhesiveness in fine pattern; can be easily wet etched by a removing liquid which does not cause damage to a semiconductor substrate and a coating type organic film or a CVD film mainly consisting of carbon which are necessary in the patterning process, for example, by an ammonia aqueous solution containing hydrogen peroxide called SC (Standard Clean) 1, or by hydrochloric acid containing hydrogen peroxide called SC2, which have been generally used in the semiconductor manufacturing process; and can maintain the peelability even after dry etching.

The present inventors have intensively studied to solve the above-mentioned problems, and consequently found that a coating film obtained from a composition containing a silicon-containing compound that has boron, phosphorus, and silicon skeletal structures (polysilane structure) can be readily removed by an alkaline solution, SC1, and shows equal heat-fusible properties such as flattening, etc., with those of the conventional BPSG film formed by CVD, thereby brought the present invention to completion.

In the prior art regarding the silicon-containing resist under layer film, there are techniques disclosed in Patent Documents 3 to 6 as a material containing boron or phosphorus, and further containing an organic cross-linking agent. However, said prior art references merely disclose limitative combination of these except for silicon, and they do not disclose wet-etching property that is exhibited by combining boron, phosphorus, and polysilane structure, and further an organic cross-linking agent as disclosed in the present invention.

In the following, embodiments of the present invention are explained, but the present invention is not limited thereto. Herein, "Me" represents a methyl group, "Et" represents an ethyl group, "Bu" represents a butyl group, and "Ac" represents an acetyl group.

The present invention is directed to a composition for forming a coating type BPSG film which includes one or more silicic acid skeletal structures represented by the formula (1); one or more phosphoric acid skeletal structures represented by the formula (2); one or more boric acid skeletal structures represented by the formula (3); and one or more silicon skeletal structures represented by the formula (4); and further contains a coupling between units in the formula (4). Herein, "containing a coupling between units in the formula (4)" indicates that the composition contains a Si—Si bond formed by bonding units of one or more kinds shown in the formula (4) to each other.

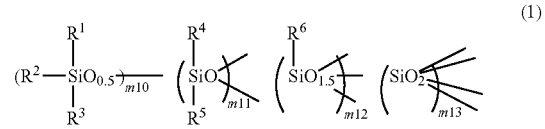

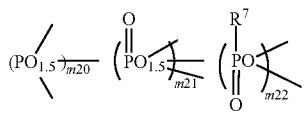
(2)

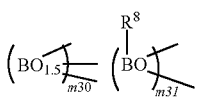
(3)

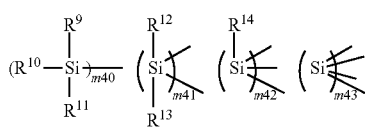
(4)

wherein $R^1$, $R^2$, $R^3$, $R^4$, $R^5$, $R^6$, $R^7$, and $R^8$ each represent a hydrogen atom or an organic group having 1 to 30 carbon atoms, wherein a hydrogen atom(s) in the organic group may be substituted by a halogen atom(s); $R^9$, $R^{10}$, $R^{11}$, $R^{12}$, $R^{13}$, and $R^{14}$ each represent a methyl group, a phenyl group, or a hydroxyl group; m10, m11, m12, and m13 each represent a molar fraction in the silicic acid skeletal structure, and satisfy m10+m11+m12+m13=1, 0≤m10≤0.3, 0≤m11≤0.5, 0≤m12≤0.7, and 0<m13≤1; m20, m21, and m22 each represent a molar fraction in the phosphoric acid skeletal structure, and satisfy m20+m21+m22=1, 0≤m20≤1, 0≤m21≤1, and 0≤m22<1; m30 and m31 each represent a molar fraction in the boric acid skeletal structure, and satisfy m30+m31=1, 0≤m30≤1, and 0≤m31≤1; and m40, m41, m42, and m43 each represent a molar fraction in the silicon skeletal structure, and satisfy m40+m41+m42+m43=1, 0≤m40≤1, 0≤m41≤1, 0≤m42≤1, and 0≤m43≤1.

In the formulae (1) to (3), $R^1$, $R^2$, $R^3$, $R^4$, $R^5$, $R^6$, $R^7$, and $R^8$ each represent a hydrogen atom or an organic group having 1 to 30 carbon atoms, and a hydrogen atom in the organic group may be substituted by a halogen atom. The halogen atom is preferably a fluorine atom or chlorine atom. If an organic group substituted by such a halogen atom is introduced, a BSPG film obtained from the composition for forming a coating type BPSG film of the present invention is improved in peelability.

In the formula (1), m10, m11, m12, and m13 each represent a molar fraction in the silicic acid skeletal structure, and satisfy m10+m11+m12+m13=1, 0≤m10≤0.3, 0≤m11≤0.5, 0≤m12≤0.7, and 0<m13≤1.

$SiO_2$ is an essential unit in the silicic acid skeletal structure. When the respective units satisfy the above ratio, a composition for forming a coating type BPSG film having good dry etching resistance, pattern adhesiveness, and wet etching property with good balance, can be obtained.

In the formula (2), m20, m21, and m22 each represent a molar fraction in the phosphoric acid skeletal structure, and satisfy m20+m21+m22=1, 0≤m20≤1, 0≤m21≤1, and 0≤m22<1.

$PO_{1.5}$ or $PO_{2.5}$ is an essential unit in the phosphoric acid skeletal structure. When the respective units satisfy the above ratio, a composition for forming a coating type BPSG film having dry good etching resistance, pattern adhesiveness and wet etching property with good balance, can be obtained.

In the formula (3), m30 and m31 each represent a molar fraction in the boric acid skeletal structure, and satisfy m30+m31=1, 0≤m30≤1, and 0≤m31≤1.

In the boric acid skeletal structure, either of the units may be contained alone, or both units may be contained.

In the formula (4), m40, m41, m42, and m43 each represent a molar fraction in the silicon skeletal structure, and satisfy m40+m41+m42+m43=1, 0≤m40≤1, 0≤m41≤1, 0≤m42≤1, and 0≤m43≤1.

These units constitute the silicon skeletal structure, and the structure may be any of linear, branched, and cyclic.

Such a composition for forming a coating type BPSG film can form a BPSG film that has excellent adhesiveness in fine pattern, and can be easily wet etched by a removing liquid which does not cause damage to a semiconductor substrate and a coating type organic film or a CVD film mainly consisting of carbon which are necessary in the patterning process. In particular, the composition for forming a coating type BPSG film of the present invention has a Si—Si bond to be cleaved in an alkaline solution, so that it can give a BPSG film excellent in peelability with an alkaline solution. Further the composition for forming a coating type BPSG film as mentioned above can form a BPSG film having no particle by the coating process.

[Component (A)]

The component (A) in the composition for forming a coating type BPSG film of the present invention is preferably one or more polymers selected from a hydrolysate, a condensate, and a hydrolysis condensate of a mixture containing one or more silicon compounds represented by the formulae (A-1-1) to (A-1-4), one or more phosphorus compounds represented by the formulae (A-2-1) to (A-2-6), one or more boron compounds represented by the formulae (A-3-1) to (A-3-3), and one or more polysilane compounds represented by the formula (A-4-1), $$R^1R^2R^3SiOR \quad \text{(A-1-1)}$$

$$R^4R^5Si(OR)_2 \quad \text{(A-1-2)}$$

$$R^6Si(OR)_3 \quad \text{(A-1-3)}$$

$$Si(OR)_4 \quad \text{(A-1-4)}$$

wherein R represents a hydrocarbon group having 1 to 6 carbon atoms; and $R^1$, $R^2$, $R^3$, $R^4$, $R^5$, and $R^6$ have the same meanings as defined above, $$PX_3 \quad \text{(A-2-1)}$$

$$POX_3 \quad \text{(A-2-2)}$$

$$P_2O_5 \quad \text{(A-2-3)}$$

$$H(HPO_3)_{a1}OH \quad \text{(A-2-4)}$$

$$R^7PX_2 \quad \text{(A-2-5)}$$

$$R^7POX_2 \quad \text{(A-2-6)}$$

wherein $R^7$ has the same meaning as defined above; X represents a halogen atom, a hydroxyl group, or an alkoxy group having 1 to 6 carbon atoms; and a1 is an integer of 1 or more, $$BX_3 \quad \text{(A-3-1)}$$

$$B_2O_3 \quad \text{(A-3-2)}$$

$$R^8BX_2 \quad \text{(A-3-3)}$$

wherein $R^8$ and X have the same meanings as defined above, $$(R^9R^{10}R^{11}Si)_{a2}(R^{12}R^{13}Si)_{a3}(R^{14}Si)_{a4}(Si)_{a5} \quad \text{(A-4-1)}$$

wherein $R^9$, $R^{10}$, $R^{11}$, $R^{12}$, $R^{13}$, and $R^{14}$ have the same meanings as defined above; and a2, a3, a4, and a5 each represent a molar fraction, and satisfy a2+a3+a4+a5=1, 0≤a2≤1, 0≤a3≤1, 0≤a4≤1, and 0≤a5≤1.

[Silicon Compound]

The silicon compound that can be used for component (A) may be exemplified by a material represented by the formula (A-1-1), $$R^1R^2R^3SiOR \qquad (A\text{-}1\text{-}1)$$

wherein R represents a hydrocarbon group having 1 to 6 carbon atoms; and $R^1$, $R^2$, and $R^3$ each represent a hydrogen atom or an organic group having 1 to 30 carbon atoms, wherein a hydrogen atom(s) in the organic group may be substituted by a halogen atom(s).

Preferable examples of the silicon compound represented by the formula (A-1-1) include trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, dimethyl phenethyl ethoxy silane, etc.

The silicon compound that can be used for component (A) may be exemplified by a material represented by the formula (A-1-2), $$R^4R^5Si(OR)_2 \qquad (A\text{-}1\text{-}2)$$

wherein R represents a hydrocarbon group having 1 to 6 carbon atoms; and $R^4$ and $R^5$ each represent a hydrogen atom or an organic group having 1 to 30 carbon atoms, wherein a hydrogen atom(s) in the organic group may be substituted by a halogen atom(s).

Preferable examples of the silicon compound represented by the formula (A-1-2) include dimethyl dimethoxy silane, dimethyl diethoxy silane, dimethyl dipropoxy silane, dimethyl diisopropoxy silane, methyl ethyl dimethoxy silane, methyl ethyl diethoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-sec-butyl diethoxy silane, di-sec-butyl dipropoxy silane, di-sec-butyl diisopropoxy silane, di-tert-butyl dimethoxy silane, di-tert-butyl diethoxy silane, di-tert-butyl dipropoxy silane, di-tert-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl) dimethoxy silane, bis(bicycloheptenyl) diethoxy silane, bis(bicycloheptenyl) dipropoxy silane, bis(bicycloheptenyl) diisopropoxy silane, bis(bicycloheptyl) dimethoxy silane, bis(bicycloheptyl) diethoxy silane, bis(bicycloheptyl) dipropoxy silane, bis(bicycloheptyl) diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, etc.

The silicon compound that can be used for component (A) may be exemplified by a material represented by the formula (A-1-3), $$R^6Si(OR)_3 \qquad (A\text{-}1\text{-}3)$$

wherein R represents a hydrocarbon group having 1 to 6 carbon atoms; and $R^6$ represents a hydrogen atom or an organic group having 1 to 30 carbon atoms, wherein a hydrogen atom(s) in the organic group may be substituted by a halogen atom(s).

Preferable examples of the silicon compound represented by the general formula (A-1-3) include trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, tert-butyl trimethoxy silane, tert-butyl triethoxy silane, tert-butyl tripropoxy silane, tert-butyl triisopropoxy silane, isobutyl trimethoxy silane, isobutyl triethoxy silane, allyl trimethoxy silane, allyl triethoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, anisyl trimethoxy silane, anisyl triethoxy silane, anisyl tripropoxy silane, anisyl triisopropoxy silane, tolyl trimethoxy silane, tolyl triethoxy silane, tolyl tripropoxy silane, tolyl triisopropoxy silane, phenethyl trimethoxy silane, phenethyl triethoxy silane, phenethyl tripropoxy silane, phenethyl triisopropoxy silane, benzoyloxymethyl trimethoxy silane, benzoyloxymethyl triethoxy silane, benzoyloxymethyl tripropoxy silane, benzoyloxymethyl tributoxy silane, benzoyloxypropyl trimethoxy silane, benzoyloxypropyl triethoxy silane, benzoyloxypropyl tripropoxy silane, benzoyloxypropyl tributoxy silane, naphthyl trimethoxy silane, naphthyl triethoxy silane, naphthyl tripropoxy silane, naphthyl triisopropoxy silane, etc.

Moreover, examples of the silicon compound in which a hydrogen atom(s) in the organic group represented by $R^1$, $R^2$, $R^3$, $R^4$, $R^5$, and $R^6$ is/are substituted by a halogen atom(s) are shown below.

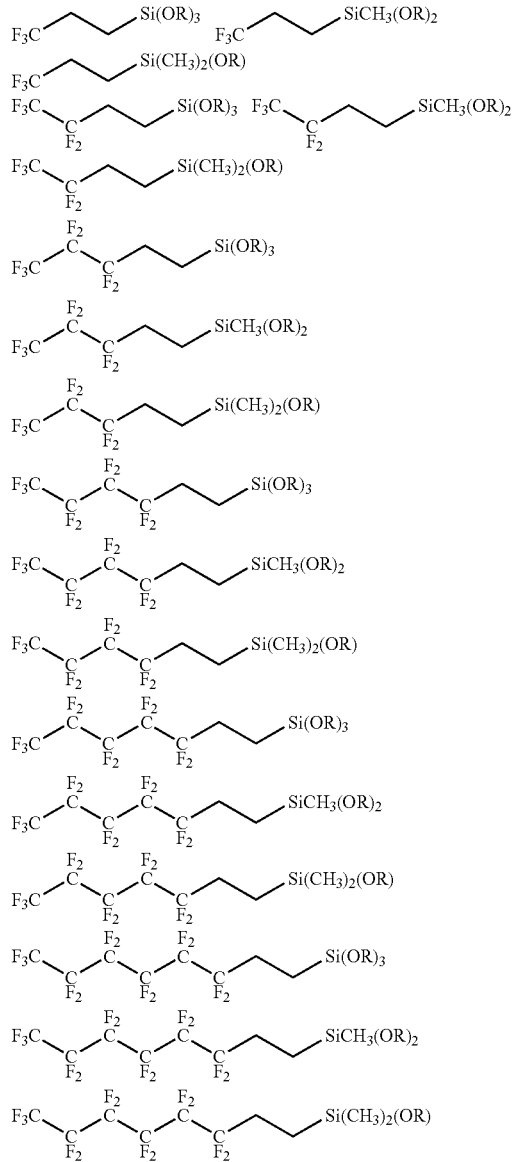

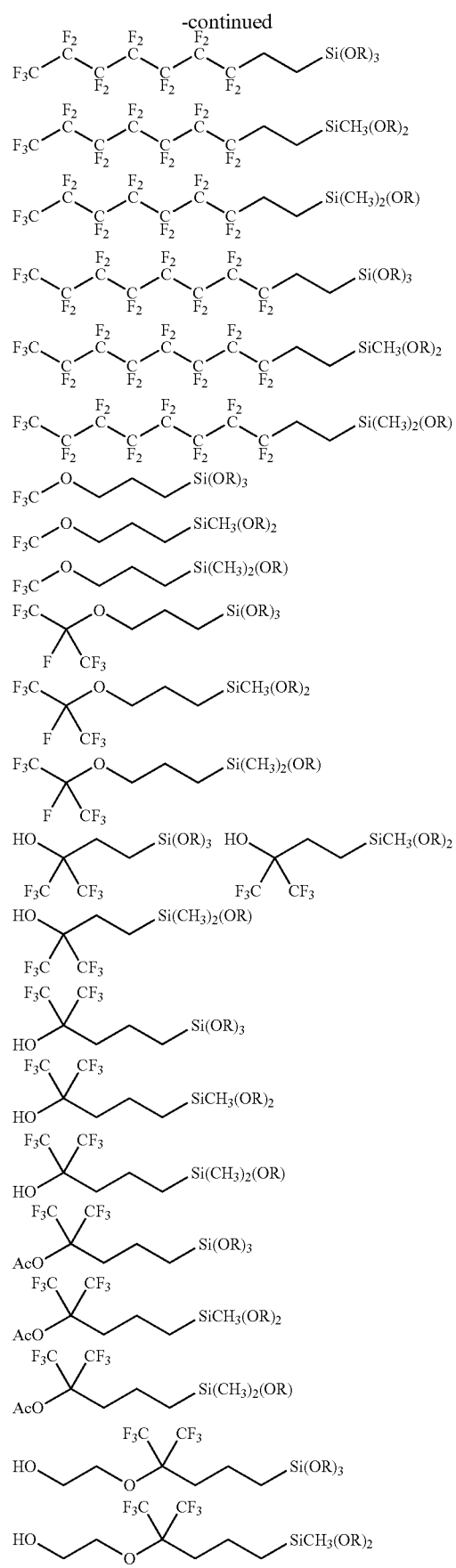

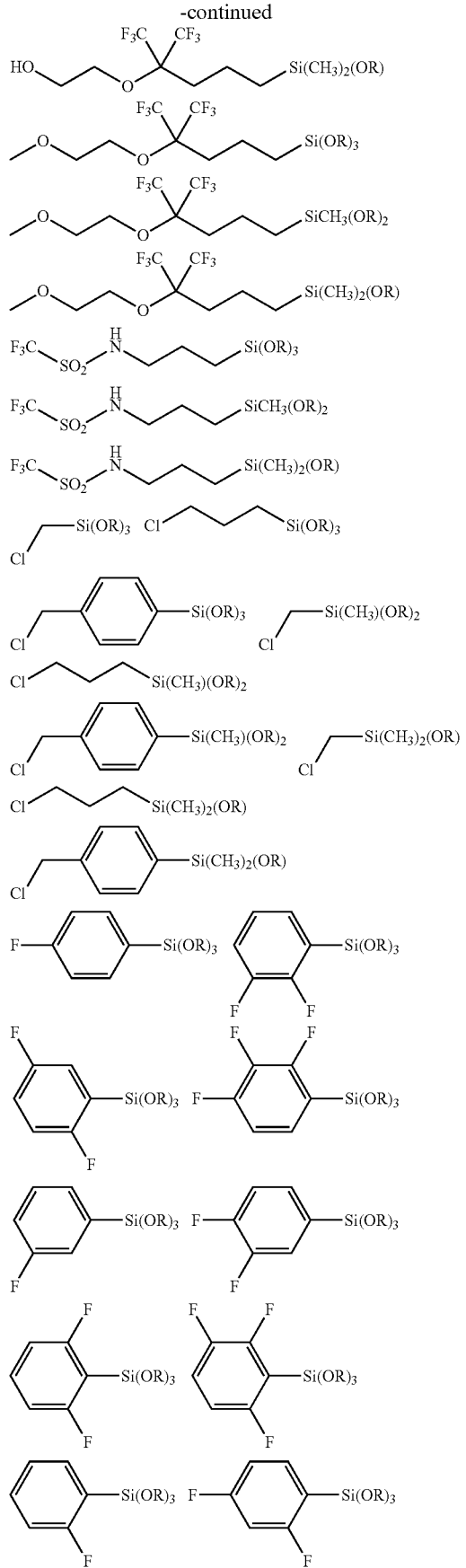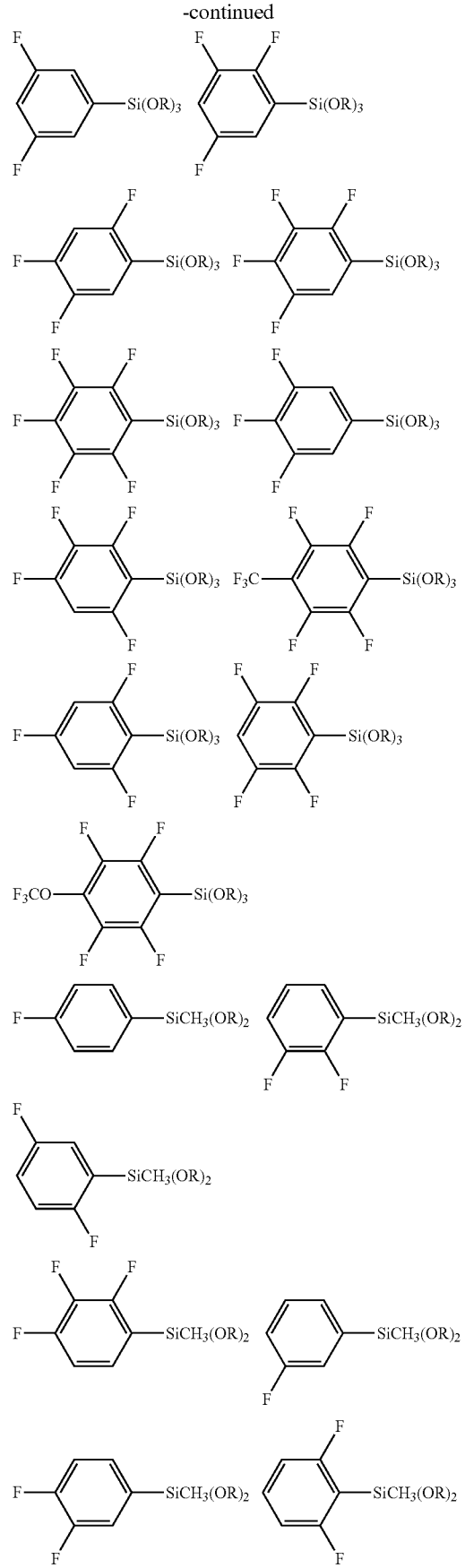

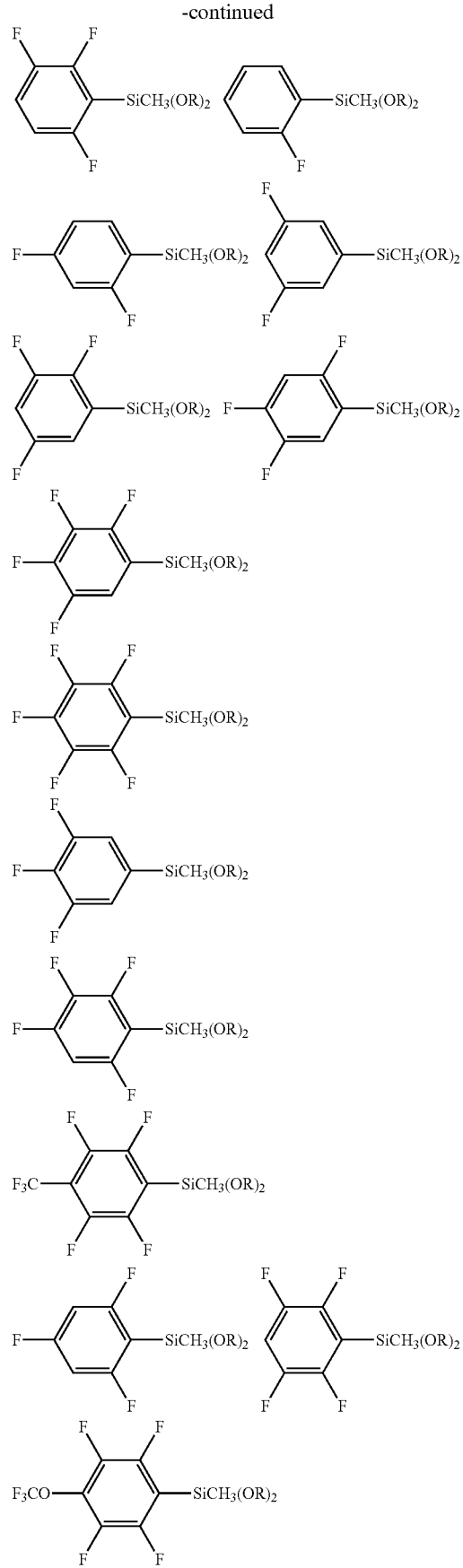
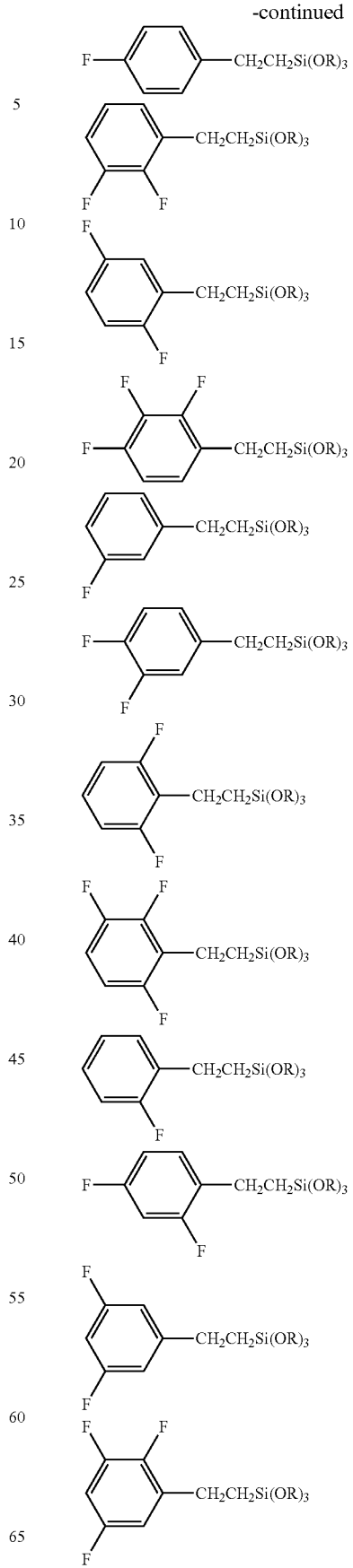

-continued
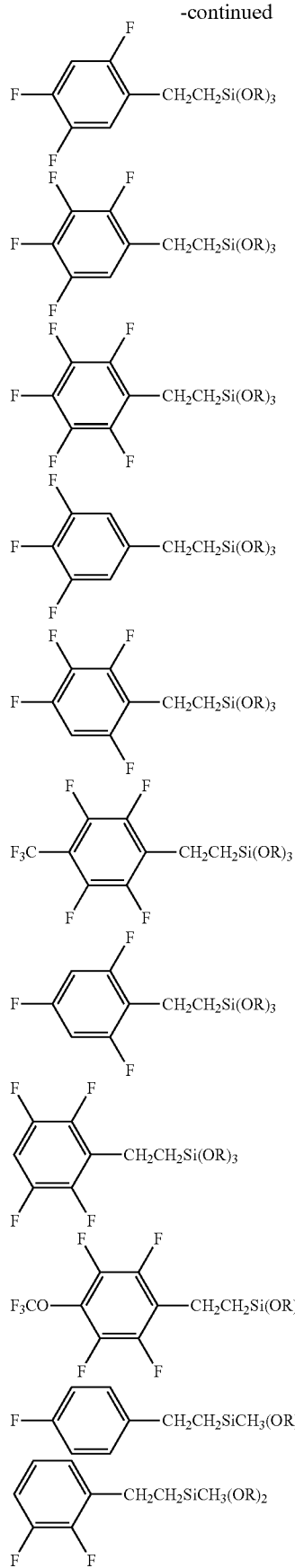
-continued
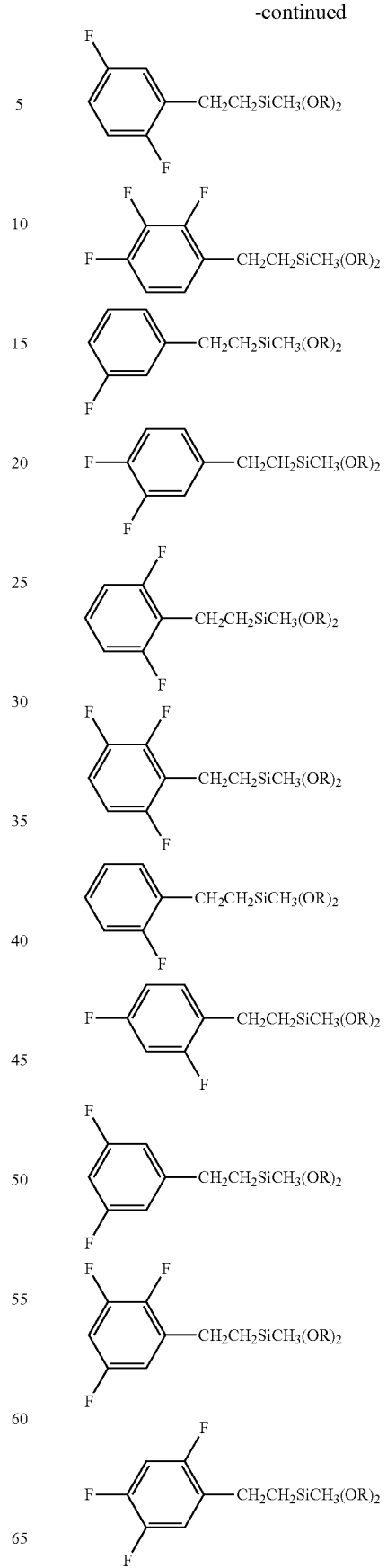

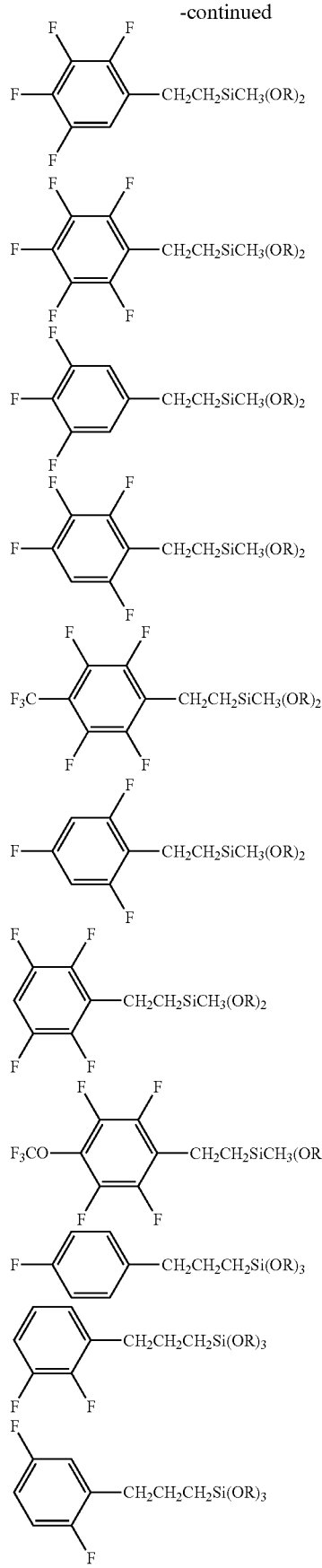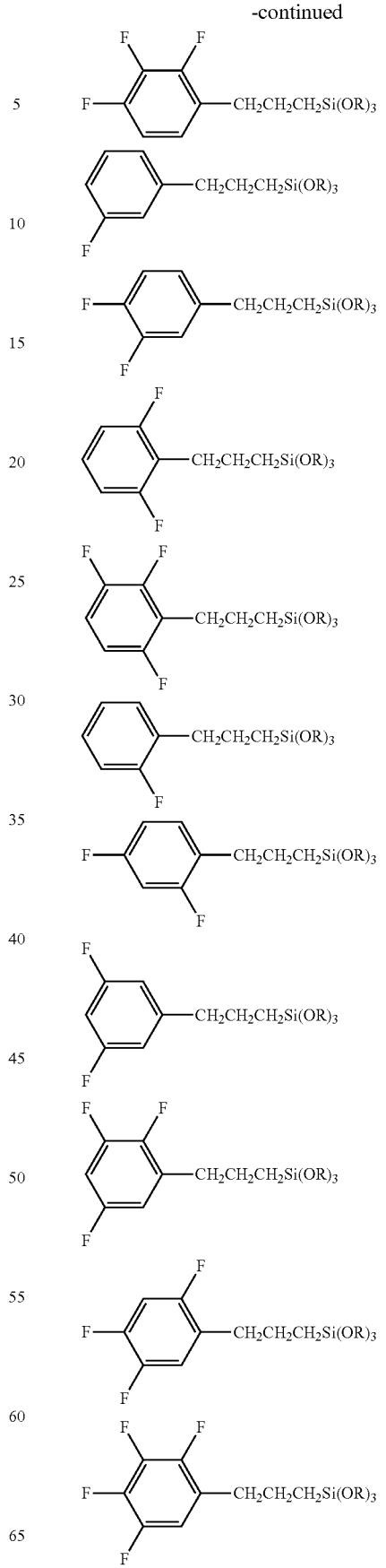

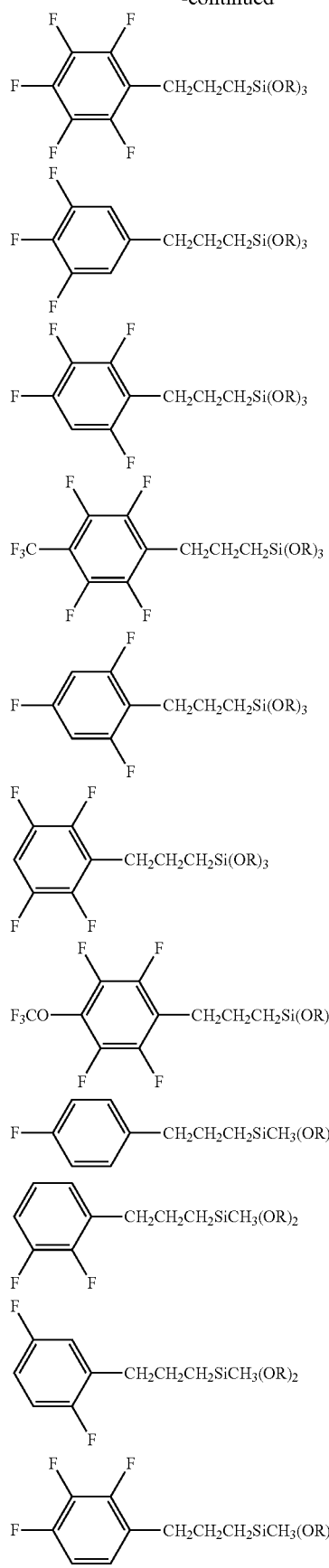
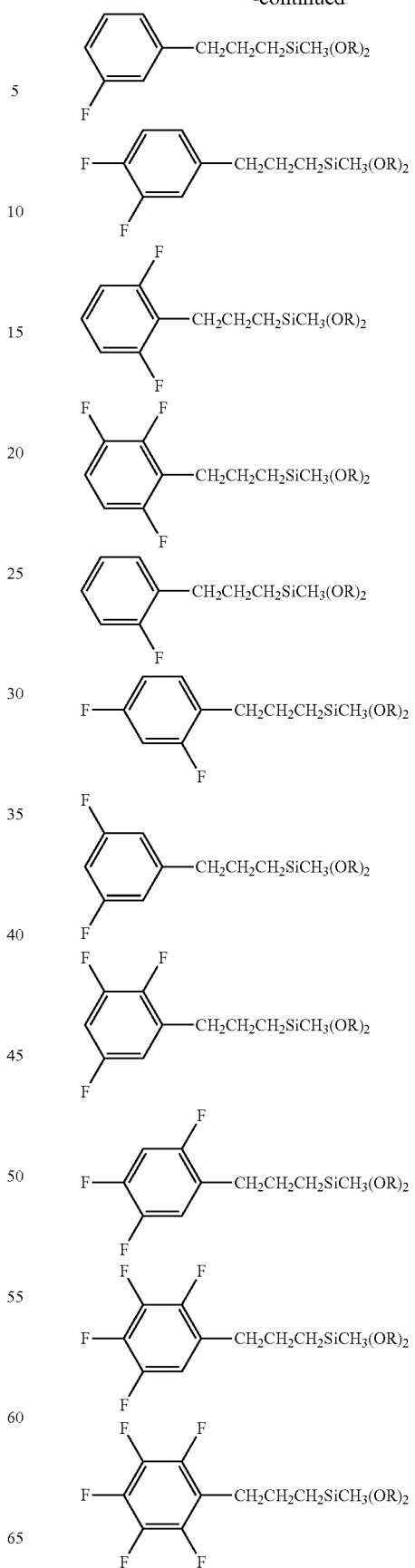

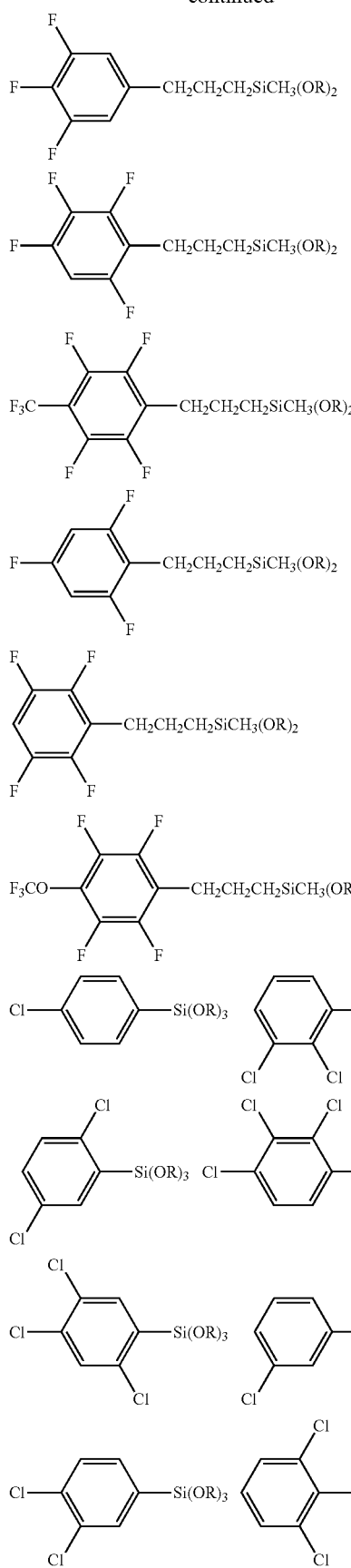
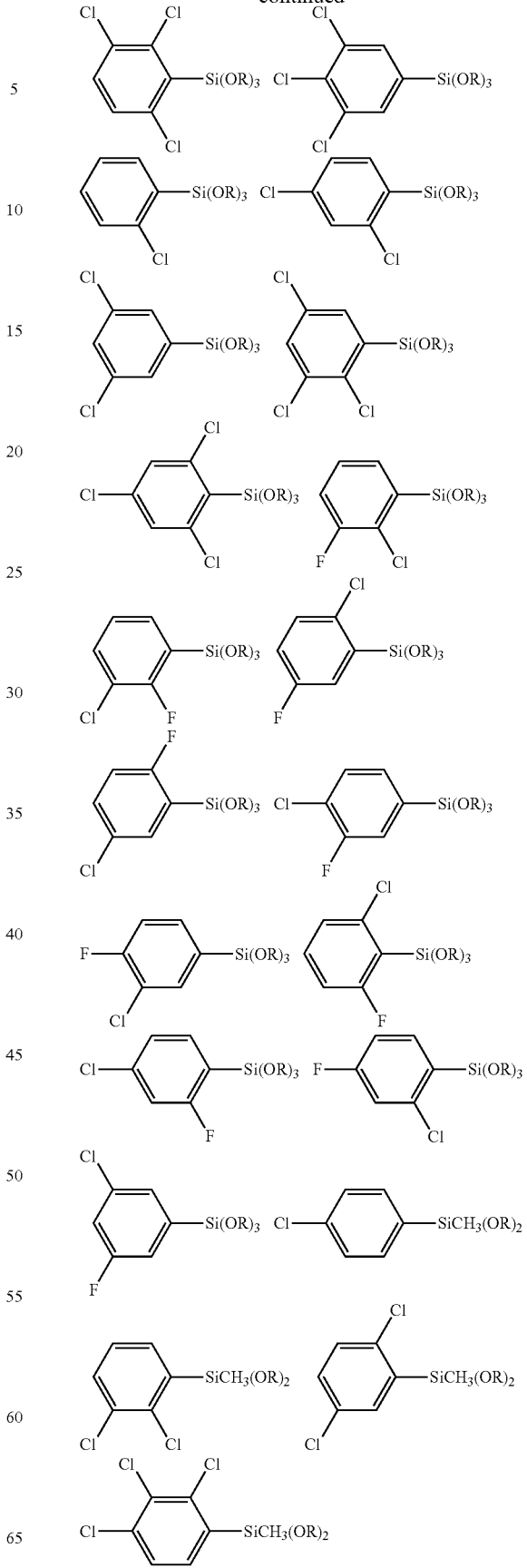

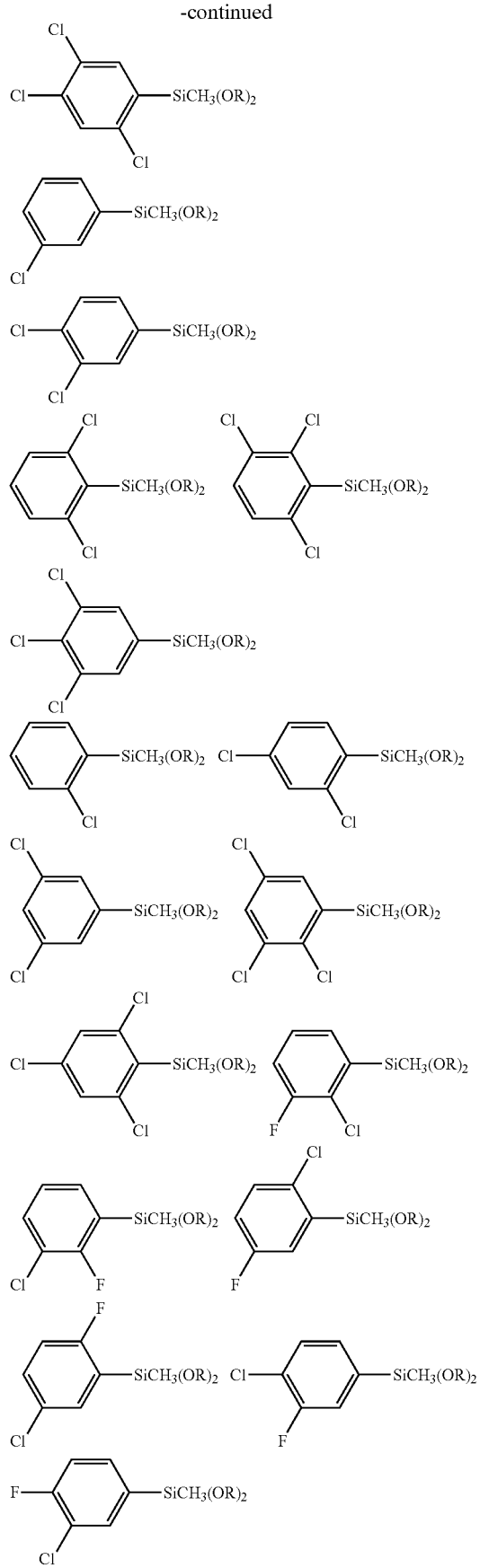
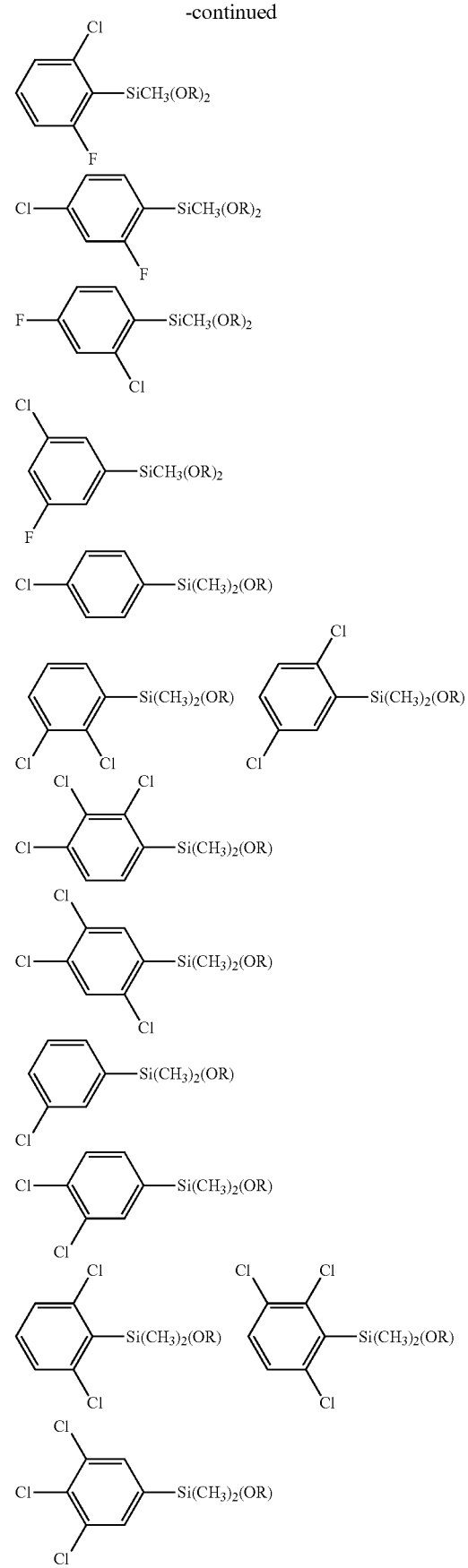

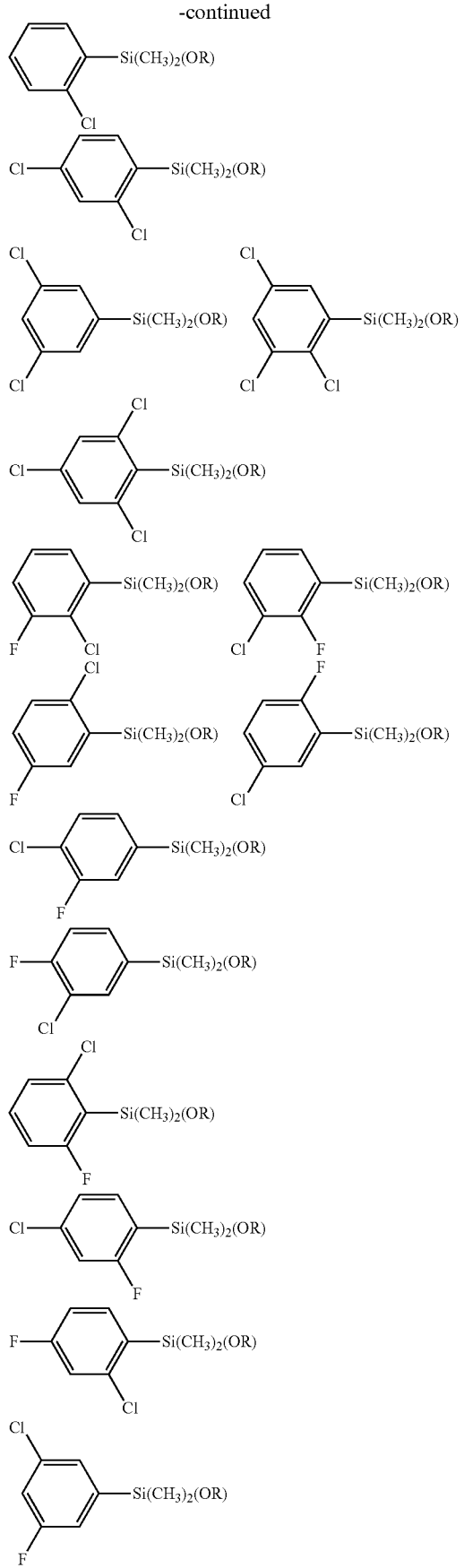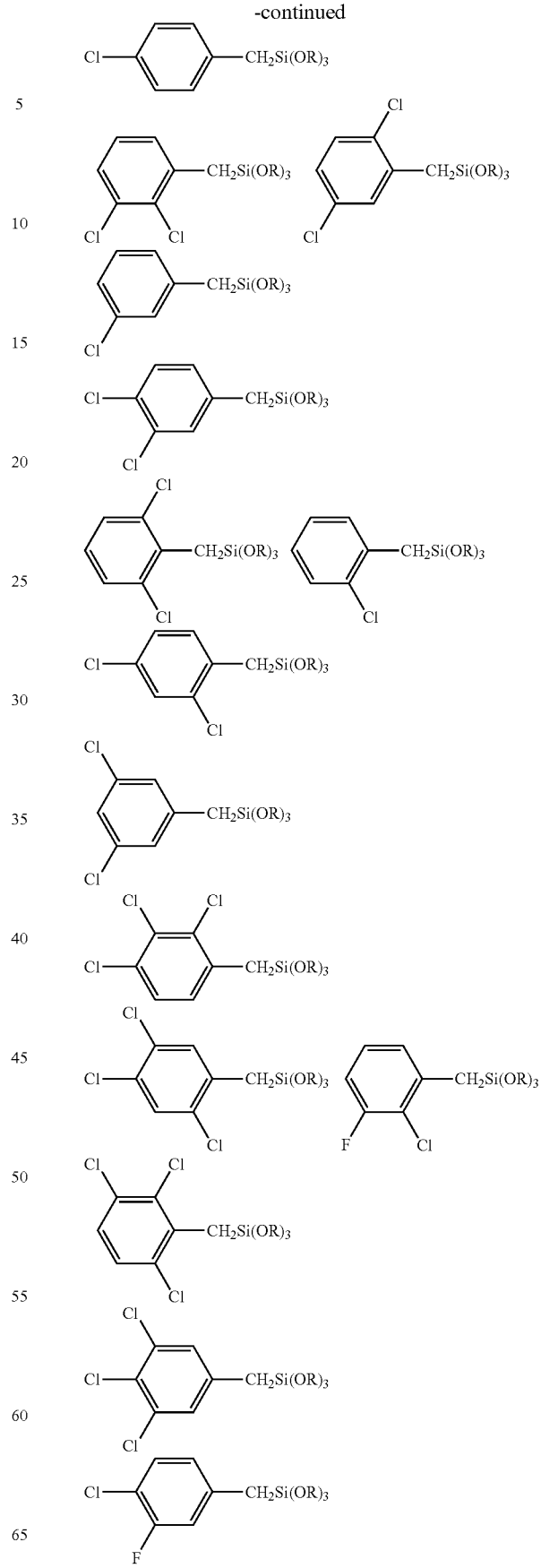

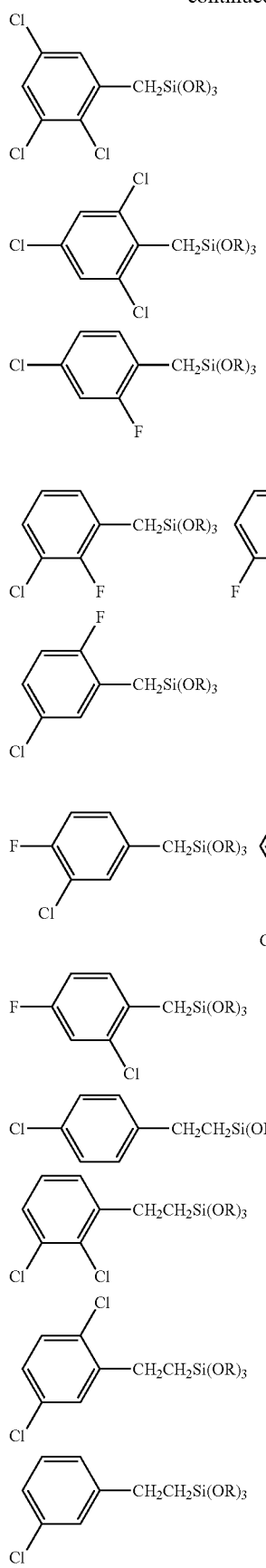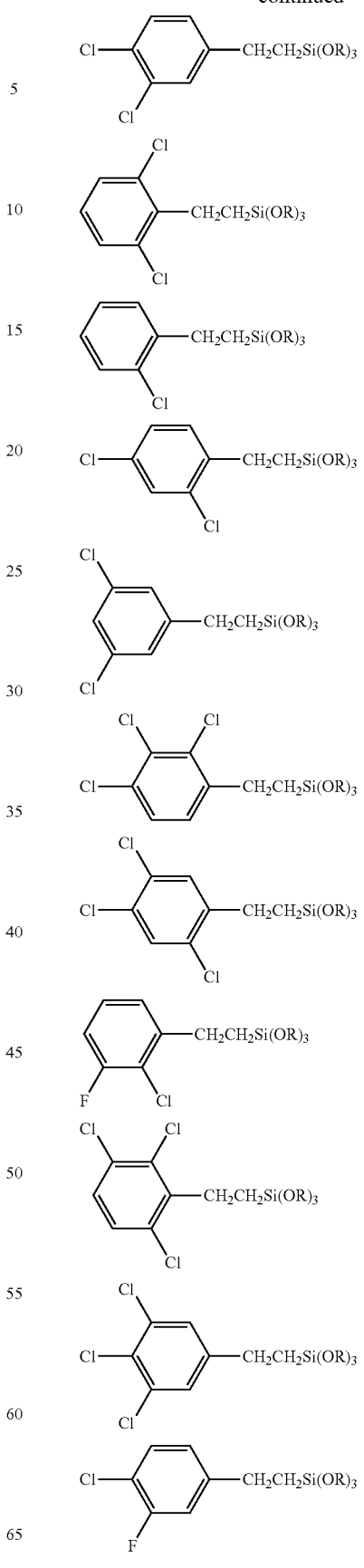

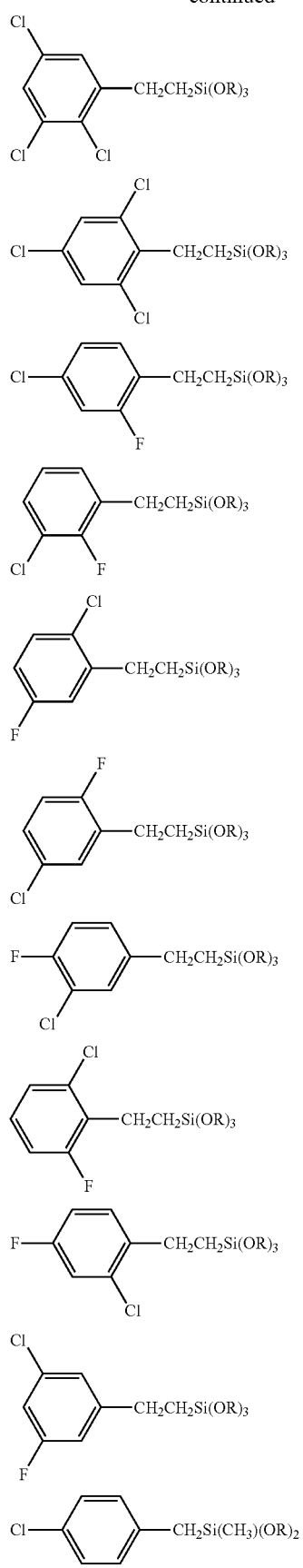
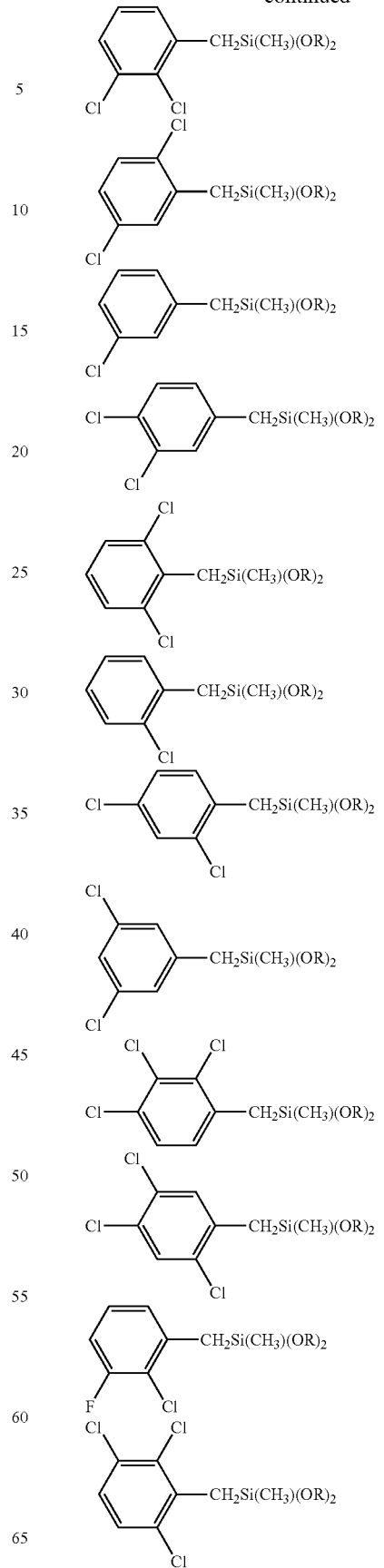

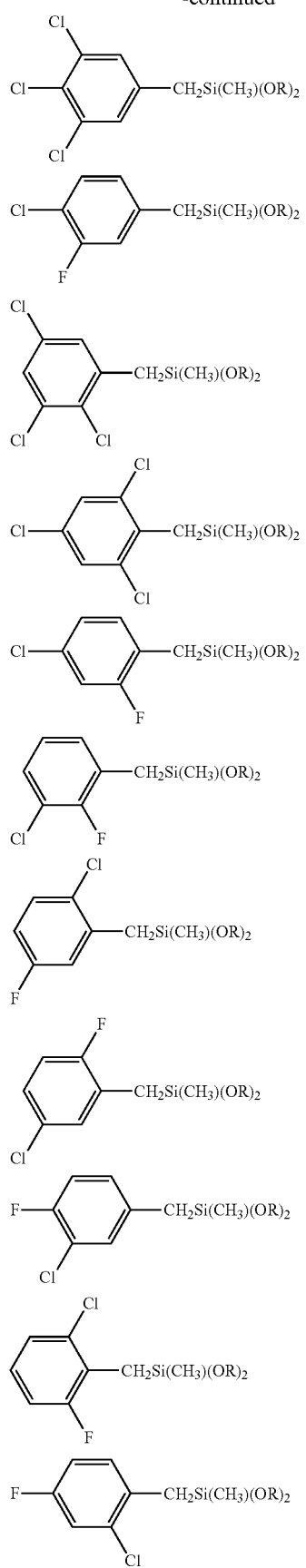
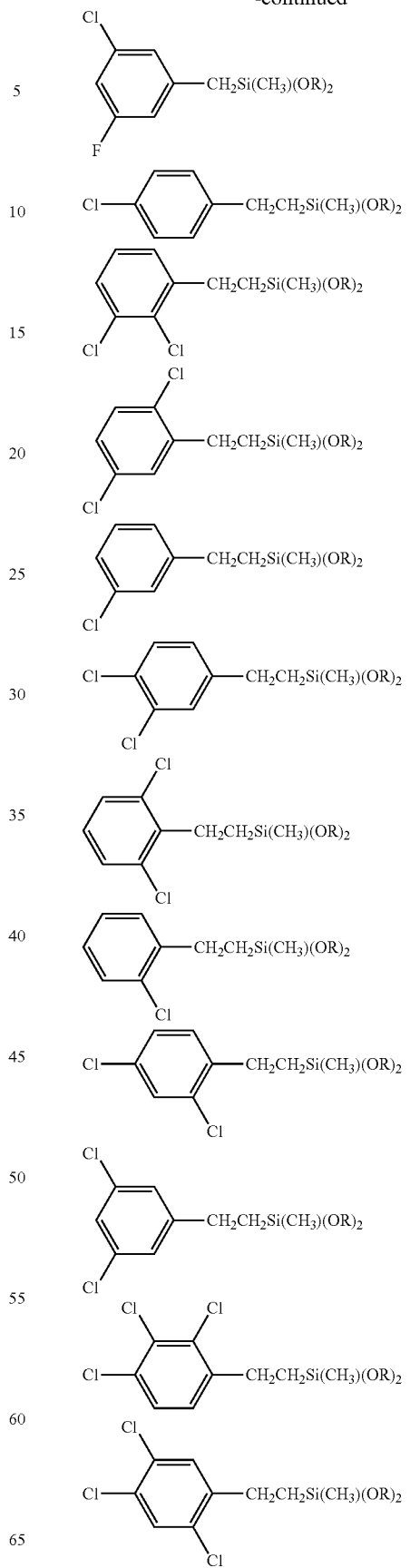

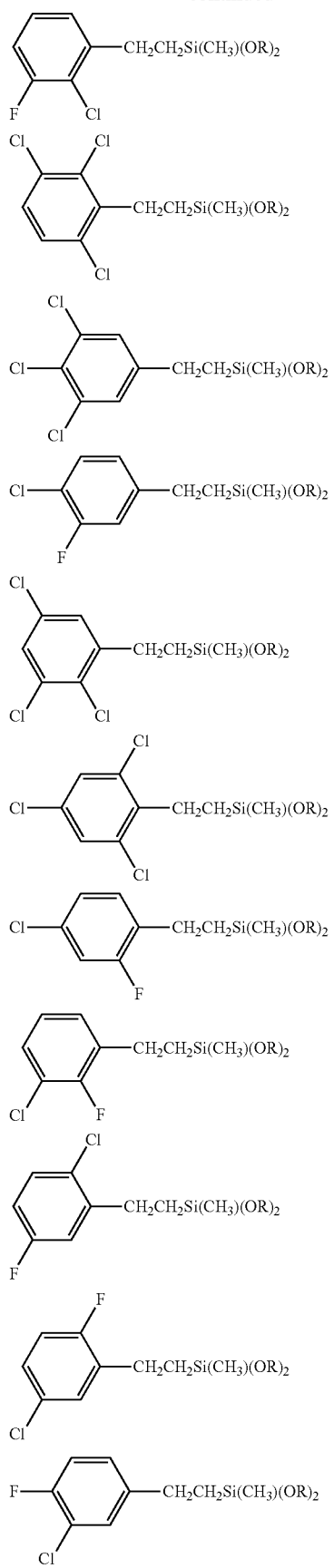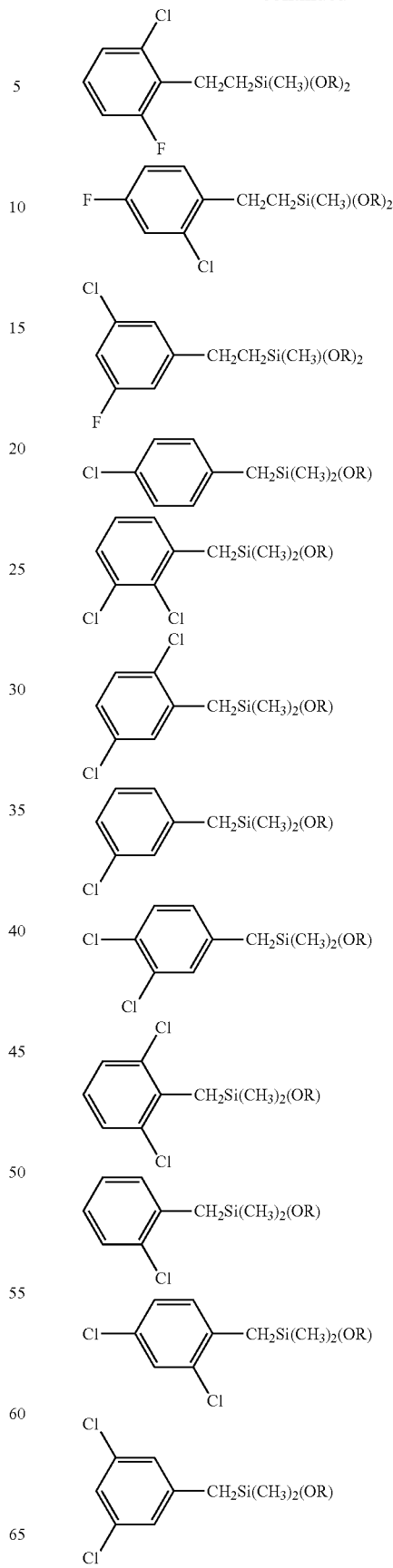

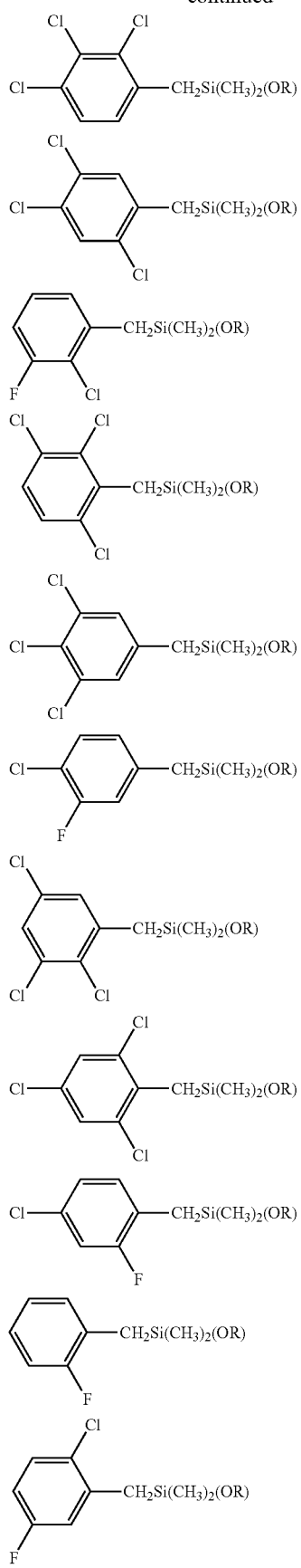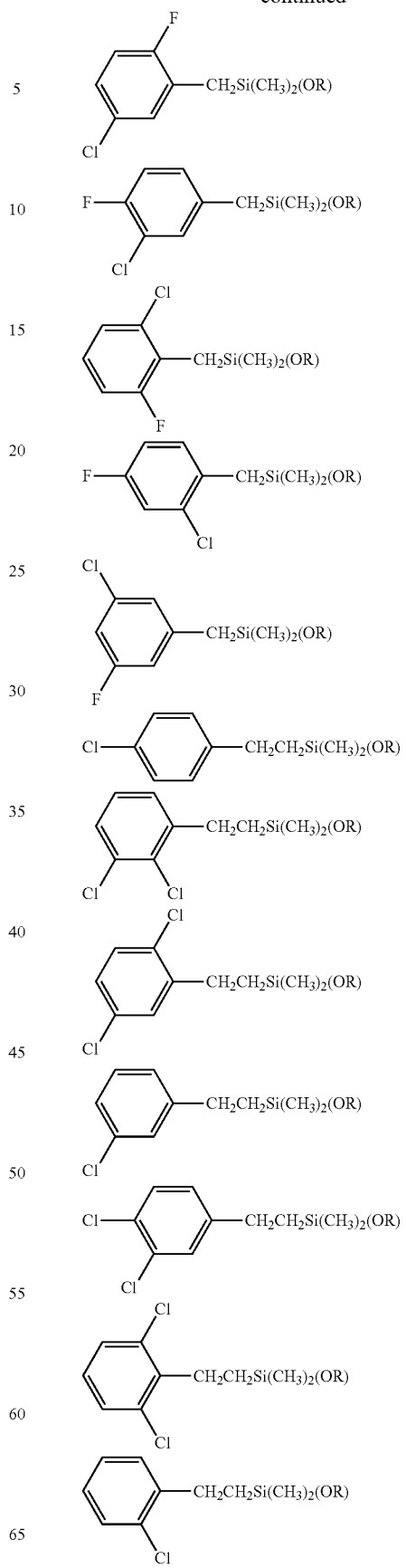

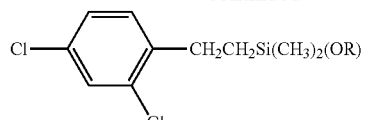
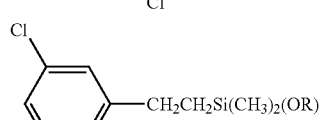
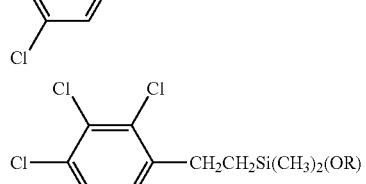
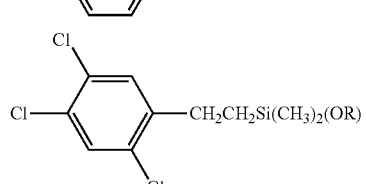
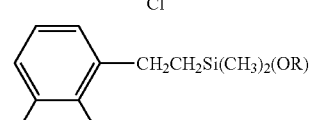
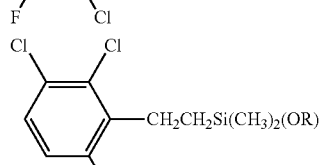
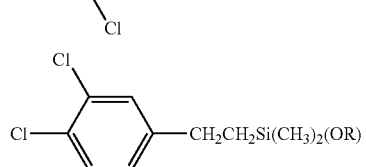
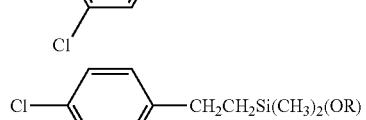
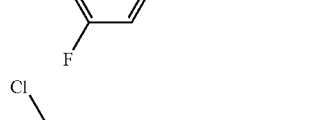
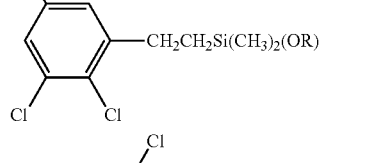
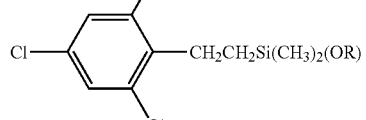
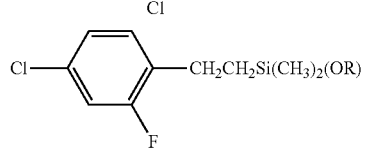

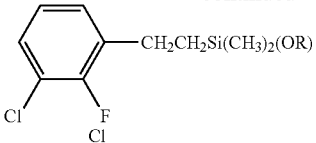
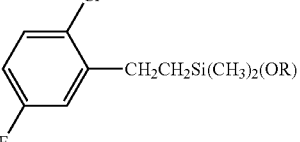
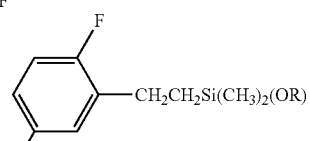
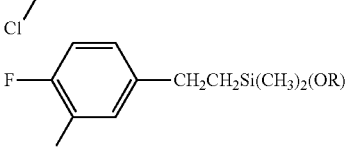
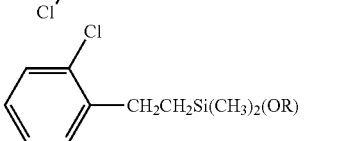
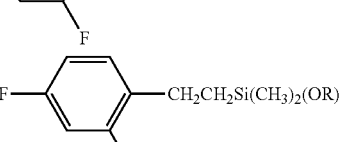
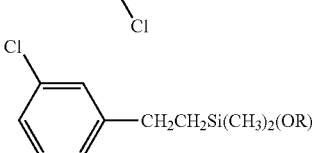

The silicon compound that can be used for component (A) may be exemplified by a material represented by the formula (A-1-4), $$Si(OR)_4 \qquad (A\text{-}1\text{-}4)$$

wherein R represents a hydrocarbon group having 1 to 6 carbon atoms.

Preferable examples of the silicon compound represented by the formula (A-1-4) include tetramethoxy silane, tetraethoxy silane, tetrapropoxy silane, tetraisopropoxy silane, etc.

Especially preferable examples of the silicon compound represented by the formulae (A-1-1) to (A-1-4) include tetramethoxy silane, tetraethoxy silane, methyl trimethoxy silane, methyl triethoxy silane, ethyl trimethoxy silane, ethyl triethoxy silane, vinyl trimethoxy silane, vinyl triethoxy silane, propyl trimethoxy silane, propyl triethoxy silane, isopropyl trimethoxy silane, isopropyl triethoxy silane, butyl trimethoxy silane, butyl triethoxy silane, isobutyl trimethoxy silane, isobutyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, tolyl trimethoxy silane, tolyl triethoxy silane, anisyl trimethoxy silane, anisyl triethoxy silane, phenethyl trimethoxy silane, phenethyl triethoxy silane, dimethyl dimethoxy silane, dimethyl diethoxy silane, diethyl dimethoxy silane, diethyl diethoxy silane, methyl ethyl dimethoxy silane, methyl ethyl diethoxy silane, dipropyl dimethoxy silane, dibutyl dimethoxy silane, methyl phenyl dimethoxy silane, methyl phenyl diethoxy silane, trimethyl methoxy silane, dimethyl ethyl methoxy silane, dimethyl phenyl methoxy silane, dimethyl benzyl methoxy silane, dimethyl phenethyl methoxy silane, etc.

Other examples of the organic groups represented by $R^1$, $R^2$, $R^3$, $R^4$, $R^5$, and $R^6$ include an organic group having one or more of carbon-oxygen single bond or carbon-oxygen double bond. Specifically, an organic group having one or more groups selected from the group consisting of an epoxy group, an ester group, an alkoxy group, and a hydroxyl group may be mentioned. Illustrative example thereof include an organic group shown by the formula (5).

$$\{U-Q_1-(S_1)_{v1}-Q_2-\}_u-(T)_{v2}-Q_3-(S_2)_{v3}-Q_4- \qquad (5)$$

wherein U represents a hydrogen atom, a hydroxyl group, epoxy ring:

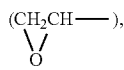

an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ independently represent $-C_qH_{(2q-p)}U_p-$, wherein U has the same meaning as defined above, p represents an integer of 0 to 3, q represents an integer of 0 to 10 (where q=0 means a single bond); u represents an integer of 0 to 3; $S_1$ and $S_2$ independently represent —O—, —CO—, —OCO—, —COO—, or —OCOO—; v1, v2, and v3 independently represent 0 or 1; and T represents a divalent group comprising an alicycle or an aromatic ring optionally containing a heteroatom. Illustrative examples of the alicycle or the aromatic ring T optionally containing a heteroatom such as an oxygen atom are shown below. In T, a bonding site between $Q_2$ and $Q_3$ is not particularly restricted; and the site is appropriately selected by considering reactivity due to steric factors, availability of commercially reagents, and so on.

T =

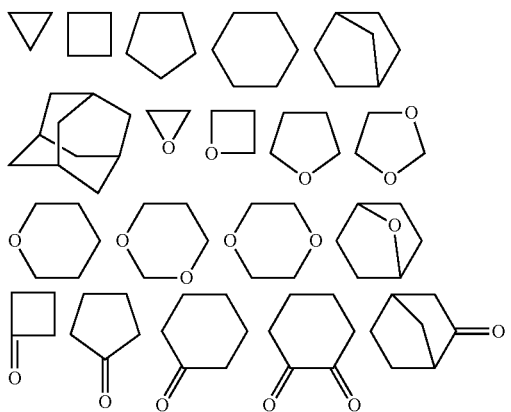

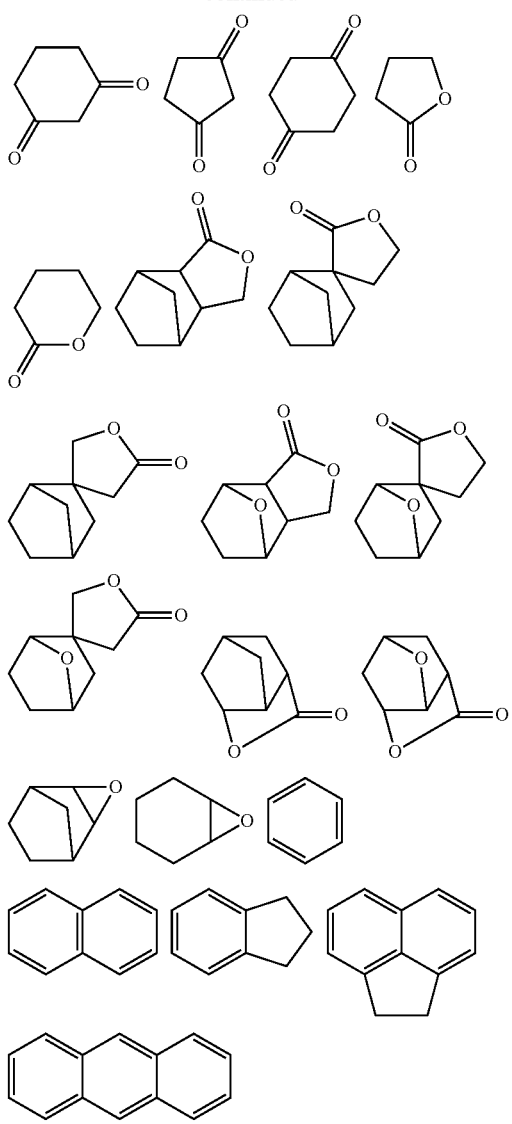

Preferable examples of the organic group having one or more of a carbon-oxygen single bond or a carbon-oxygen double bond in the formula (5) are shown below. Meanwhile, in the following formulae, (Si) is described to show the bonding sites to the Si.

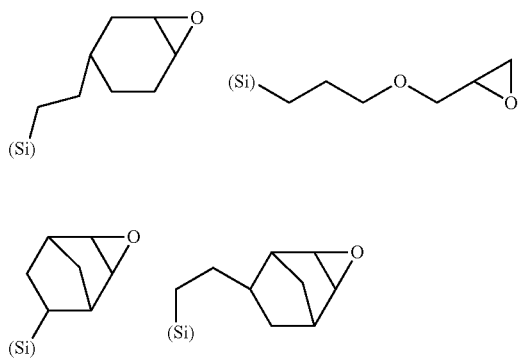

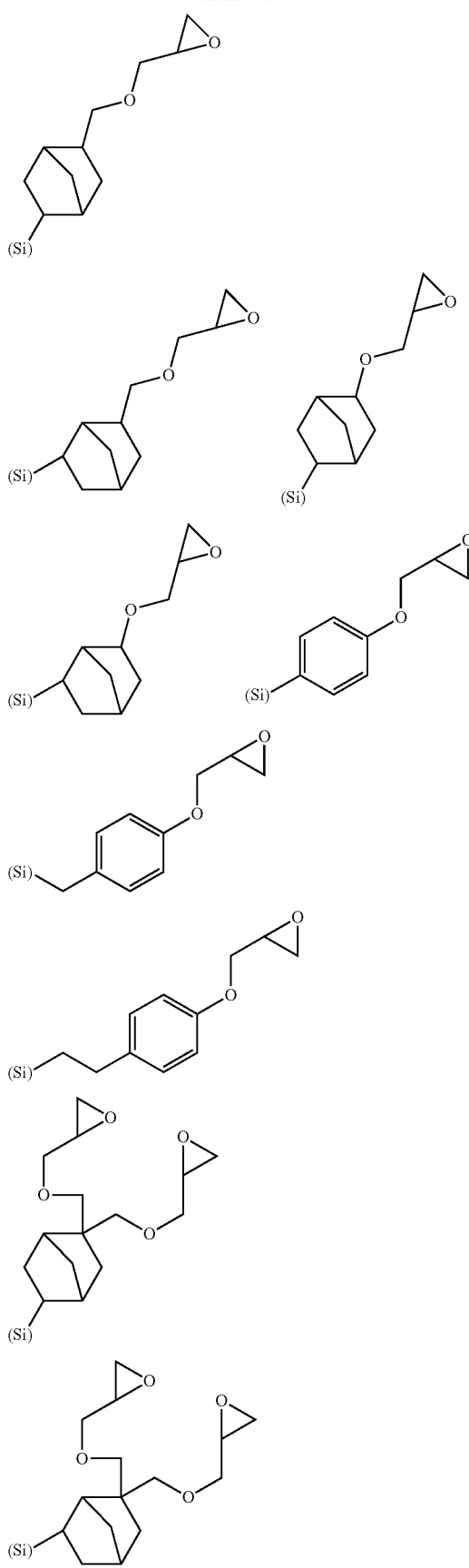
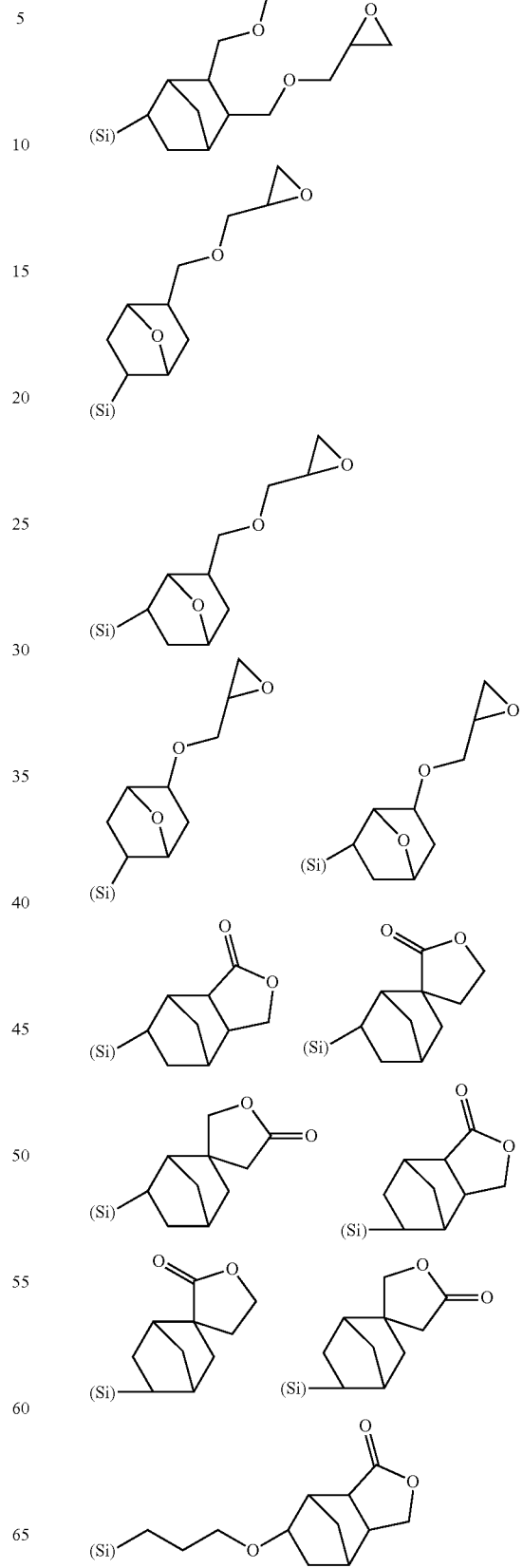

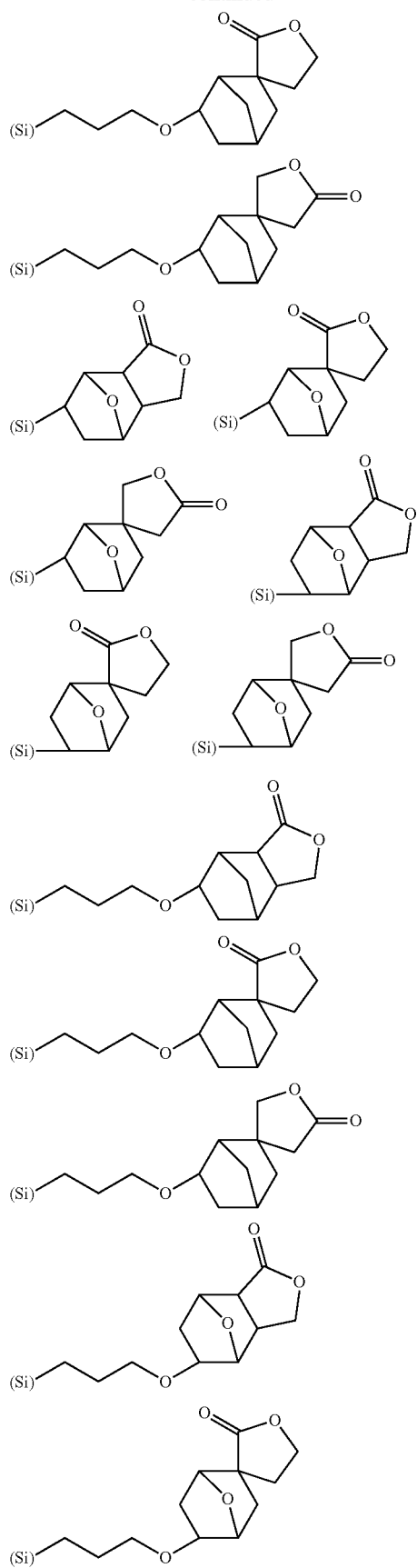
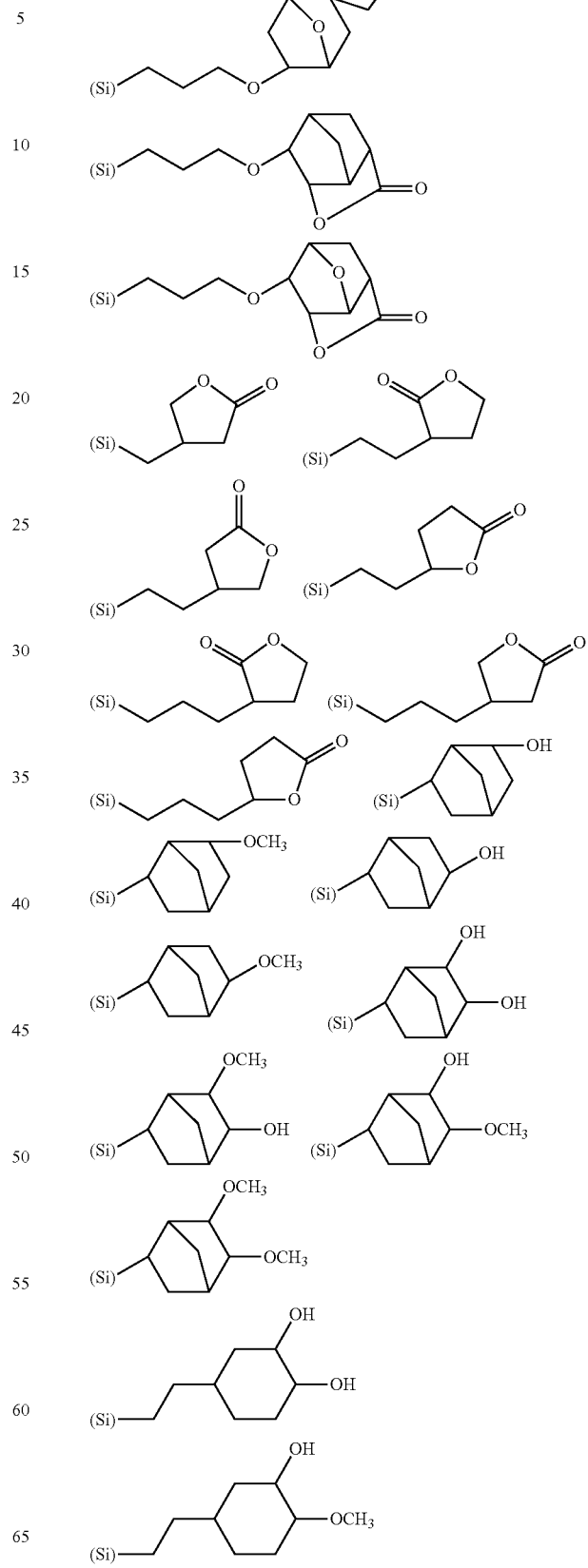

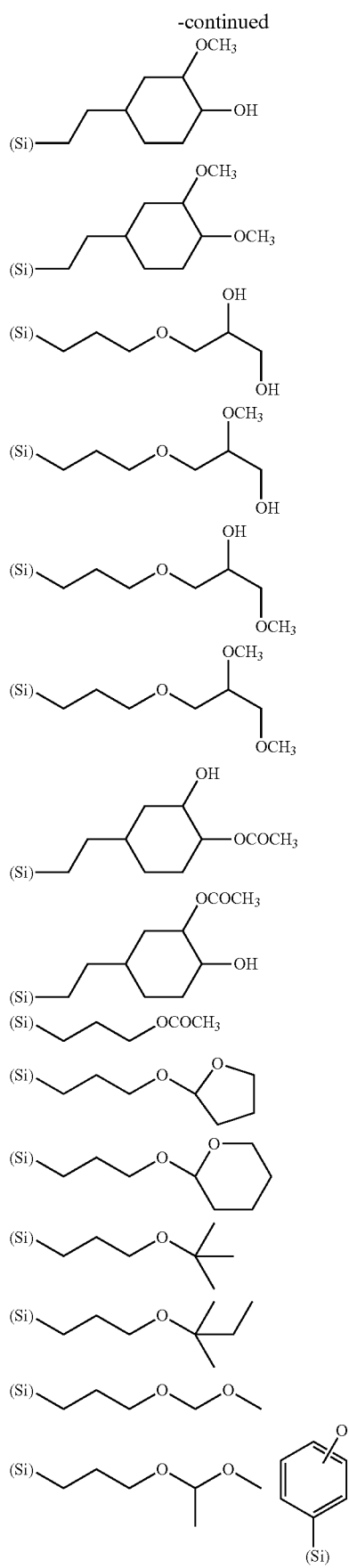
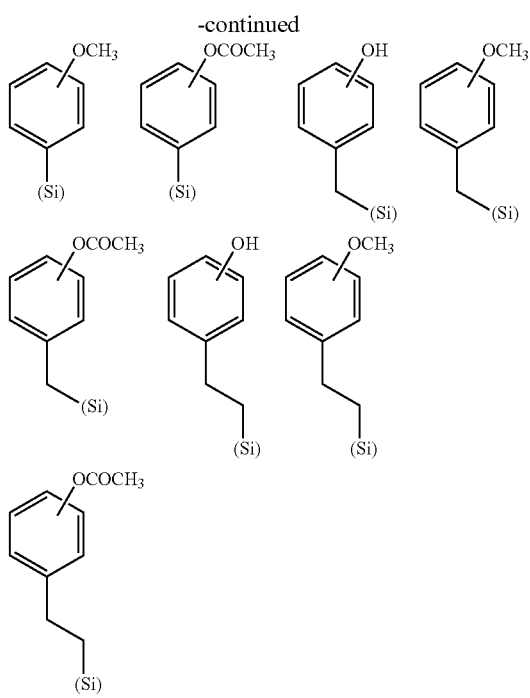
Further, as the organic groups represented by $R^1$, $R^2$, $R^3$, $R^4$, $R^5$, and $R^6$, an organic group having Si—Si bond can also be used. Illustrative examples thereof include groups shown below.
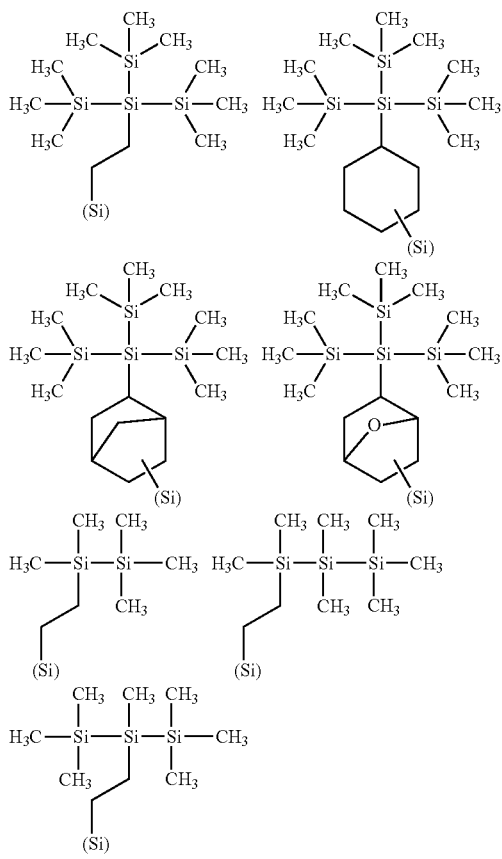

-continued

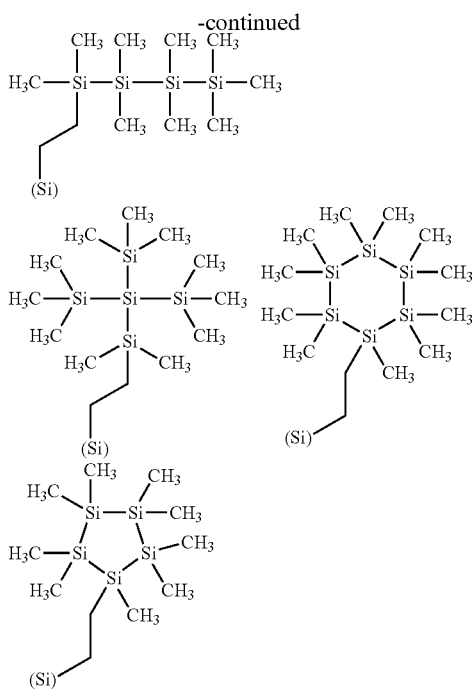

[Phosphorus Compound]

The phosphorus compound that can be used for component (A) may be exemplified by a material represented by the formula (A-2-1), $$PX_3 \tag{A-2-1}$$

wherein X represents a halogen atom, a hydroxyl group, or an alkoxy group having 1 to 6 carbon atoms.

Preferable examples of the phosphorus compound represented by the formula (A-2-1) include phosphorus trichloride, phosphorus tribromide, phosphorus acid, trimethyl phosphite, triethyl phosphite, tripropyl phosphite, etc.

The phosphorus compound that can be used for component (A) may be exemplified by a material represented by the formula (A-2-2), $$POX_3 \tag{A-2-2}$$

wherein X represents a halogen atom, a hydroxyl group, or an alkoxy group having 1 to 6 carbon atoms.

Preferable examples of the phosphorus compound represented by the formula (A-2-2) include phosphorus oxytrichloride, phosphorus oxytribromide, phosphoric acid, trimethyl phosphate, triethyl phosphate, tripropyl phosphate, etc.

The phosphorus compound that can be used for component (A) may be exemplified by a material represented by the formulae (A-2-3) and (A-2-4), $$P_2O_5 \tag{A-2-3}$$

$$H(HPO_3)_{a1}OH \tag{A-2-4}$$

wherein a1 is an integer of 1 or more.

Diphosphorus pentaoxide represented by the formula (A-2-3), and a polyphosphoric acid represented by the formula (A-2-4) or a polyphosphate, etc., may be used as the phosphorus compound.

The phosphorus compound that can be used for component (A) may be exemplified by a material represented by the formula (A-2-5), $$R^7PX_2 \tag{A-2-5}$$

wherein $R^7$ represents a hydrogen atom or an organic group having 1 to 30 carbon atoms, wherein a hydrogen atom(s) in the organic group may be substituted by a halogen atom(s); and X represents a halogen atom, a hydroxyl group, or an alkoxy group having 1 to 6 carbon atoms.

Preferable examples of the phosphorus compound represented by the formula (A-2-5) include $CH_3PCl_2$, $C_2H_5PCl_2$, $CH_3OPCl_2$, etc.

The phosphorus compound that can be used for component (A) may be exemplified by a material represented by the formula (A-2-6), $$R^7POX_2 \tag{A-2-6}$$

wherein $R^7$ represents a hydrogen atom or an organic group having 1 to 30 carbon atoms, wherein a hydrogen atom(s) in the organic group may be substituted by a halogen atom(s); and X represents a halogen atom, a hydroxyl group, or an alkoxy group having 1 to 6 carbon atoms.

Preferable examples of the phosphorus compound represented by the formula (A-2-6) include $HPO(OCH_3)_2$, $HPO(OC_2H_5)_2$, $CH_3PO(OH)_2$, $CH_3PO(OCH_3)_2$, $CH_3POCl_2$, $C_6H_5PO(OH)_2$, $C_6H_5POCl_2$, $C_6H_5CH_2PO(OC_2H_5)_2$, etc.

[Boron Compound]

The boron compound that can be used for component (A) may be exemplified by a material represented by the formula (A-3-1), $$BX_3 \tag{A-3-1}$$

wherein X represents a halogen atom, a hydroxyl group, or an alkoxy group having 1 to 6 carbon atoms.

Preferable examples of the boron compound represented by the formula (A-3-1) include boron trifluoride, boron trichloride, boric acid, trimethyl borate, triethyl borate, tripropyl borate, tributyl borate, triamyl borate, trihexyl borate, tricyclopentyl borate, tricyclohexyl borate, triallyl borate, triphenyl borate, ethyldimethyl borate, etc.

The boron compound that can be used for component (A) may be exemplified by a material represented by the formula (A-3-2), $$B_2O_3. \tag{A-3-2}$$

Boron oxide represented by the formula (A-3-2) may be used as the boron compound.

The boron compound that can be used for component (A) may be exemplified by a material represented by the formula (A-3-3), $$R^8BX_2 \tag{A-3-3}$$

wherein $R^8$ represents a hydrogen atom or an organic group having 1 to 30 carbon atoms, wherein a hydrogen atom(s) in the organic group may be substituted by a halogen atom(s); and X represents a halogen atom, a hydroxyl group, or an alkoxy group having 1 to 6 carbon atoms.

Preferable examples of the boron compound represented by the formula (A-3-3) include $C_6H_5B(OH)_2$, $CH_3B(OC_3H_7)_2$, $CH_3B(OH)_2$, $C_6H_{11}B(OH)_2$, etc.

[Polysilane Compound]

The polysilane compound that can be used for component (A) may be exemplified by a material represented by the formula (A-4-1), $$(R^9R^{10}R^{11}Si)_{a2}(R^{12}R^{13}Si)_{a3}(R^{14}Si)_{a4}(Si)_{a5} \tag{A-4-1}$$

wherein $R^9$, $R^{10}$, $R^{11}$, $R^{12}$, $R^{13}$, and $R^{14}$ each represent a methyl group, a phenyl group, or a hydroxyl group; and a2, a3, a4, and a5 each represent a molar fraction, and satisfy $a2+a3+a4+a5=1$, $0 \le a2 \le 1$, $0 \le a3 \le 1$, $0 \le a4 \le 1$, and $0 \le a5 \le 1$.

As the polysilane compound represented by the formula (A-4-1), OGSOL SI-10-10 (polymethylphenylsilane), SI-10-20 (polymethylphenylsilane), SI-20-10 (polyphenylsilane), SI-20-10 (improved) (polyphenylsilane), SI-30-10 (cyclic polydiphenylsilane), available from Osaka Gas Chemicals Co., Ltd., may be used. In addition, materials obtained by subjecting these compounds to reaction for reducing the molecular weight under alkaline conditions may also be used.

Especially, it is preferred that the compound represented by the formula (A-4-1) have a weight average molecular weight of 1,000 or less. When the weight average molecular weight is 1,000 or less, a hydrolysate, a condensate, and a hydrolysis condensate of a mixture containing the polysilane compound represented by the formula (A-4-1) easily dissolves in a solvent component in the composition for forming a coating type BPSG film, and generation of particles during film formation can be prevented.

The solvent used in the reaction under alkaline conditions may be various solvents, and for example, one or more solvents selected from hydrocarbon solvents such as benzene, toluene, and xylene; glycol solvents such as propylene glycol monomethyl ether and propylene glycol monoethyl ether; ether solvents such as diethyl ether, diisopropyl ether, dibutyl ether, tetrahydrofuran, and 1,4-dioxane; ketone solvents such as acetone, methyl ethyl ketone, methyl isobutyl ketone, methyl amyl ketone, cyclopentanone, and cyclohexanone; and alcohol solvents such as ethanol, isopropyl alcohol, and butanol can be used.

The base to be added may be various materials, and usable examples thereof include inorganic bases such as sodium hydroxide, potassium hydroxide, barium hydroxide, ammonia, tetramethylammonium hydroxide, sodium carbonate, sodium hydrogen carbonate, potassium carbonate, lithium hydride, sodium hydride, potassium hydride, and calcium hydride; alkyl metals such as methyl lithium, n-butyl lithium, methyl magnesium chloride, and ethyl magnesium bromide; alkoxides such as sodium methoxide, sodium ethoxide, and potassium tert-butoxide; organic bases such as triethyl amine, diisopropyl ethyl amine, N,N-dimethylaniline, pyridine, 4-dimethylamino pyridine, and diazabicycloundecene (DBU). The reaction temperature is preferably about $-50°$ C. to the boiling point of the solvent, more preferably room temperature to 100° C.

A mixture (monomer) containing one or more silicon compounds mentioned above, one or more phosphorus compounds mentioned above, one or more boron compounds mentioned above, and one or more polysilane compounds mentioned above is subjected to hydrolysis, condensation, or hydrolysis condensation, whereby a silicon-containing compound (polymer) to constitute the component (A) in the composition for forming a coating type BPSG film can be synthesized.

The hydrolysis, condensation, or hydrolysis condensation reaction for obtaining the component (A) can be carried out by using one or more compounds selected from inorganic acid, aliphatic sulfonic acid, and aromatic sulfonic acid as acid catalyst. Illustrative examples of the usable acid catalyst include hydrofluoric acid, hydrochloric acid, hydrobromic acid, sulfuric acid, nitric acid, perchloric acid, phosphoric acid, methanesulfonic acid, benzenesulfonic acid, toluenesulfonic acid, etc. The catalyst is preferably used in the range of $1 \times 10^{-6}$ to 10 mol, more preferably $1 \times 10^{-5}$ to 5 mol, and much more preferably $1 \times 10^{-4}$ to 1 mol per 1 mol of monomers.

The amount of water to be added for obtaining a polymer by hydrolysis condensation of these monomers is preferably in the range of 0.01 to 100 mol, more preferably 0.05 to 50 mol, much more preferably 0.1 to 30 mol per 1 mol of hydrolysable substituent bonded to the monomers. If the amount is 100 mol or less, a reaction device does not become excessively large, so that it is economical.

In operation, monomers may be added to a catalyst aqueous solution to start hydrolysis condensation reaction. In this case, organic solvent may be added to the catalyst aqueous solution, or monomers may be diluted with the organic solvent, or both may be performed. The reaction temperature is preferably in the range of 0 to 100° C., more preferably 5 to 80° C. A method in which the reaction temperature is maintained in the range of 5 to 80° C. when monomers are dropped, and then the mixture is aged in the range of 20 to 80° C., is preferable.

Preferable examples of the organic solvent that can be added to the catalyst aqueous solution or can dilute monomers include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, and mixture thereof.

Among them, water-soluble solvent is preferable, and illustrative examples thereof include alcohols such as methanol, ethanol, 1-propanol, and 2-propanol; polyvalent alcohols such as ethylene glycol and propylene glycol; polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; tetrahydrofuran, etc. Particularly preferable is solvent with a boiling point of 100° C. or less.

The amount of the organic solvent to be used is preferably in the range of 0 to 1,000 mL, and particularly preferably 0 to 500 mL, per 1 mol of monomers. If the amount of the organic solvent is 1,000 mL or less, a reaction vessel does not become excessively large, so that it is economical.

Then, if necessary, neutralization reaction of the catalyst is carried out, and alcohol produced by hydrolysis condensation reaction is removed under reduced pressure to obtain a reaction mixture aqueous solution. The amount of a basic substance to be used for neutralization is preferably 0.1 to 2 equivalent, with respect to the acid used as the catalyst. The basic substance may be any substance so long as it shows alkalinity in water.

Subsequently, it is preferable that by-products such as alcohol produced by hydrolysis condensation reaction be removed from the reaction mixture. The temperature for heating the reaction mixture is preferably in the range of 0 to 100° C., more preferably 10 to 90° C., much more preferably 15 to 80° C., though it is depending on the kinds of the added organic solvent and an alcohol produced by reaction. Degree of vacuum is preferably atmospheric pressure or less, more preferably 80 kPa or less in the absolute pressure, much more preferably 50 kPa or less in the absolute pressure, though it is depending on the kinds of organic solvent and an alcohol to be removed, an exhausting equipment, and a condensation equipment, as well as heating temperature. In this case, although it is difficult to exactly examine the amount of the alcohol to be removed, it is preferable that about 80% by mass or more of a produced alcohol and so forth be removed.

Next, the acid catalyst used in hydrolysis condensation reaction may be removed from the reaction mixture. For removing the acid catalyst, water is mixed with the polymer, and the polymer is extracted by an organic solvent. As the organic solvent to be used, solvents that can dissolve the polymer and achieve two-layer separation by mixing with water is preferable. Illustrative examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc., and mixture thereof.

Moreover, mixture of water-soluble organic solvent and slightly water-soluble organic solvent can also be used. Preferable examples thereof include methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, ethylene glycol monopropyl ether+propylene glycol methyl ether acetate mixture, etc., but are not restricted to combination of these mixtures.

The mixing ratio of the water-soluble organic solvent and the slightly water-soluble organic solvent is appropriately determined. The amount of the water-soluble organic solvent is preferably in the range of 0.1 to 1,000 parts by mass, more preferably 1 to 500 parts by mass, much more preferably 2 to 100 parts by mass, based on 100 parts by mass of the slightly water-soluble organic solvent.

Subsequently, the reaction mixture may be washed with neutral water. The neutral water may be water called deionized water or ultrapure water. The amount of the water is preferably in the range of 0.01 to 100 L, more preferably 0.05 to 50 L, much more preferably 0.1 to 5 L per 1 L of the polymer solution. The washing may be performed by putting both the reaction mixture and water into the same container, stirring them, and then leaving to stand to separate a water layer. Number of washing may be 1 time or more, and preferably about 1 to 5 times because washing of 10 times or more is not worth to have full effects thereof.

In this water-washing operation, the number of washing and the amount of water for washing may be appropriately determined in view of effects of catalyst removal and fractionation because there is a case that a part of the polymer escapes into a water layer, thereby substantially the same effect as fractionation operation is obtained.

Other methods for removing acid catalyst include a method using an ion-exchange resin, and a method for removing the acid catalyst after neutralization with an epoxy compound such as ethylene oxide and propylene oxide. These methods can be appropriately selected depending on the acid catalyst used in the reaction.

A final solvent is then added to the polymer solution even when the acid catalyst remains therein or has been removed therefrom, and solvent-exchange is performed under reduced pressure to obtain a desired polymer solution. The temperature during the solvent-exchange is preferably in the range of 0 to 100° C., more preferably 10 to 90° C., much more preferably 15 to 80° C. though it is depending on the kinds of the reaction solvent and the extraction solvent to be removed. Degree of vacuum in this operation is preferably atmospheric pressure or less, more preferably 80 kPa or less in the absolute pressure, much more preferably 50 kPa or less in the absolute pressure though it is depending on the kinds of the solvents to be removed, an exhausting equipment, condensation equipment, and heating temperature.

In this operation, sometimes the polymer may become unstable by solvent-exchange. This occurs due to compatibility of the polymer with the final solvent. Thus, in order to prevent this, a monovalent, divalent, or more polyvalent alcohol or ether compound having cyclic ether as a substituent may be added thereto as a stabilizer. The adding amount thereof is preferably in the range of 0 to 25 parts by mass, more preferably 0 to 15 parts by mass, much more preferably 0 to 5 parts by mass, or 0.5 parts by mass or more when it is added, based on 100 parts by mass of the polymer contained in the solution before the solvent-exchange. If necessary, a stabilizer may be added to the solution before the solvent-exchange operation.

The concentration of the polymer is preferably in the range of 0.1 to 20% by mass. If the concentration is in such a range, condensation reaction of the polymer does not excessively progress; thus, the polymer does not become insoluble in an organic solvent. Further, if the concentration is in such a range, the amount of the solvent becomes appropriate, therefore it is economical.

Preferable examples of the final solvent added to the polymer include alcohol solvents, and particularly monoalkyl ether derivatives of ethylene glycol, diethylene glycol, triethylene glycol, propylene glycol, dipropylene glycol, butanediol, etc. Illustrative examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, etc.

In addition, if these solvents are used as a main solvent, a non-alcoholic solvent may be added thereinto as an adjuvant solvent. Illustrative examples of this adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, tert-butyl acetate, tert-butyl propionate, propylene glycol mono-tert-butyl ether acetate, γ-butyrolactone, methyl isobutyl ketone, cyclopentyl methyl ether, etc.

As an alternative operation, water or a water-containing organic solvent may be added to the monomers or an organic solution of the monomers to start hydrolysis reaction. In this operation, the catalyst may be added to the monomers or the organic solution of the monomers, or may be added to the water or the water-containing organic solvent. The reaction temperature is preferably in the range of 0 to 100° C., and more preferably 10 to 80° C. A method in which the mixture is heated at 10 to 50° C. while adding dropwise water, and then further heated at 20 to 80° C. to age the mixture is preferable.

As the organic solvent, water-soluble solvent is preferable, and illustrative examples thereof include methanol, ethanol, 1-propanol, 2-propanol, 1-butanol, 2-butanol, 2-methyl-1-propanol, acetone, tetrahydrofuran, acetonitrile, polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, etc., and a mixture thereof.

The amount of the organic solvent to be used may be the same amount as above. The obtained reaction mixture may be post-treated like the above-mentioned method to obtain a polymer.

Alternatively, the hydrolysis, condensation, or hydrolysis condensation for synthesizing the polymer may be carried out with a base catalyst. Illustrative examples of the base catalyst include methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclo cyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. The amount of the base catalyst to be used may be the same amount as the acid catalyst mentioned above.

The amount of water to be added for obtaining a polymer from these monomers is preferably in the range of 0.1 to 50 mol per 1 mol of a hydrolysable substituent bonded to the monomers. If the amount is 50 mol or less, a reaction device does not become excessively large, so that it is economical.

Operation procedure for the reaction may be the same as in the case of using the acid catalyst mentioned above.

As the organic solvent that can be added to the catalyst aqueous solution or can dilute the monomers, the same materials as in the case of using the acid catalyst are preferably used. Meanwhile, the amount of the organic solvent to be used is preferably 0 to 1,000 mL per 1 mol of the monomer. By using such an amount, a reaction vessel does not become excessively large, so that it is economical.

Thereafter, if necessary, neutralization reaction of the catalyst is carried out, and alcohol produced by hydrolysis condensation reaction is removed under reduced pressure to obtain a reaction mixture aqueous solution. The amount of an acidic substance to be used for neutralization is preferably 0.1 to 2 equivalent, with respect to basic substance used as the catalyst. The acidic substance may be any substance so long as it shows acidity in water.

Subsequently, it is preferable that by-products such as alcohol produced by hydrolysis condensation reaction be removed from the reaction mixture. The temperature for heating the reaction mixture and degree of vacuum may be the same temperature and degree of vacuum as in the case of using the acid catalyst.

Next, the base catalyst used in hydrolysis condensation may be removed from the reaction mixture. The organic solvent to be used for removing the base catalyst may be the same materials as in the case of using the acid catalyst.

Also, the base catalyst can be removed by using the same mixture of the water-soluble organic solvent and the slightly water-soluble organic solvent as in the case of using the acid catalyst. Meanwhile, the mixing ratio of the water-soluble organic solvent and the slightly water-soluble organic solvent may be the same ratio as in the case of using the acid catalyst.

Subsequently, the reaction mixture may be washed with neutral water. The washing method may be the same as in the case of using the acid catalyst.

A final solvent is then added to the washed polymer, and solvent-exchange operation is carried out under reduced pressure to obtain a polymer solution. The temperature and degree of vacuum of the solvent exchange operation may be the same temperature and degree of vacuum as in the case of using the acid catalyst.

At this time, a monovalent, divalent, or more polyvalent alcohol or ether compound having cyclic ether as a substituent may be added as a stabilizer similarly to the case where the acid catalyst is used. Further, the polymer solution is preferably made with a concentration of 0.1 to 20% by mass.

Preferable examples of the final solvent added to the polymer include alcohol solvents, and particularly monoalkyl ether derivatives of ethylene glycol, diethylene glycol, triethylene glycol, propylene glycol, dipropylene glycol, etc.

Illustrative examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, etc.

If these solvents are used as a main solvent, a non-alcoholic solvent may be added thereinto as an adjuvant solvent. As the adjuvant solvent, the same solvent as in the case of using the acid catalyst may be used.

As another operation, water or a water-containing organic solvent may be added to the monomers or an organic solution of the monomers to start hydrolysis reaction. In this case, the base catalyst may be added to the monomers or the organic solution of the monomers, or may be added to the water or the water-containing organic solvent. The reaction temperature is preferably in the range of 0 to 100° C., and more preferably 10 to 80° C. A method in which the mixture is heated at 10 to 50° C. while adding dropwise water, and further heated at 20 to 80° C. to age the mixture is preferable.

As the organic solvent, water-soluble solvent is preferable, and illustrative examples thereof include methanol, ethanol, 1-propanol, 2-propanol, 1-butanol, 2-butanol and 2-methyl-1-propanol, acetone, tetrahydrofuran, acetonitrile, polyvalent alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, etc., and a mixture thereof.

The amount of the organic solvent to be used may be the same amount as above. The obtained reaction mixture is post-treated like the above-mentioned method to obtain a polymer.

The molecular weight of the polymer thus obtained can be adjusted not only by selecting monomers, but also controlling reaction conditions during polymerization. The molecular weight of the obtained polymer is not particularly restricted, but the weight average molecular weight of the polymer is preferably 100,000 or less, more preferably in the range of 200 to 50,000, and much more preferably 300 to 30,000. If the weight average molecular weight is 100,000 or less, generation of foreign matters and coating spots can be suppressed. Meanwhile, the above weight average molecular weight is obtained as data, in terms of polystyrene by means of gel-permeation chromatography (GPC) using polystyrene as a reference material, refractive index (RI) detector as a detector, and tetrahydrofuran as an eluent.

Alternatively, the composition for forming a coating type BPSG film of the present invention may include a solvent and, as component (A), one or more polymers selected from a hydrolysate, a condensate, and a hydrolysis condensate of a mixture containing one or more silicon compounds represented by the formulae (A-1-1) to (A-1-4), one or more phosphorus compounds represented by the formulae (A-2-1) to (A-2-6), and one or more boron compounds represented by the formulae (A-3-1) to (A-3-3), and as component (B), one or more polysilane compounds represented by the formula (B-1), $$(R^9R^{10}R^{11}Si)_{a2}(R^{12}R^{13}Si)_{a3}(R^{14}Si)_{a4}(Si)_{a5} \quad (B-1)$$

wherein $R^9$, $R^{10}$, $R^{11}$, $R^{12}$, $R^{13}$, $R^{14}$, a2, a3, a4, and a5 have the same meanings as defined above.

The silicon-containing compound (polymer) constituting the component (A) of the above-mentioned composition for forming a coating type BPSG film, can be synthesized by performing hydrolysis, condensation, or hydrolysis condensation of a mixture (monomer) containing one or more silicon compounds mentioned above, one or more phosphorus compounds mentioned above, and one or more boron compounds mentioned above.

The hydrolysis, condensation, or hydrolysis condensation for obtaining the above-mentioned component (A) can be carried out in the same manner as mentioned above.

[Component (B)]

As component (B) of the composition for forming a coating type BPSG film of the present invention, a polysilane compound represented by the formula (B-1) is used.

$$(R^9R^{10}R^{11}Si)_{a2}(R^{12}R^{13}Si)_{a3}(R^{14}Si)_{a4}(Si)_{a5} \quad (B-1)$$

As the polysilane compound represented by the formula (B-1), similarly to the polysilane compound represented by the formula (A-4-1), OGSOL SI-10-10, SI-10-20, SI-20-10, SI-20-10 (improved), SI-30-10, available from Osaka Gas Chemicals Co., Ltd., may be used. In addition, materials obtained by subjecting these compounds to reaction for reducing the molecular weight under alkaline conditions may also be used. Details of the reaction under alkaline conditions is as described for the reduction in molecular weight of the compound (A-4-1).

Especially, it is preferred that the compound represented by the formula (B-1) have a weight average molecular weight of 1,000 or less. When the weight average molecular weight is 1,000 or less, the polysilane compound represented by the formula (B-1) easily dissolves in a solvent component in the composition for forming a coating type BPSG film, and generation of particles during film formation can be prevented.

[Component (C)]

The composition for forming a coating type BPSG film of the present invention may further contain (C) one or more members selected from one or more silicon compounds represented by the formula (C-1), a hydrolysate, a condensate, and a hydrolysis condensate thereof, $$R^{1C}_{c1}R^{2C}_{c2}R^{3C}_{c3}Si(OR^{OC})_{(4-c1-c2-c3)} \quad (C-1)$$

wherein $R^{OC}$ represents a hydrocarbon group having 1 to 6 carbon atoms; $R^{1C}$, $R^{2C}$, and $R^{3C}$ each represent a hydrogen atom or a monovalent organic group having 1 to 30 carbon atoms; and c1, c2, and c3 are each 0 or 1, and satisfy $1 \le c1+c2+c3 \le 3$.

The silicon compound represented by the formula (C-1) may be the same material as the above-mentioned illustrative examples of the silicon compounds represented by the formulae (A-1-1) to (A-1-3) in the component (A).

One or more of $R^{1C}$, $R^{2C}$, and $R^{3C}$ in the formula (C-1) are preferably an organic group having a hydroxyl group or a carboxyl group each substituted by an acid-labile group.

Examples of the compound represented by the formula (C-1) include those having the following structures whose silicon is bonded to two or three methoxy groups, ethoxy groups, propoxy groups, or butoxy groups, as hydrolysable groups. Meanwhile, in the following structural formulae, (Si) is described to show the bonding sites to the Si.

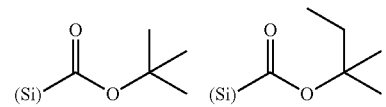

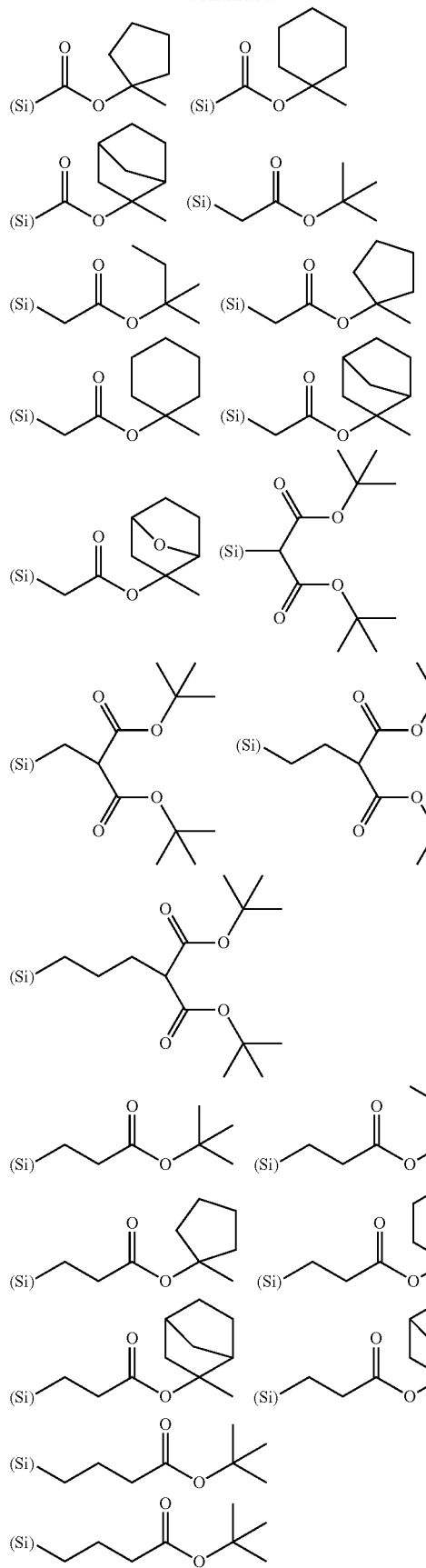
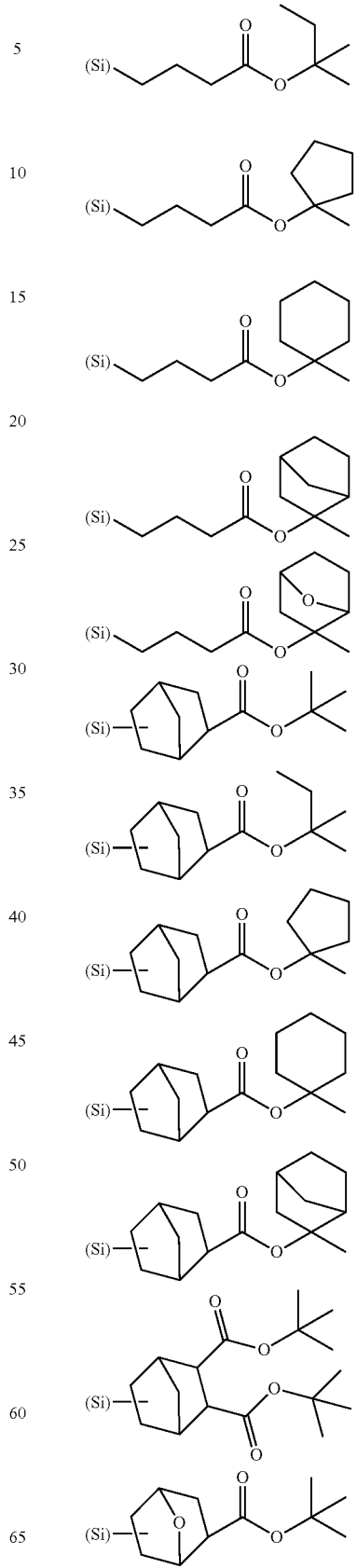

65
-continued
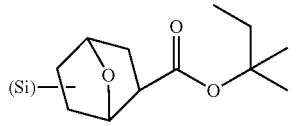
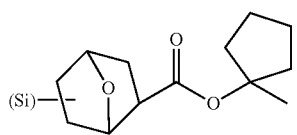
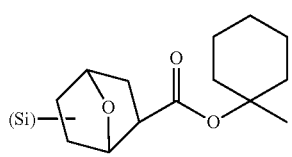
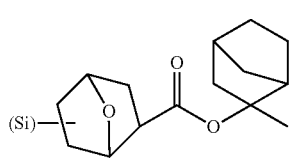
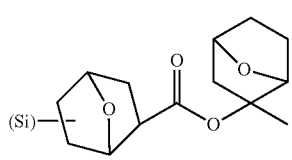
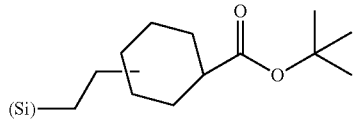
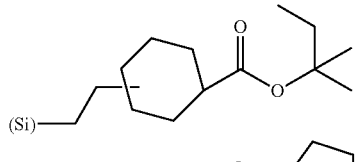
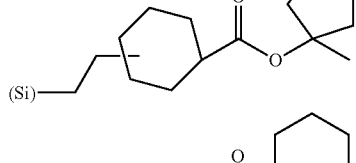
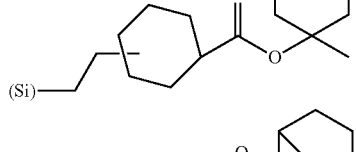
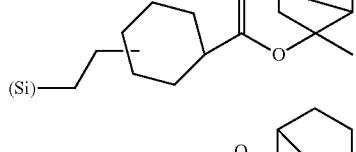
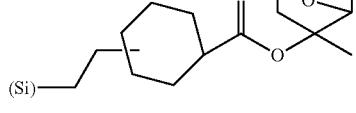
66
-continued
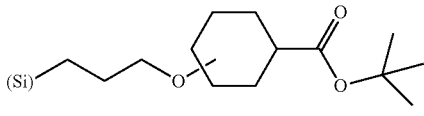
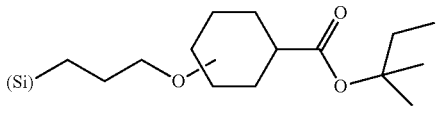
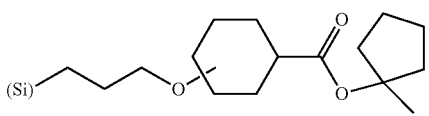
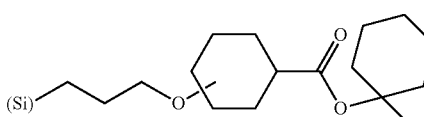
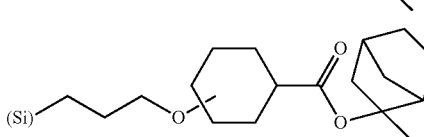
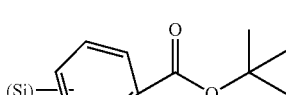
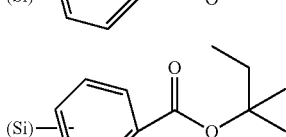
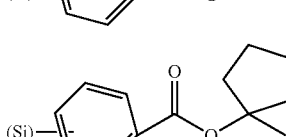
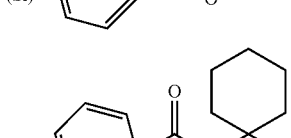
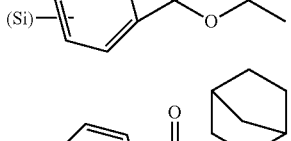
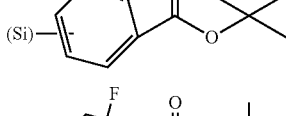
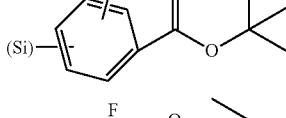
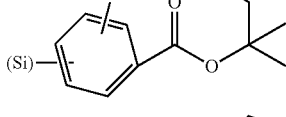
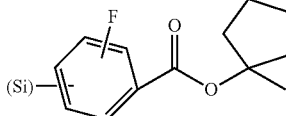

-continued
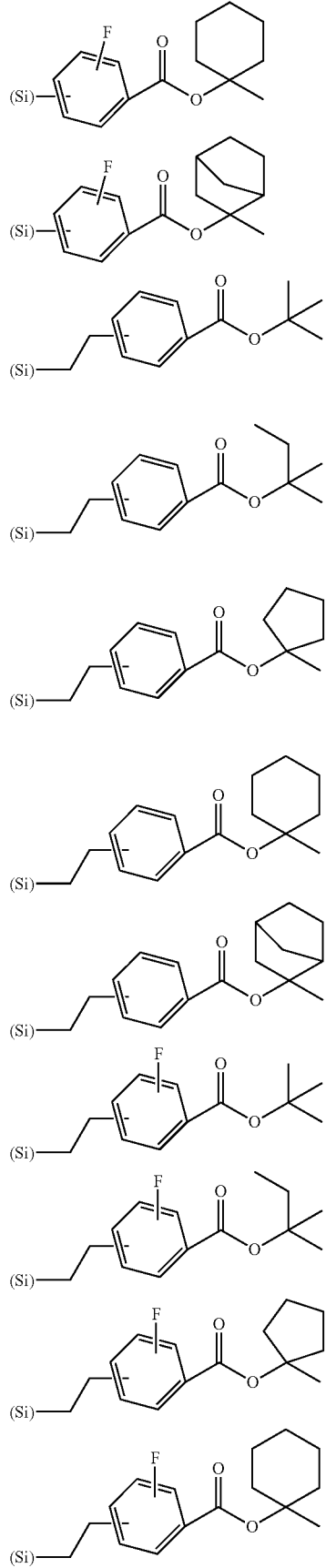
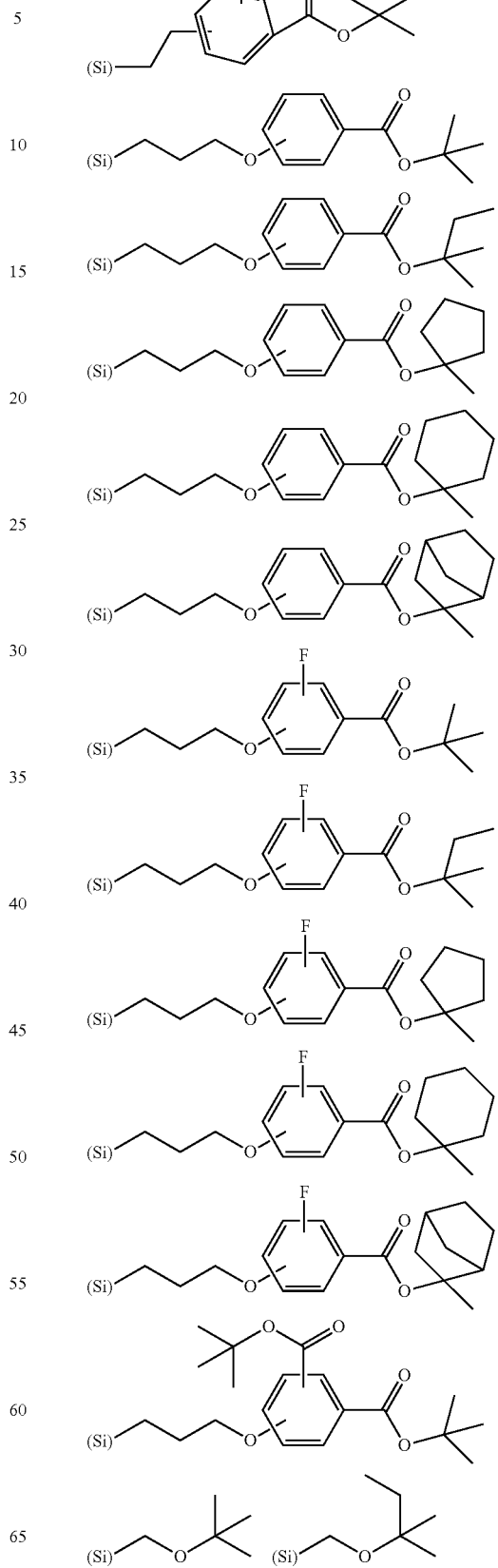

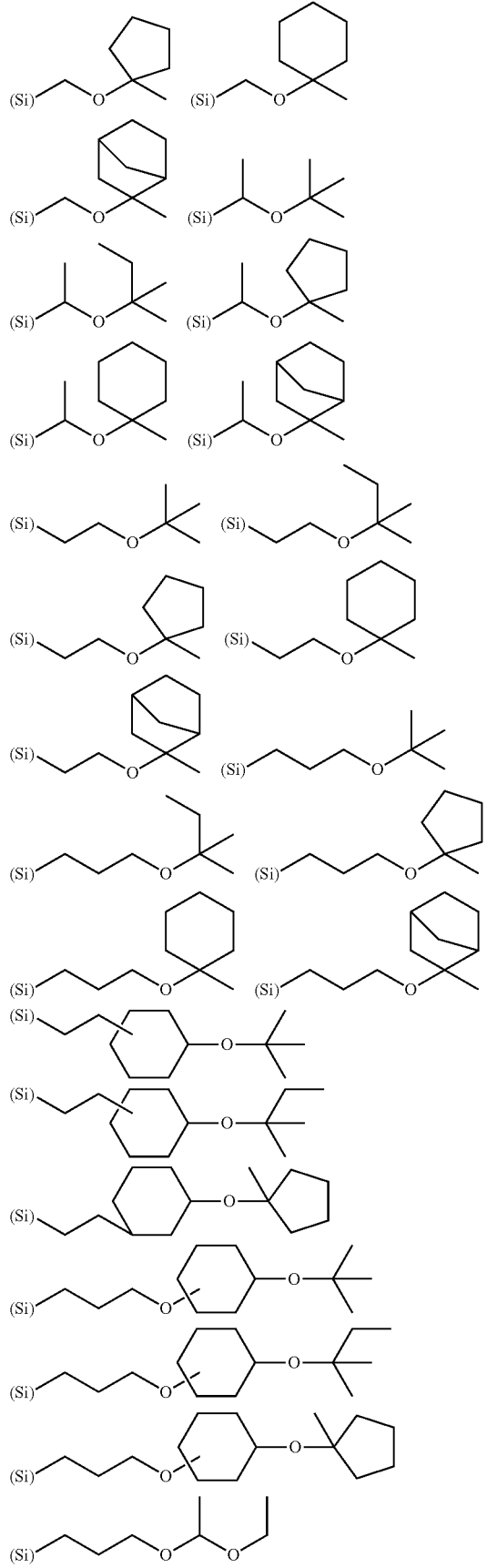
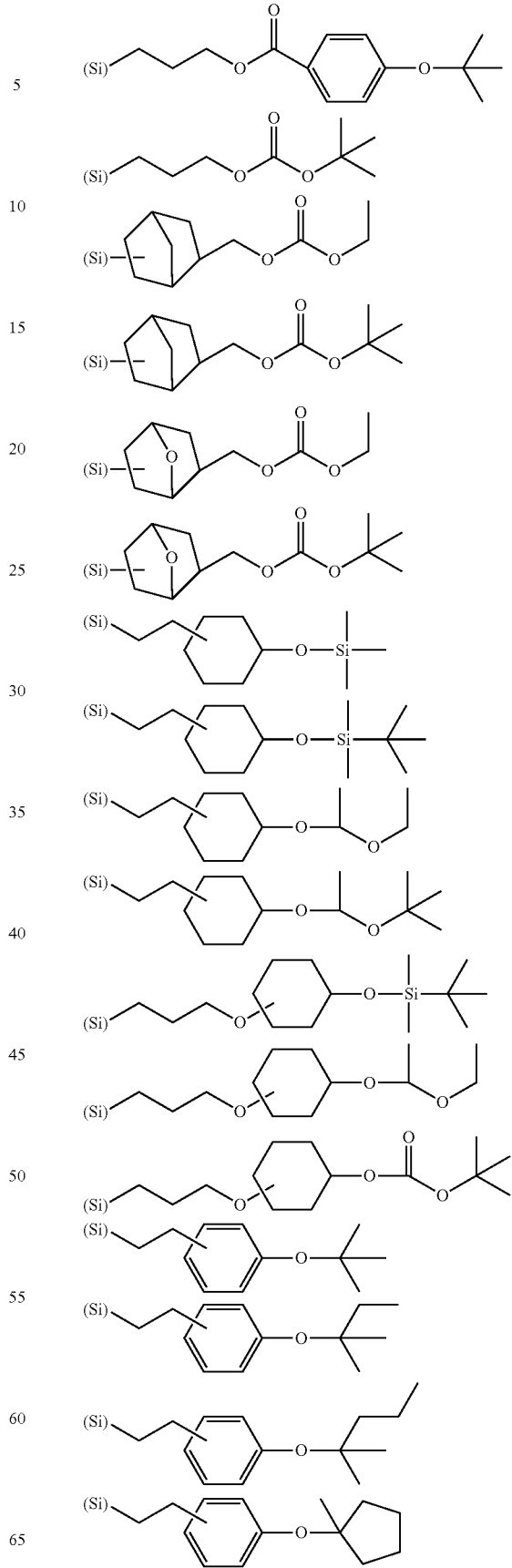

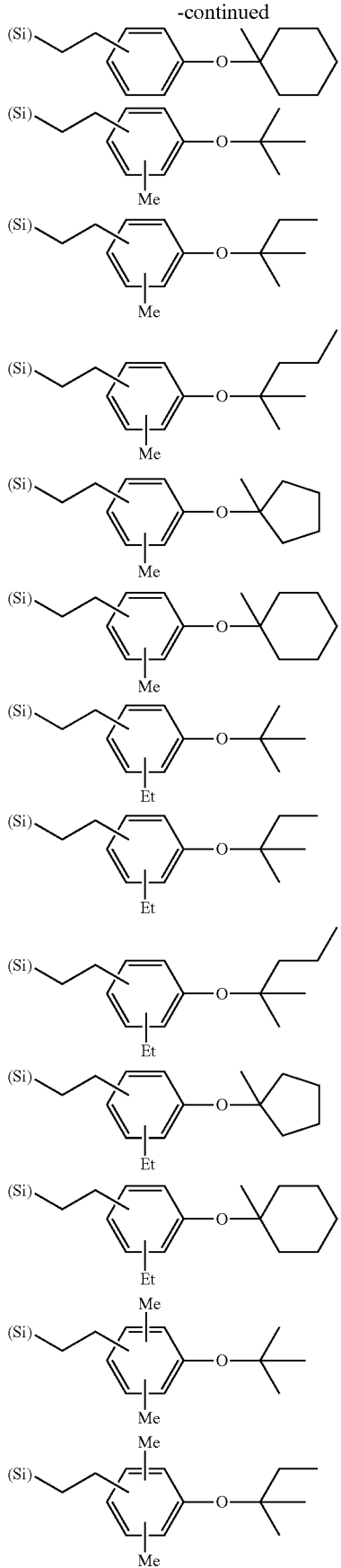
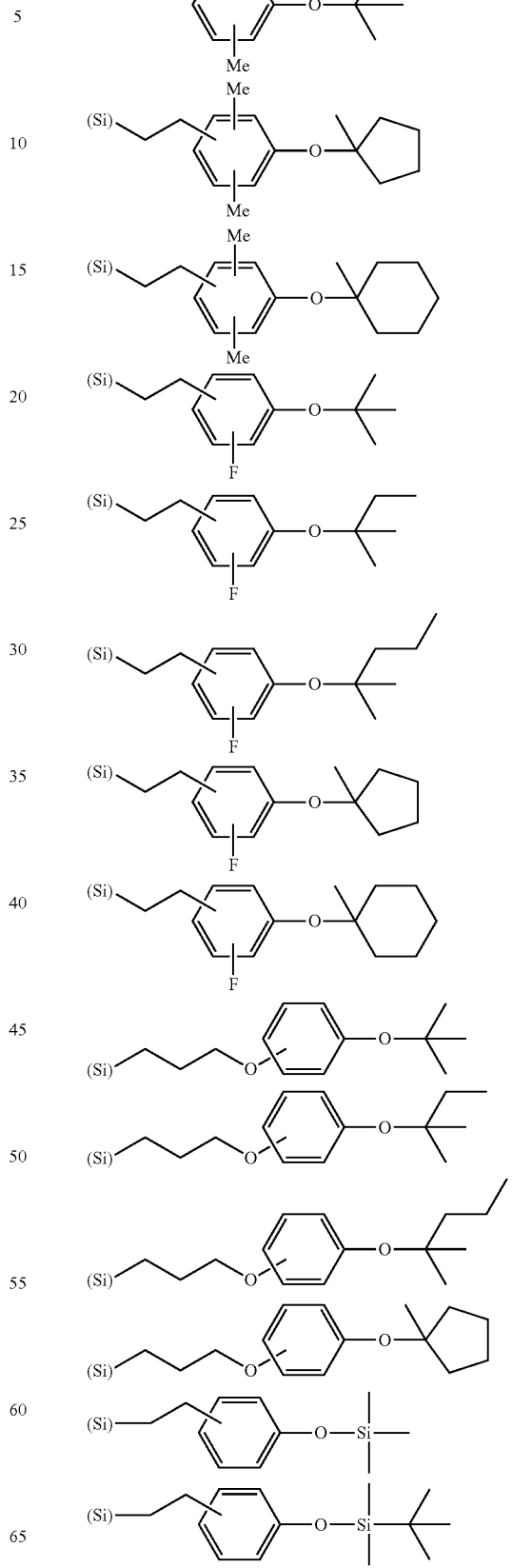

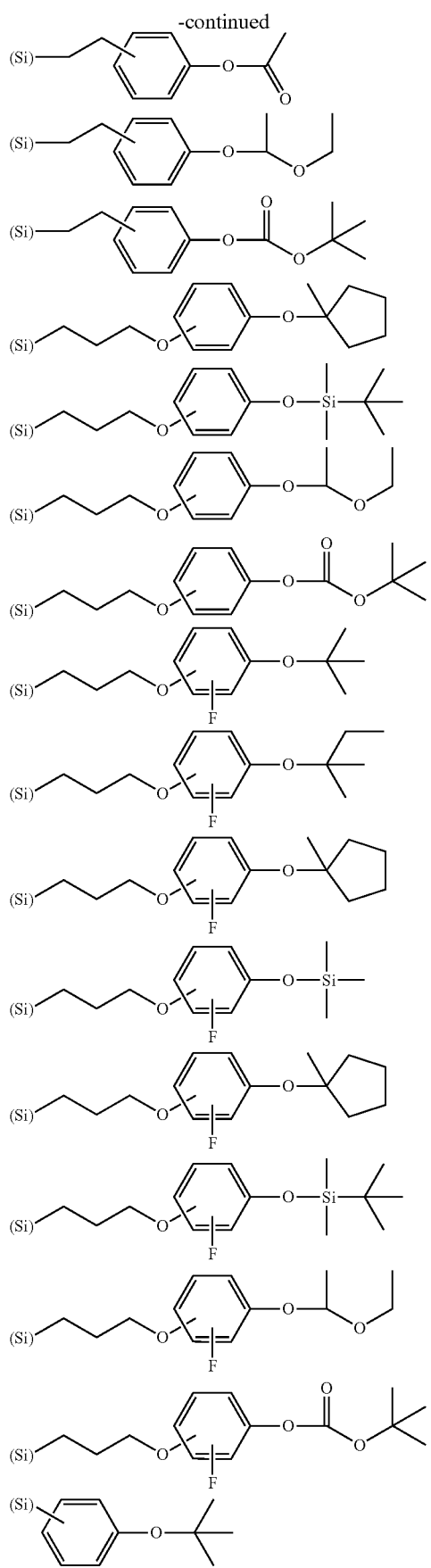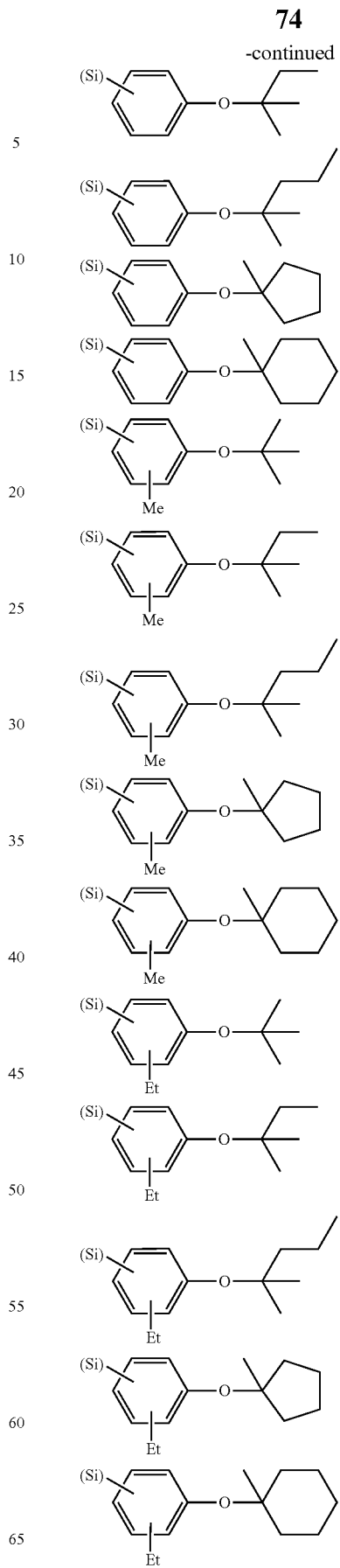

75
-continued
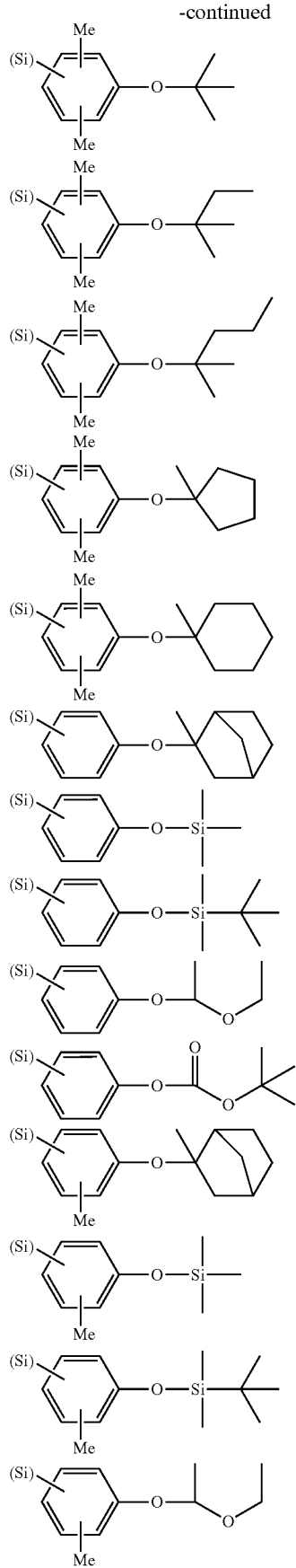
76
-continued
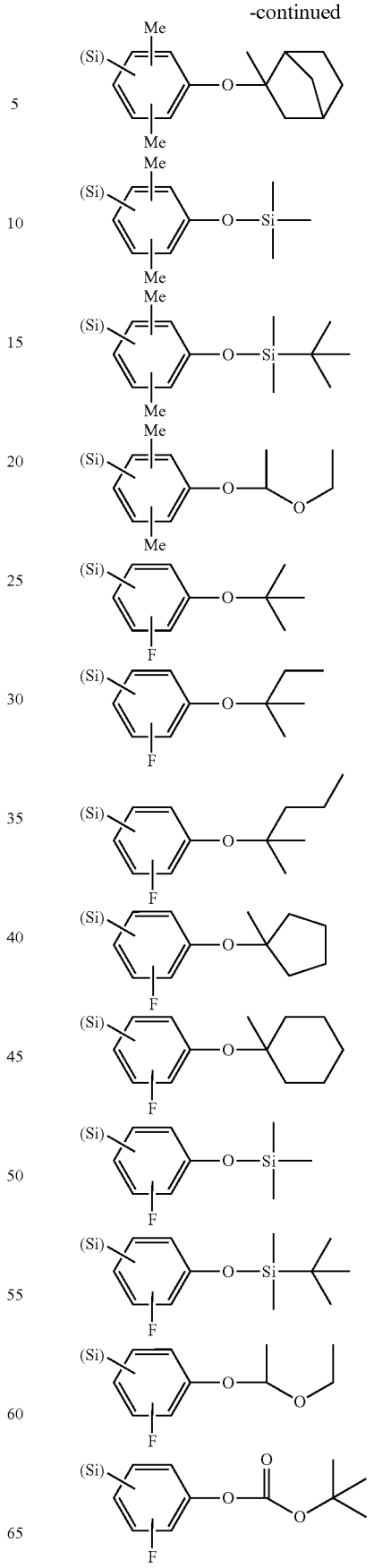

-continued
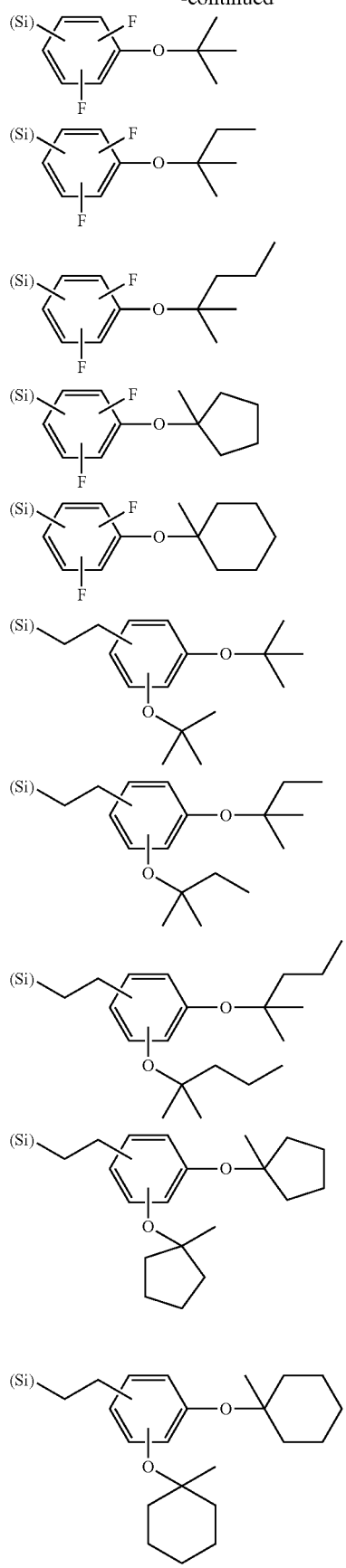
-continued
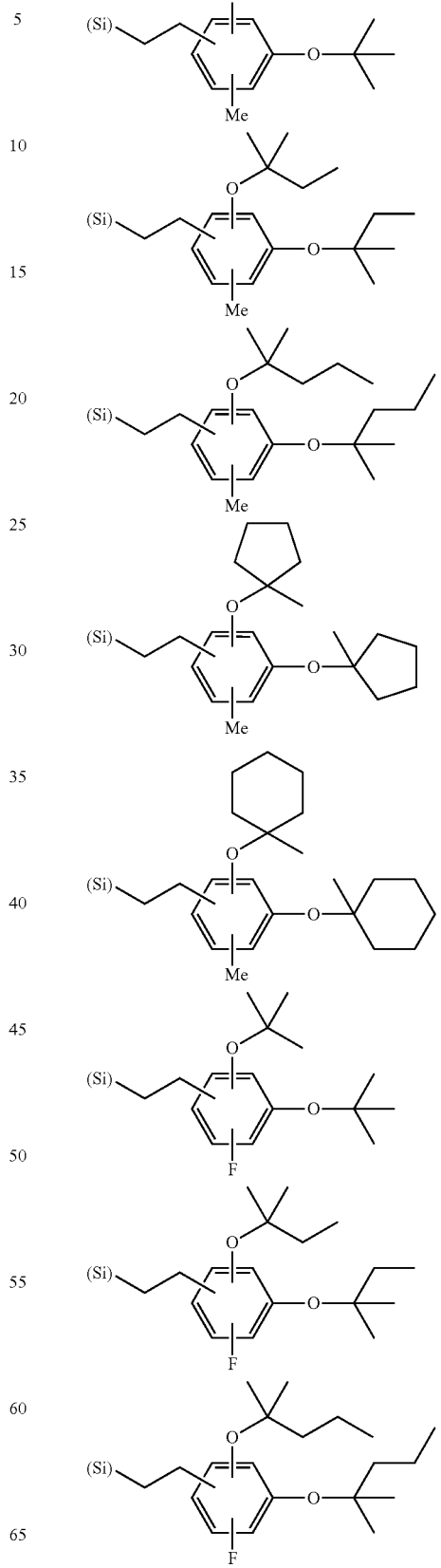

-continued
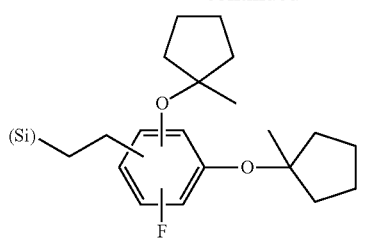
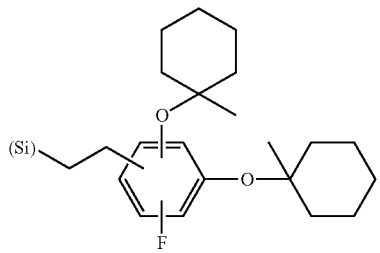
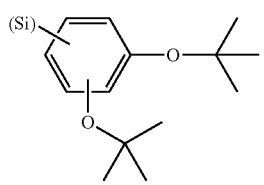
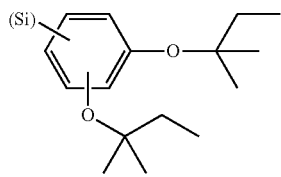
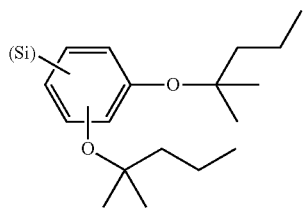
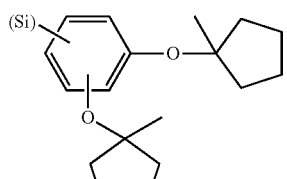
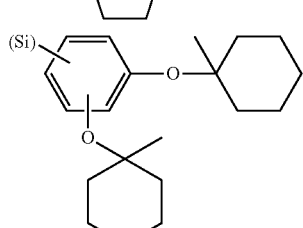
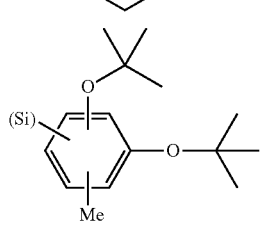
-continued
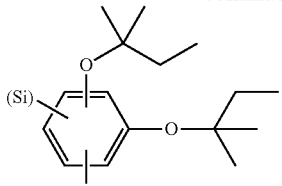
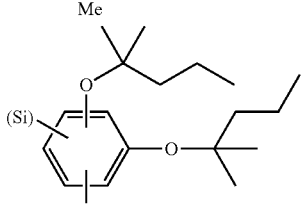
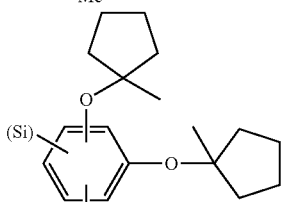
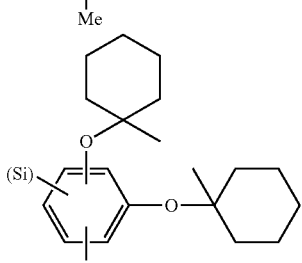
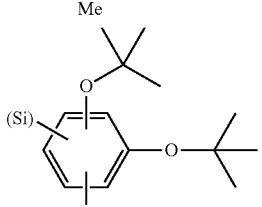
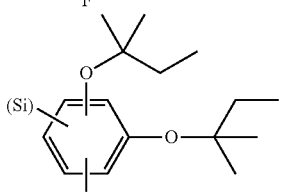
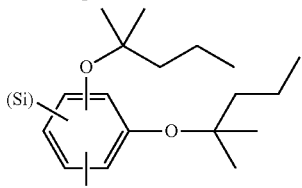
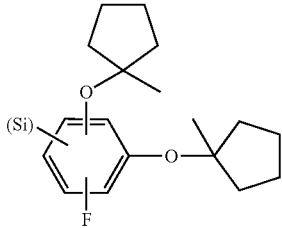

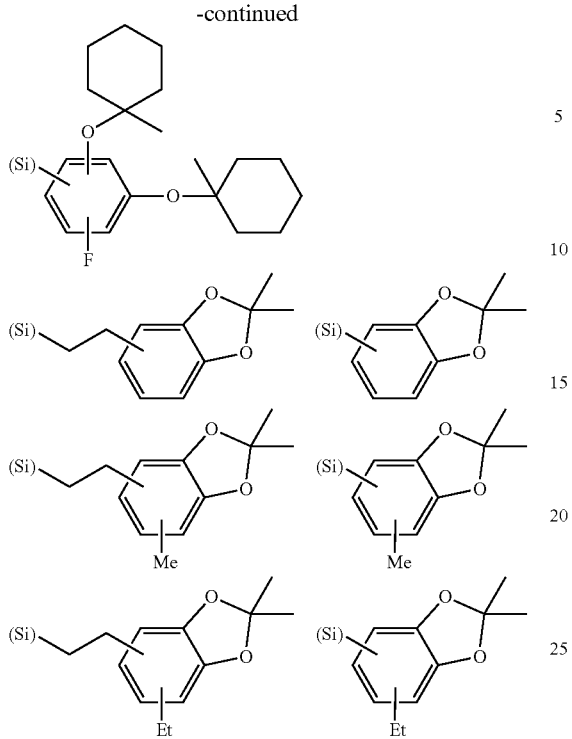

By using such component (C), the composition for forming a coating type BPSG film can give a film that has an improved adhesiveness to a photoresist pattern and does not cause a pattern collapse even in a fine patterning when used as a resist under layer film.

Also, the component (C) preferably contains one or more members selected from one or more silicon compounds represented by the formulae (A-1-1) to (A-1-4), one or more phosphorus compounds represented by the formulae (A-2-1) to (A-2-6), and one or more boron compounds represented by the formulae (A-3-1) to (A-3-3) each alone, a mixture thereof, and a hydrolysate, a condensate, and a hydrolysis condensate thereof.

When the component (C) contains the silicon compound, the phosphorus compound, and the boron compound, the composition for forming a coating type BPSG film in which the inventive effect is further enhanced can be obtained.

Incidentally, hydrolysis, condensation or hydrolysis condensation reaction in component (C) can be carried out in the same manner as in the hydrolysis, condensation or hydrolysis condensation reaction of the above-mentioned component (A).

Also, the composition for forming a coating type BPSG film of the present invention preferably further includes an organic compound having 2 or more hydroxyl groups or carboxyl groups in one molecule. Examples of the organic compound include the compounds shown below.

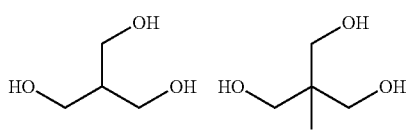

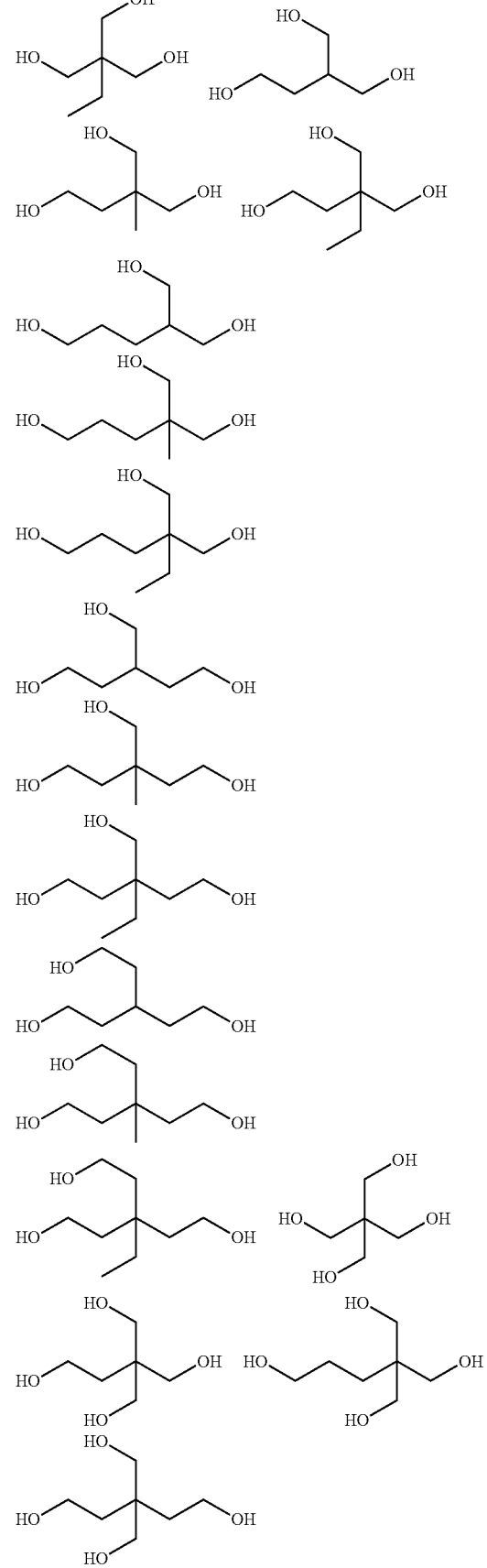

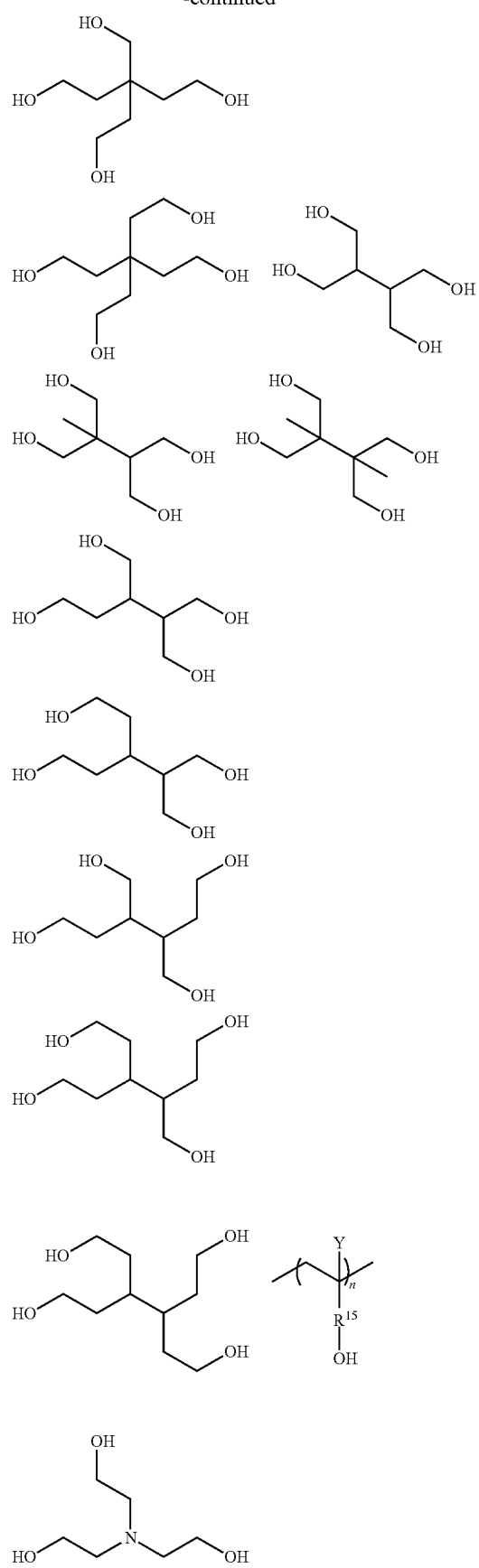
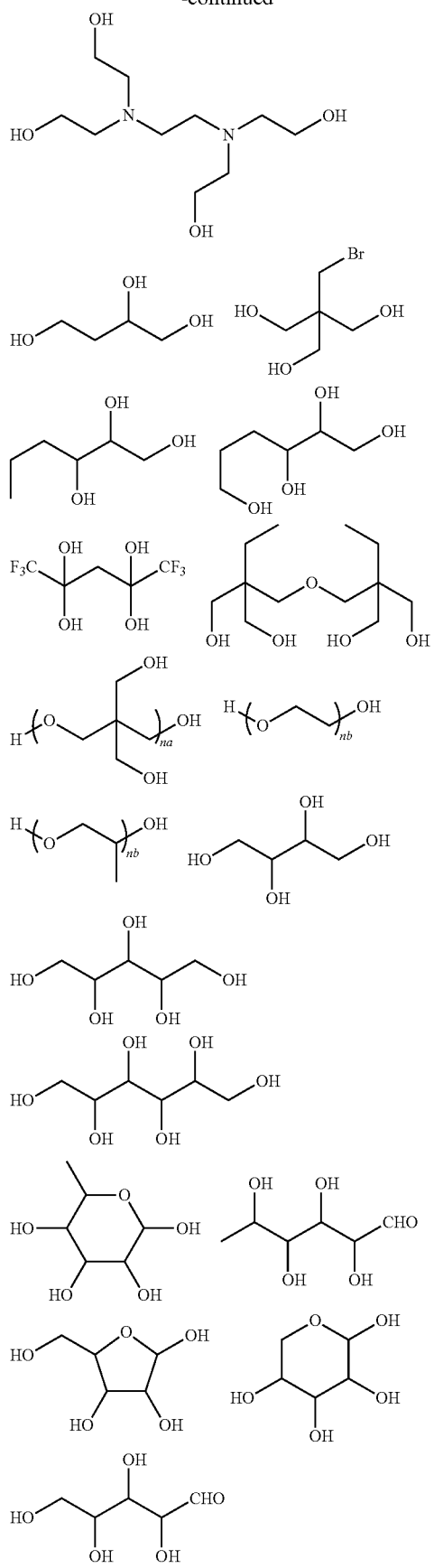

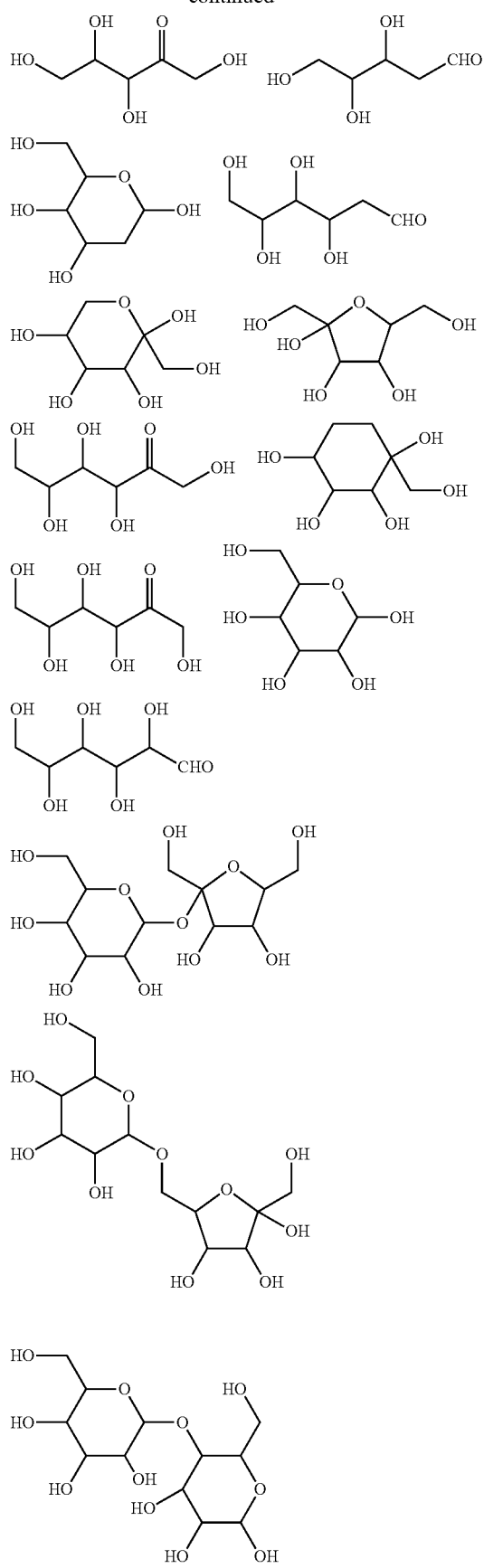
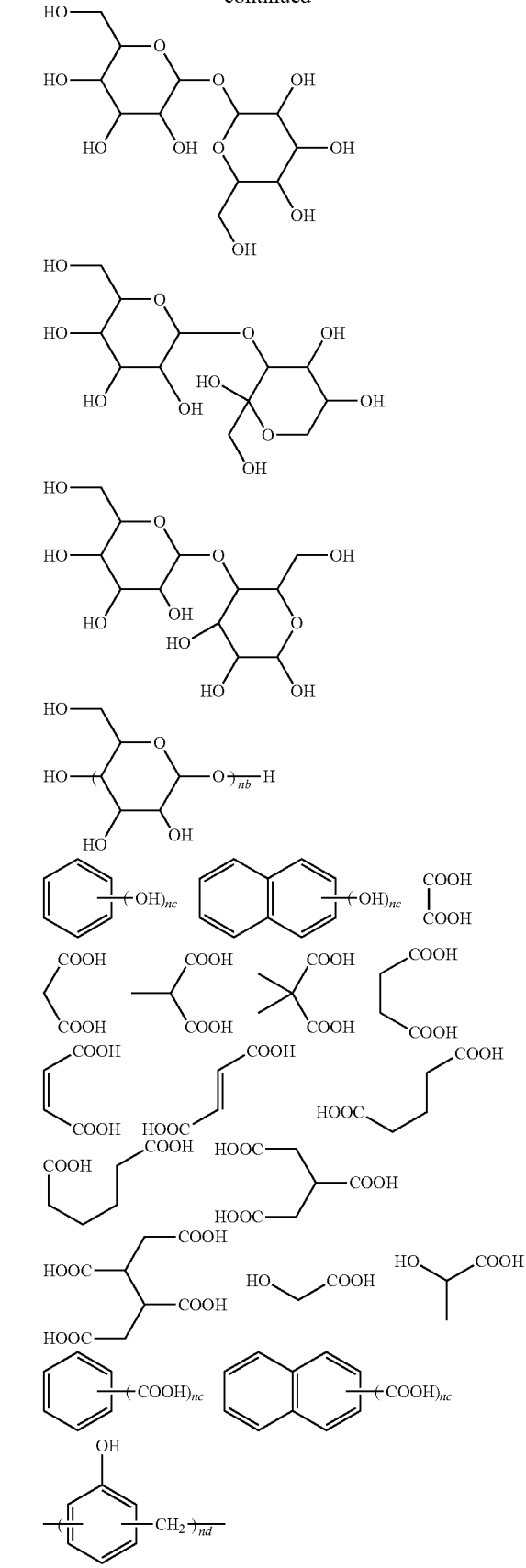

In the above structural formulae, Y represents a hydrogen atom, a methyl group, or a hydroxymethyl group, $R^{15}$ represents a methylene group, a carbonyl group, or a phenylene group, "n" is an integer of 3 or more and less than 100, "na" is an natural number of 1 to 3, "nb" represents a natural number of 1 or more, "nc" represents a natural number of 2 to 4, and "nd" represents a natural number of 2 or more.

In the above structural formulae, an enantiomer and a diastereomer can exist, and each of the structural formulae represents all of these stereoisomers. These stereoisomers may be used solely, or may be used as a mixture.

The organic compound may be used one kind alone or two or more kinds in combination. Adding amount thereof is preferably in the range of 0.001 to 50 parts by mass, more preferably 0.01 to 30 parts by mass based on 100 parts by mass of the polymer of component (A).

The addition of such an organic compound promotes collapse of the BPSG film during wet etching, whereby peeling becomes easy.

[Other Additive]

A thermal crosslinking accelerator may be added to the composition for forming a coating type BPSG film of the present invention. As the thermal crosslinking accelerator usable in the composition for forming a coating type BPSG film of the present invention, there may be mentioned materials described in the Japanese Patent Laid-Open Publication No. 2007-302873. The thermal crosslinking accelerator can be used one kind alone or two or more kinds in combination. Meanwhile, the amount of the thermal crosslinking accelerator to be added is preferably 0.01 to 50 parts by mass, more preferably 0.1 to 40 parts by mass, based on 100 parts by mass of the polymer of component (A).

To improve stability of the composition for forming a coating type BPSG film of the present invention, a monovalent, divalent, or more polyvalent organic acid having 1 to 30 carbon atoms may be added thereinto. Preferable examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, etc. Especially, oxalic acid, maleic acid, formic acid, acetic acid, propionic acid, citric acid, etc., are preferable. To keep stability, two or more kinds of these acids may be used. Adding amount thereof is preferably 0.001 to 25 parts by mass, more preferably 0.01 to 15 parts by mass, much more preferably 0.1 to 5 parts by mass, based on 100 parts by mass of silicon contained in the composition. Otherwise, the organic acid is preferably added such that pH of the composition satisfies 0≤pH≤7, more preferably 0.3≤pH≤6.5, much more preferably 0.5≤pH≤6.

A monovalent, divalent, or more polyvalent alcohol or ether compound having cyclic ether as a substituent may be added to the composition for forming a coating type BPSG film of the present invention as a stabilizer. By adding the stabilizer, stability of the polymer can be improved. As the stabilizer usable in the composition for forming a coating type BPSG film of the present invention, materials described in paragraphs (0180) to (0184) of Japanese Patent Laid-Open Publication No. 2009-126940 can be mentioned.

Water may be added to the composition for forming a coating type BPSG film of the present invention. When water is added thereinto, the polymer is hydrated whereby improving a lithography performance. Water content in the solvent component of the composition for forming a coating type BPSG film is preferably more than 0% and less than 50% by mass, more preferably in the range of 0.3 to 30% by mass, much more preferably 0.5 to 20% by mass. The amount of all solvents including water is preferably in the range of 100 to 100,000 parts by mass, and more preferably 200 to 50,000 parts by mass, based on 100 parts by mass of the polymer of component (A). By adding in such an amount, lithography performance can be improved, and uniformity of the coating film does not tend to be deteriorated, thereby causing of eye holes can be suppressed.

A photo-acid generator may be added to the composition for forming a coating type BPSG film of the present invention. As the photo-acid generator usable in the composition for forming a coating type BPSG film of the present invention, materials described in paragraphs (0160) to (0179) of Japanese Patent Laid-Open Publication No. 2009-126940 can be mentioned.

A surfactant may be added to the composition for forming a coating type BPSG film of the present invention, if necessary. As the surfactant usable in the composition for forming a coating type BPSG film of the present invention, materials described in paragraph (0185) of Japanese Patent Laid-Open Publication No. 2009-126940 can be mentioned.

A phosphoric acid salt compound or a boric acid salt compound may be added to the composition for forming a coating type BPSG film of the present invention as a thermal crosslinking accelerator, if necessary. Examples of the phosphoric acid salt compound include ammonium salts such as ammonium phosphate, tetramethylammonium phosphate, and tetrabutylammonium phosphate; and sulfonium salts such as triphenylsulfonium phosphate. Also, examples of the boric acid salt compound include ammonium salts such as ammonium borate, tetramethylammonium borate, and tetrabutylammonium borate; and sulfonium salts such as triphenylsulfonium borate.

Also, a phosphoric acid or a boric acid may be added to the composition for forming a coating type BPSG film of the present invention, if necessary.

By using the compounds as mentioned above, the composition for forming a coating type BPSG film of the present invention can be obtained. As preferable embodiments of the composition for forming a coating type BPSG film of the present invention, there may be mentioned materials having the following structures.

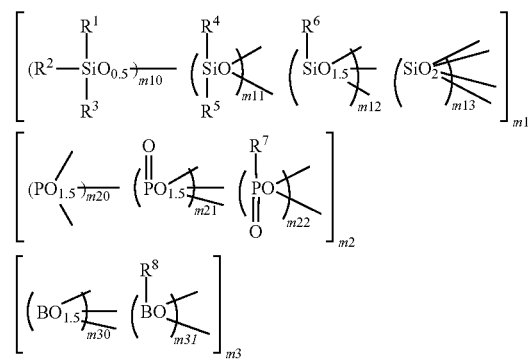

-continued

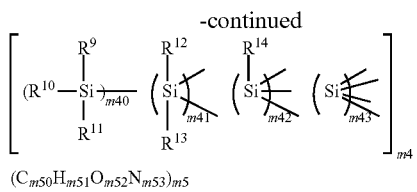

wherein m1, m2, m3, m4, and m5 each represent a molar fraction in the composition, and satisfy m1+m2+m3+m4+m5=1, 0.5<m1<1, 0<m2<0.2, 0<m3<0.3, 0<m4<0.3, 0≤m5<0.4, and 0.001≤m2+m3≤0.3; m10, m11, m12, m13, m20, m21, m22, m30, m31, m40, m41, m42, and m43 have the same meanings as defined above; m50, m51, m52, and m53 each represent a ratio of an elemental composition in the carbon skeletal structure, and satisfy m50+m51+m52+m53=1, 0<m50≤0.4, 0<m51≤0.6, 0<m52≤0.2, and 0≤m53≤0.1; and $R^1$, $R^2$, $R^3$, $R^4$, $R^5$, $R^6$, $R^7$, $R^8$, $R^9$, $R^{10}$, $R^{11}$, $R^{12}$, $R^{13}$, and $R^{14}$ have the same meanings as defined above.

As described above, the composition for forming a coating type BPSG film of the present invention can give a BPSG film that has excellent adhesiveness in fine pattern and can be easily wet etched by a removing liquid which does not cause damage to a semiconductor substrate and a coating type organic film or a CVD film mainly consisting of carbon which is required in the patterning process.

[Substrate]

Also, the present invention provides a substrate for use in a semiconductor manufacturing process, including a BPSG film formed on a body to be processed by applying the above-mentioned composition for forming a coating type BPSG film thereonto.

At this time, the BPSG film formed by applying the composition for forming a coating type BPSG film of the present invention onto a body to be processed may function as at least one of a resist under layer film, a flattening film, and an insulating film.

The BPSG film formed from the composition for forming a coating type BPSG film of the present invention has excellent adhesiveness in fine pattern and can be easily wet etched by a removing liquid which does not cause damage to a semiconductor substrate and a coating type organic film or a CVD film mainly consisting of carbon which is required in the patterning process, so that it is suitable for a resist under layer film.

Moreover, the BPSG film formed from the composition for forming a coating type BPSG film of the present invention is a coating type so that it can be formed without generating particles, and shows the same heat-fusible property as that of the conventional BPSG film formed by the CVD method. Moreover, it can be easily flattened by subjecting to heat treatment. Therefore it is suitable for a flattening film.

Further, the BPSG film formed from the composition for forming a coating type BPSG film of the present invention is also suitable for an insulating film since it is a coating type and can be formed without generating particles.

In addition, the above-mentioned BPSG film may be formed by using a semiconductor substrate on which a part or whole of semiconductor circuits have been formed as the body to be processed, and applying the composition for forming a coating type BPSG film by spin coating onto the semiconductor substrate and then baking the same.

[Patterning Process]

In the present invention, a pattern can be formed by: forming an organic under layer film on a body to be processed by using a coating type organic under layer film material; forming a BPSG film on the organic under layer film by using the composition for forming a coating type BPSG film of the present invention; forming an upper layer resist film on the BPSG film; forming a pattern with the upper layer resist film; transferring the pattern to the BPSG film by etching using the upper layer resist film having the formed pattern as a mask; and transferring the pattern to the organic under layer film by etching using the BPSG film having the transferred pattern as a mask to form a mask pattern for processing the body to be processed.

Further, in the present invention, a pattern also can be formed by: forming a hard mask mainly consisting of carbon on a body to be processed by a CVD method; forming a BPSG film on the hard mask by using the composition for forming a coating type BPSG film of the present invention; forming an upper layer resist film on the BPSG film; forming a pattern with the upper layer resist film; transferring the pattern to the BPSG film by etching using the upper layer resist film having the formed pattern as a mask; and transferring the pattern to the hard mask by etching using the BPSG film having the transferred pattern as a mask to form a mask pattern for processing the body to be processed.

The body to be processed used in the patterning process of the present invention may be a material in which any of a metal film, an amorphous metal film, a metal carbide film, a metal oxide film, a metal nitride film, a metal oxycarbide film or a metal oxynitride film is formed on a semiconductor substrate on which a part or whole of semiconductor circuits have been formed, as a layer to be processed.

As the semiconductor substrate, silicon substrate is generally used. However, the substrate is not limited to this and may be Si, an amorphous silicon (α-Si), p-Si, $SiO_2$, SiN, SiON, W, TiN, Al, or the like. The substrate may be composed of a material different from the layer to be processed.

Examples of the metal used for the body to be processed include silicon, titanium, tungsten, hafnium, zirconium, chromium, germanium, copper, aluminum, indium, gallium, arsenic, palladium, iron, tantalum, iridium, molybdenum, or an alloy thereof. The layer to be processed may be made of Si, $SiO_2$, SiN, SiON, SiOC, p-Si, α-Si, TiN, WSi, BPSG, SOG, Cr, CrO, CrON, MoSi, W, Al, Cu, Al—Si, or the like; various low dielectric constant (low-k) films, or etching stopper films. The thickness of the layer is preferably in the range of 50 to 10,000 nm, more preferably 100 to 5,000 nm.

In the patterning process of the present invention, an organic under layer film, or a hard mask mainly consisting of carbon can be formed on the body to be processed. Among these, the organic under layer film can be formed from the coating type organic under layer film material by using the spin coating method, etc., and the hard mask mainly consisting of carbon can be formed form a material of an organic hard mask mainly consisting of carbon by using the CVD method. Such a coating type organic under layer film and a CVD film mainly consisting of carbon are not particularly limited, and preferably a material which shows a sufficient function as the antireflective film when the upper layer resist film is subjected to pattern formation by exposure. By forming such a coating type organic under layer film or a CVD film mainly consisting of carbon, a pattern formed with the upper layer resist film can be transferred to the body to be processed without generating the difference in size conversion.

The BPSG film used in the patterning process of the present invention can be formed on a body to be processed by the spin coating method, etc., similarly to the photoresist film (upper layer resist film) by using the composition for forming a coating type BPSG film. After spin coating, it is desired to be baked for evaporating the solvent, preventing from mixing with the upper layer resist film, and promoting the cross-linking reaction. The baking temperature is preferably in the range of 50 to 500° C., and the heating time is preferably in the range of 10 to 300 seconds. Particularly preferable temperature range is 400° C. or less for reducing heat damage to the devices, though it is depending on the structure of the devices to be fabricated.

Also, pattern formation of the upper layer resist film is preferably carried out by a lithography method using light with a wavelength of 300 nm or less or EUV light, an electron beam direct drawing method, a directed self-assembly method or a nano-imprinting lithography method. By using these methods, a fine pattern can be formed with the upper layer resist film.

The composition for forming an upper layer resist film may be appropriately selected depending on the method for forming a pattern with the upper layer resist film. For example, when lithography using light with a wavelength of 300 nm or less or EUV light is carried out, a chemically amplified photoresist film material may be used as the composition for forming an upper layer resist film. Such a photoresist film material may be exemplified by a material, in which a photoresist film is formed and exposed, and then, the exposed part is dissolved by using an alkaline developer to form a positive pattern, or the unexposed part is dissolved by using a developer composed of an organic solvent to form a negative pattern.

Also, when the lithography is carried out by using an ArF excimer laser light as the light with a wavelength of 300 nm or less, any material can be used as the composition for forming an upper layer resist film so long as it is a usual resist composition for ArF excimer laser light. As such a resist composition for the ArF excimer laser light, many candidates have been well-known. When the well-known resins are roughly classified, there are a poly(meth)acryl type, a COMA (Cycloolefin Maleic Anhydride) type, a COMA-(meth)acrylic hybrid type, a ROMP (Ring Opening Metathesis Polymerization) series, and a polynorbornene type material, etc. Among them, the resist composition using the poly(meth)acryl type resin secures its etching resistance by introducing an alicyclic skeletal structure at the side chain, so that it is excellent in resolution property as compared with the other resin type, therefore it is preferably used.

The patterning process of the present invention is excellent in pattern adhesiveness of the resist under layer film, so that even when a fine pattern is formed at the upper layer resist film, it cause no pattern collapse or the like. It is also excellent in etching selectivity to the organic film or the silicon-containing film, so that by optimizing the combination of the coating type organic under layer film or the CVD film mainly consisting of carbon, pattern transfer can be carried out without generating the difference in size conversion.

After forming the mask pattern for processing the body to be processed, the BPSG film may be removed by wet etching.

When the BPSG film of the present invention is wet etched, a removing liquid containing hydrogen peroxide is preferably used. At this time, it is further preferable to adjust the pH by adding an acid or a base to promote peeling. As the pH adjusting agent, there may be mentioned inorganic acids such as hydrochloric acid and sulfuric acid, organic acids such as acetic acid, oxalic acid, tartaric acid, citric acid, and lactic acid, nitrogen-containing basic compounds such as ammonia, ethanolamine, tetramethylammonium hydroxide, etc., and nitrogen-containing organic acid compounds such as EDTA (ethylenediamine tetraacetic acid), etc.

The BPSG film obtained from the composition for forming a coating type BPSG film of the present invention has a Si—Si bond which is to be cleaved under alkaline conditions, and therefore it is excellent in peelability, in particular, under alkaline conditions. Preferable examples of the removing liquid include SC1.

The wet etching may be carried out only by preparing a removing liquid at 0° C. to 100° C., preferably at 5° C. to 70° C., and dipping a silicon wafer formed with a target substrate to be processed thereinto. If necessary, it is possible to remove the BPSG film easily by the conventional manner such as spraying a removing liquid onto the surface, applying a removing liquid while rotating the wafer, etc.

In general, when a silicon-containing under layer film is used as a mask to process an organic under layer film right under the same by dry etching, the wet-etching rate of the remaining silicon-containing under layer film is lowered. However, the BPSG film formed from the composition for forming a coating type BPSG film of the present invention can maintain a good wet-etching rate even after the dry etching processing of the organic under layer film. Herein, the dry etching for processing the organic under layer film may be performed under conditions using $N_2/H_2$ gas and $O_2$ gas.

Thus, when a pattern is formed by using the composition for forming a coating type BPSG film of the present invention, it is possible to readily wet etch the BPSG film without causing damage to the coating type organic under layer film or the CVD film mainly consisting of carbon.

EXAMPLES

Hereinafter, the present invention will be specifically described with reference to Preparation Examples, Synthesis Examples, Examples, and Comparative Examples, but the present invention is not restricted thereto. "%" in the following examples represents "% by mass", and molecular weight was measured by GPC. Molecular weight was calculated by GPC in terms of polystyrene, using RI detector and tetrahydrofuran as an eluent.

Preparation of Polysilane Compound

Preparation Example (X1)

10.0 g of OGSOL SI-10-20 (Mw 1,900) available from Osaka Gas Chemicals Co., Ltd., was dissolved in 100.0 g of tetrahydrofuran, and then 6.0 g of triethylamine and 16.0 g of ultrapure water were added thereto. After the resulting solution was reacted for 7 hours under reflux, 375 g of propylene glycol monoethyl ether (PGEE) was added thereto, and the mixture was concentrated under reduced pressure to obtain 91.3 g of a PGEE solution containing polysilane compound (X1) (polymer concentration: 11%) with a Mw of 980.

Preparation Example (X2)

10.0 g of OGSOL SI-20-10 (Mw 1,300) available from Osaka Gas Chemicals Co., Ltd., was dissolved in 100.0 g of tetrahydrofuran, and then 2.0 g of 29% aqueous ammonia and 6.0 g of ultrapure water were added thereto. After the resulting solution was reacted 6.5 hours under reflux, 250 g of propylene glycol monoethyl ether (PGEE) was added thereto, and the mixture was concentrated under reduced pressure to obtain 70.3 g of a PGEE solution containing polysilane compound (X2) (polymer concentration: 15%) with a Mw of 870.

Preparation Example (X3)

10.0 g of OGSOL SI-20-10 (improved) (Mw 1,400) available from Osaka Gas Chemicals Co., Ltd., was dissolved in 100.0 g of tetrahydrofuran, and then 6.0 g of triethylamine and 16.0 g of ultrapure water were added thereto. After the resulting solution was reacted for 12 hours under reflux, 250 g of propylene glycol monoethyl ether (PGEE) was added thereto, and the mixture was concentrated under reduced pressure to obtain 71.3 g of a PGEE solution containing polysilane compound (X3) (polymer concentration: 14%) with a Mw of 830.

In the following, formulation amounts of Preparation Examples (X1) to (X3) are summarized in Table 1.

TABLE 1

| Preparation Examples | Raw materials for reaction | Mw |
|---|---|---|
| X1 | SI-10-20: 10.0 g | 980 |
| X2 | SI-20-10: 10.0 g | 870 |
| X3 | SI-20-10 (improved): 10.0 g | 830 |

Synthesis of Compound (A)

Synthesis Example (A1)

To a mixture comprising 120 g of PGEE, 1 g of 70% nitric acid, and 60 g of deionized water was added a mixture comprising 13.6 g of methyl trimethoxy silane (M1), 5.0 g of phenyl trimethoxy silane (M2), 45.7 g of tetramethoxy silane (M5), 6.3 g of tributyl phosphate (M7), 2.6 g of trimethyl borate (M11), and 54.6 g of the PGEE solution containing polysilane compound (X1), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 270 g of a PGEE solution containing polymer (A1) (polymer concentration: 12%) with a Mw of 2,600.

Synthesis Example (A2)

To a mixture comprising 70 g of PGEE, 1 g of 70% nitric acid, 60 g of deionized water, and 3.1 g of phenyl borate (M12) was added a mixture comprising 13.6 g of methyl trimethoxy silane (M1), 45.7 g of tetramethoxy silane (M5), 3.1 g of dimethyl methylphosphonate (M8), and 54.6 g of the PGEE solution containing polysilane compound (X1), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 290 g of a PGEE solution containing polymer (A2) (polymer concentration: 12%) with a Mw of 2,800.

Synthesis Example (A3)

To a mixture comprising 100 g of PGEE, 1 g of 70% nitric acid, 60 g of deionized water, 1.6 g of boric acid (M13), and 4.0 g of phenyl phosphonate (M9) was added a mixture comprising 17.0 g of methyl trimethoxy silane (M1), 45.7 g of tetramethoxy silane (M5), and 20.4 g of the PGEE solution containing polysilane compound (X2), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 280 g of a PGEE solution containing polymer (A3) (polymer concentration: 12%) with a Mw of 2,900.

Synthesis Example (A4)

To a mixture comprising 100 g of PGEE, 1 g of 70% nitric acid, 60 g of deionized water, 1.6 g of boric acid (M13), and 2.5 g of phosphoric acid (M10) was added a mixture comprising 13.6 g of methyl trimethoxy silane (M1), 5.4 g of 4-fluorophenyl trimethoxy silane (M3), 45.7 g of tetramethoxy silane (M5), and 20.4 g of the PGEE solution containing polysilane compound (X2), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 300 g of a PGEE solution containing polymer (A4) (polymer concentration: 11%) with a Mw of 2,600.

Synthesis Example (A5)

To a mixture comprising 100 g of PGEE, 1 g of 70% nitric acid, and 60 g of deionized water was added a mixture comprising 13.6 g of methyl trimethoxy silane (M1), 5.0 g of phenyl trimethoxy silane (M2), 45.7 g of tetramethoxy silane (M5), 6.3 g of tributyl phosphate (M7), 2.6 g of trimethyl borate (M11), and 21.8 g of the PGEE solution containing polysilane compound (X3), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 300 g of a PGEE solution containing polymer (A5) (polymer concentration: 11%) with a Mw of 2,700.

Synthesis Example (A6)

To a mixture comprising 100 g of PGEE, 1 g of 70% nitric acid, 60 g of deionized water, 1.6 g of boric acid (M13), and 2.5 g of phosphoric acid (M10) was added a mixture comprising 13.6 g of methyl trimethoxy silane (M1), 5.0 g of phenyl trimethoxy silane (M2), 9.3 g of 2-acetoxy-1,1,1-trifluoro-2-(trifluoromethyl)butyl trimethoxy silane (M6), 41.9 g of tetramethoxy silane (M5), and 21.8 g of the PGEE solution containing polysilane compound (X3), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 310 g of a PGEE solution containing polymer (A6) (polymer concentration: 13%) with a Mw of 3,000.

Synthesis Example (A7)

To a mixture comprising 120 g of methanol, 1 g of 70% nitric acid, and 60 g of deionized water was added a mixture comprising 5.0 g of phenyl trimethoxy silane (M2), 17.0 g of methyl trimethoxy silane (M1), 45.7 g of tetramethoxy silane (M5), 6.3 g of tributyl phosphate (M7), and 2.6 g of trimethyl borate (M11), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 270 g of a PGEE solution containing polymer (A7) (polymer concentration: 12%) with a Mw of 2,500.

Synthesis Example (A8)

To a mixture comprising 120 g of PGEE, 1 g of 70% nitric acid, 60 g of deionized water, 3.1 g of boric acid (M13), and 2.5 g of phosphoric acid (M10) was added a mixture comprising 5.0 g of phenyl trimethoxy silane (M2) and 60.9 g of tetramethoxy silane (M5), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 300 g of a PGEE solution containing polymer (A8) (polymer concentration: 10%) with a Mw of 2,600.

Synthesis Example (A9)

To a mixture comprising 120 g of methanol, 1 g of 70% nitric acid, and 60 g of deionized water was added a mixture comprising 13.6 g of methyl trimethoxy silane (M1), 5.8 g of 4-chlorophenyl trimethoxy silane (M4), 49.5 g of tetramethoxy silane (M5), 3.1 g of dimethyl methylphosphonate (M8), and 2.6 g of trimethyl borate (M11), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 300 g of a PGEE solution containing polymer (A9) (polymer concentration: 11%) with a Mw of 2,600.

In the following, formulation amounts of Synthesis Examples (A1) to (A9) are summarized in Table 2.

resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 300 g of a PGEE solution containing polymer (C1) (polymer concentration: 13%). The molecular weight of the obtained polymer was measured in terms of polystyrene, consequently finding a Mw of 3,200.

Synthesis Example (C2)

To a mixture comprising 120 g of methanol, 1 g of methanesulfonic acid, and 60 g of deionized water was added a mixture comprising 9.9 g of phenyl trimethoxy silane (M2), 54.5 g of methyl trimethoxy silane (M1), and 12.5 g of tributyl phosphate (M7), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 310 g of a PGEE solution containing polymer (C2) (polymer concentration: 12%). The molecular weight of the obtained polymer was measured in terms of polystyrene, consequently finding a Mw of 3,500.

Synthesis Example (C3)

To a mixture comprising 120 g of methanol, 1 g of methanesulfonic acid, and 60 g of deionized water was added a mixture comprising 61.3 g of methyl trimethoxy silane (M1) and 7.6 g of tetramethoxy silane (M5), and the resulting mixture was maintained at 40° C. for 12 hours to carry out hydrolysis condensation. After completion of the reaction, 300 g of PGEE was added thereto, and a by-produced alcohol and excess water were distilled off under reduced pressure to obtain 300 g of a PGEE solution containing polymer (C3) (polymer concentration: 11%). The molecular weight of the obtained polymer was measured in terms of polystyrene, consequently finding a Mw of 3,500.

Synthesis Example (C4)

To a mixture comprising 120 g of methanol, 1 g of methanesulfonic acid, and 60 g of deionized water was

TABLE 2

| | Raw materials for reaction | | | | |
|---|---|---|---|---|---|
| Synthesis Examples | Silicon compound | Phosphorus compound | Boron compound | Polysilane compound | Mw |
| (A1) | M1: 13.6 g, M2: 5.0 g, M5: 45.7 g | M7: 6.3 g | M11: 2.6 g | (X1): 54.6 g | 2,600 |
| (A2) | M1: 13.6 g, M5: 45.7 g | M8: 3.1 g | M12: 3.1 g | (X1): 54.6 g | 2,800 |
| (A3) | M1: 17.0 g, M5: 45.7 g | M9: 4.0 g | M13: 1.6 g | (X2): 20.4 g | 2,900 |
| (A4) | M1: 13.6 g, M3: 5.4 g, M5: 45.7 g | M10: 2.5 g | M13: 1.6 g | (X2): 20.4 g | 2,600 |
| (A5) | M1: 13.6 g, M2: 5.0 g, M5: 45.7 g | M7: 6.3 g | M11: 2.6 g | (X3): 21.8 g | 2,700 |
| (A6) | M1: 13.6 g, M2: 5.0 g, M6: 9.3 g, M5: 41.9 g, | M10: 2.5 g | M13: 1.6 g | (X3): 21.8 g | 3,000 |
| (A7) | M1: 17.0 g, M2: 5.0 g, M5: 45.7 g | M7: 6.3 g | M11: 2.6 g | | 2,500 |
| (A8) | M2: 5.0 g, M5: 60.9 g, | M10: 2.5 g | M13: 3.1 g | | 2,600 |
| (A9) | M1: 13.6 g, M4: 5.8 g, M5: 49.5 g, | M8: 3.1 g | M11: 2.6 g | | 2,600 |

Synthesis of Component (C)

Synthesis Example (C1)

To a mixture comprising 120 g of methanol, 1 g of methanesulfonic acid, and 60 g of deionized water was added a mixture comprising 34.1 g of methyl trimethoxy silane (M1) and 26.0 g of trimethyl borate (M11), and the added a mixture comprising 34.1 g of methyl trimethoxy silane (M1) and 67.6 g of 4-tert-butoxyphenyl trimethoxy silane (M14), and the resulting mixture was maintained at 40° C. for 24 hours to carry out hydrolysis condensation. After completion of the reaction, 500 g of PGEE was added thereto, and a by-produced alcohol and excess water were distilled off under reduced pressure to obtain 570 g of a PGEE solution containing polymer (C4) (polymer concentration: 12%). The molecular weight of the obtained polymer was measured in terms of polystyrene, consequently finding a Mw of 2,700.

Synthesis Examples (C5) to (C11)

PGEE solutions containing polymers (C5) to (C11) were obtained in the same manner as in Synthesis Example (C4) using monomers shown in Table 3.

In the following, formulation amounts of Synthesis Examples (C1) to (C11) are summarized in Table 3.

TABLE 3

| Synthesis Examples | Raw materials for reaction | Mw |
|---|---|---|
| (C1) | M1: 34.1 g, M11: 26.0 g | 3,200 |
| (C2) | M2: 9.9 g, M1: 54.5 g, M7: 12.5 g | 3,500 |
| (C3) | M1: 61.3 g, M5: 7.6 g | 3,500 |
| (C4) | M1: 34.1 g, M14: 67.6 g | 2,700 |
| (C5) | M1: 34.1 g, M15: 74.6 g | 3,000 |
| (C6) | M1: 34.1 g, M16: 81.6 g | 2,900 |
| (C7) | M1: 34.1 g, M17: 83.1 g | 3,300 |
| (C8) | M1: 34.1 g, M18: 74.6 g | 2,500 |
| (C9) | M1: 34.1 g, M19: 83.6 g | 3,000 |
| (C10) | M1: 34.1 g, M20: 89.2 g | 3,300 |
| (C11) | M1: 34.1 g, M21: 82.6 g | 3,200 |

In the following, structural formula of the compounds used in Synthesis Examples (A1) to (A9) and (C1) to (C11) are shown below.

MeSi(OMe)$_3$     M1

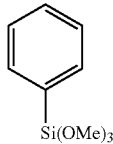     M2

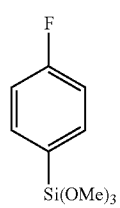     M3

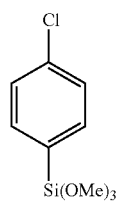     M4

Si(OMe)$_4$     M5

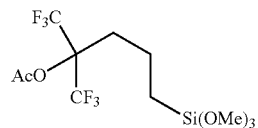     M6

PO(OBu)$_3$     M7

MePO(OMe)$_2$     M8

PhPO(OH)$_2$     M9

H$_3$PO$_4$     M10

B(OMe)$_3$     M11

PhB(OH)$_2$     M12

H$_3$BO$_3$     M13

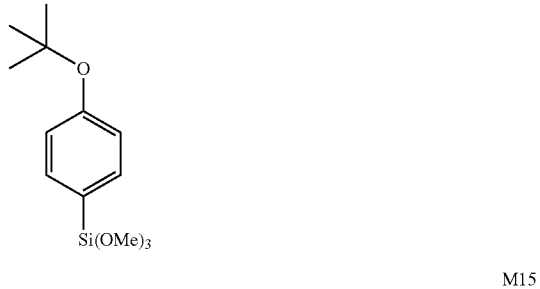     M14

     M15

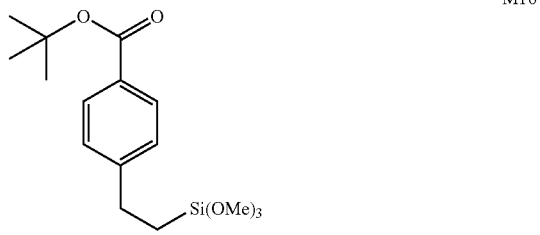     M16

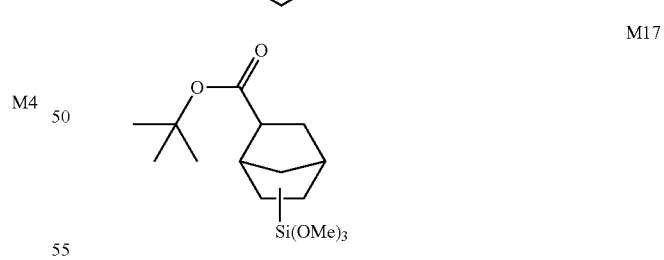     M17

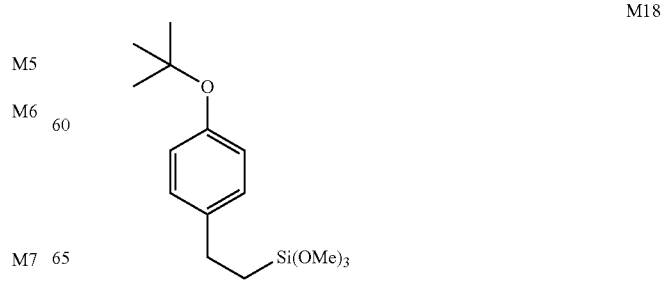     M18

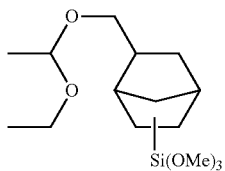 M19

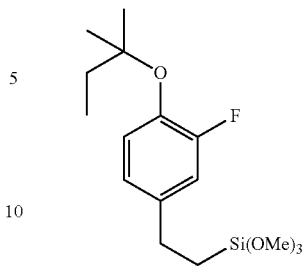 M21

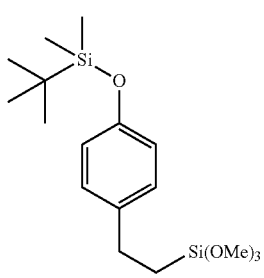 M20

Examples and Comparative Examples

Polymers (A1) to (A9) as component (A), polysilane compounds (X1) to (X3) as component (B), polymers (C1) to (C11) as component (C) each obtained in Preparation Examples and Synthesis Examples, additives, and solvent were mixed with the ratios shown in Table 4, and the respective mixtures were filtered through a 0.1 μm filter made of a fluorine resin to prepare respective solutions of composition for forming a coating type BPSG film, which were named Sols. 1 to 27. Formulation ratio of components (A), (B), and (C) was based on values in terms of solid content.

TABLE 4

| No. | Component (A) (Parts by mass) | Component (B) (Parts by mass) | Component (C) (Parts by mass) | Thermal crosslinking accelerator (Parts by mass) | Photo-acid generator (Parts by mass) | Organic acid (Parts by mass) | Other additives (Parts by mass) | Solvent (Parts by mass) |
|---|---|---|---|---|---|---|---|---|
| Sol. 1 | A1 (4.0) | — | — | TPSNO$_3$ (0.04) | — | Maleic acid (0.04) | — | PGEE/water (150/15) |
| Sol. 2 | A2 (4.0) | — | — | TPSMA (0.04) | — | Oxalic acid (0.04) | — | PGEE/water (150/15) |
| Sol. 3 | A2 (3.8) | — | C1 (0.2) | TPSMA (0.04) | — | Oxalic acid (0.04) | TEAOH (0.04) | PGEE/water (150/15) |
| Sol. 4 | A3 (4.0) | — | — | TPSMA (0.04) | — | Maleic acid (0.04) | — | PGEE/water (150/15) |
| Sol. 5 | A3 (3.8) | — | C2 (0.2) | TPSH$_2$PO$_4$ (0.04) | — | Maleic acid (0.04) | H$_3$BO$_3$ (0.04) | PGEE/water (150/15) |
| Sol. 6 | A4 (4.0) | — | C3 (0.2) | TPSMA (0.04) | — | Maleic acid (0.04) | — | PGEE/water (150/15) |
| Sol. 7 | A4 (3.8) | — | C4 (0.2) | TPSH$_2$BO$_3$ (0.04) | — | Maleic acid (0.04) | — | PGEE/water (150/15) |
| Sol. 8 | A5 (4.0) | — | — | TPSNO$_3$ (0.04) | — | Maleic acid (0.04) | — | PGEE/water (150/15) |
| Sol. 9 | A5 (3.6) | X1 (0.2) | C5 (0.2) | TPSMA (0.04) | TPSNf (0.04) | Maleic acid (0.04) | — | PGEE/water (150/15) |
| Sol. 10 | A5 (3.6) | X1 (0.2) | C6 (0.2) | TPSMA (0.04) | — | Oxalic acid (0.04) | XYTOL (0.04) | PGEE/water (150/15) |
| Sol. 11 | A6 (3.8) | — | C7 (0.1) | TPSNO$_3$ (0.04) | — | Oxalic acid (0.04) | SORBOL (0.04) | PGEE/water (150/15) |
| Sol. 12 | A6 (3.7) | X2 (0.2) | C8 (0.1) | TPSNO$_3$ (0.04) | — | Oxalic acid (0.04) | — | PGEE/water (150/15) |
| Sol. 13 | A7 (3.8) | X1 (0.2) | — | TPSNO$_3$ (0.04) | — | Maleic acid (0.04) | — | PGEE/water (150/15) |
| Sol. 14 | A7 (3.8) | X2 (0.2) | — | TPSNO$_3$ (0.04) | — | Maleic acid (0.04) | — | PGEE/water (150/15) |
| Sol. 15 | A7 (3.7) | X3 (0.2) | C9 (0.1) | TPSMA (0.04) | — | Maleic acid (0.04) | TMOL (0.04) | PGEE/water (150/15) |
| Sol. 16 | A7 (3.5) | X2 (0.4) | C10 (0.1) | QMANO$_3$ (0.04) | — | Maleic acid (0.04) | H$_3$PO$_4$ (0.01) | PGEE/water (150/15) |
| Sol. 17 | A7 (3.7) | X3 (0.2) | C11 (0.1) | TPSMA (0.04) | — | Maleic acid (0.04) | TMOL (0.04) | PGEE/water (150/15) |
| Sol. 18 | A8 (3.6) | X3 (0.2) | C1 (0.2) | TPSNO$_3$ (0.04) | — | Maleic acid (0.04) | — | PGEE/water (150/15) |
| Sol. 19 | A8 (3.6) | X3 (0.2) | C2 (0.2) | TPSNO$_3$ (0.04) | TPSNf (0.04) | Maleic acid (0.04) | XYTOL (0.04) | PGEE/water (150/15) |

TABLE 4-continued

| No. | Component (A) (Parts by mass) | Component (B) (Parts by mass) | Component (C) (Parts by mass) | Thermal crosslinking accelerator (Parts by mass) | Photo-acid generator (Parts by mass) | Organic acid (Parts by mass) | Other additives (Parts by mass) | Solvent (Parts by mass) |
|---|---|---|---|---|---|---|---|---|
| Sol. 20 | A8 (3.6) | X3 (0.2) | C3 (0.2) | TPSNO$_3$ (0.04) | — | Maleic acid (0.04) | SORBOL (0.04) | PGEE/water (150/15) |
| Sol. 21 | A8 (3.6) | X1 (0.2) | C4 (0.2) | TPSNO$_3$ (0.04) | — | Maleic acid (0.04) | TEAOH (0.04) | PGEE/water (150/15) |
| Sol. 22 | A9 (3.6) | X1 (0.2) | C5 (0.2) | TPSMA (0.04) | — | Maleic acid (0.04) | — | PGEE/water (150/15) |
| Sol. 23 | A9 (3.6) | X1 (0.2) | C6 (0.2) | TPSMA (0.04) | TPSNf (0.04) | Maleic acid (0.04) | PEOL (0.04) | PGEE/water (150/15) |
| Sol. 24 | A9 (3.7) | X2 (0.2) | C7 (0.1) | QMANO$_3$ (0.04) | — | Maleic acid (0.04) | H$_3$BO$_3$ (0.04) | PGEE/water (150/15) |
| Sol. 25 | A7 (4.0) | — | — | TPSNO$_3$ (0.04) | — | Maleic acid (0.04) | — | PGEE/water (150/15) |
| Sol. 26 | A8 (3.8) | — | C2 (0.2) | TPSNO$_3$ (0.04) | — | Maleic acid (0.04) | XYTOL (0.04) | PGEE/water (150/15) |
| Sol. 27 | A9 (3.8) | — | C5 (0.2) | TPSMA (0.04) | — | Maleic acid (0.04) | — | PGEE/water (150/15) |

Additives in the above Table 4 used are as follows:
TPSH$_2$PO$_4$: Mono(triphenylsulfonium)phosphate
TPSH$_2$BO$_3$: Mono(triphenylsulfonium)borate
TPSMA: Mono(triphenylsulfonium) maleate
TPSNO$_3$: Triphenyl sulfonium nitrate
QMANO$_3$: Tetramethyl ammonium nitrate
TPSNf: Triphenyl sulfonium nonafluorobutanesulfonate
TEAOH: Triethanolamine
PEOL: Pentaerythritol
TMOL: Trimethylolethane
SORBOL: Sorbitol
XYTOL: Xylitol

[Coating Film Wet Etching Test (Film Untreated after Coating)]

The solutions of the composition for forming a coating type BPSG film, Sols. 1 to 27, were each applied on a silicon wafer by spin coating, and heated at 240° C. for 160 seconds to form BPSG films, Films 1 to 27, each having a film thickness of 35 nm. These BPSG films were dipped in a 1% aqueous hydrogen peroxide containing 0.6% ammonia (hereinafter referred to as "ammonia per-water") at 50° C. for 10 minutes, and the thickness of the remaining film was measured by M-2000 High-speed Spectroscopic Ellipsometer manufactured by J.A. Woollam Co., Inc. The results are shown in Table 5.

TABLE 5

| Examples | BPSG film | Film thickness before treatment (Å) | Film thickness after treatment (Å) |
|---|---|---|---|
| Example 1-1 | Film 1 | 351 | 2 or less |
| Example 1-2 | Film 2 | 353 | 2 or less |
| Example 1-3 | Film 3 | 352 | 2 or less |
| Example 1-4 | Film 4 | 350 | 2 or less |
| Example 1-5 | Film 5 | 349 | 2 or less |
| Example 1-6 | Film 6 | 355 | 2 or less |
| Example 1-7 | Film 7 | 346 | 2 or less |
| Example 1-8 | Film 8 | 350 | 2 or less |
| Example 1-9 | Film 9 | 351 | 2 or less |
| Example 1-10 | Film 10 | 345 | 2 or less |
| Example 1-11 | Film 11 | 348 | 2 or less |
| Example 1-12 | Film 12 | 349 | 2 or less |
| Example 1-13 | Film 13 | 353 | 2 or less |
| Example 1-14 | Film 14 | 351 | 2 or less |
| Example 1-15 | Film 15 | 349 | 2 or less |
| Example 1-16 | Film 16 | 348 | 2 or less |
| Example 1-17 | Film 17 | 350 | 2 or less |
| Example 1-18 | Film 18 | 351 | 2 or less |
| Example 1-19 | Film 19 | 347 | 2 or less |
| Example 1-20 | Film 20 | 346 | 2 or less |
| Example 1-21 | Film 21 | 355 | 2 or less |
| Example 1-22 | Film 22 | 353 | 2 or less |
| Example 1-23 | Film 23 | 349 | 2 or less |
| Example 1-24 | Film 24 | 347 | 2 or less |
| Comparative Example 1-1 | Film 25 | 346 | 2 or less |
| Comparative Example 1-2 | Film 26 | 346 | 2 or less |
| Comparative Example 1-3 | Film 27 | 349 | 2 or less |

As shown in Table 5, Films 1 to 27, which are BPSG film formed by using the composition for forming a coating type BPSG film, each showed a film thickness of 2 Å or less after treatment with ammonia per-water, and thus could be removed sufficiently.

[Coating Film Wet Etching Test (Film after Dry Etching Treatment)]

Next, wet etching test was performed with respect to the BPSG film after dry etching treatment for processing the organic under layer film. The BPSG films, Films 1 to 27, obtained in the same manner as above were each subjected to dry etching under the following conditions by using an etching device Telius manufactured by Tokyo Electron Ltd, and then dipped in ammonia per-water at 50° C. for 10 minutes, and the thickness of the remaining film was measured by M-2000 High-speed Spectroscopic Ellipsometer manufactured by J.A. Woollam Co., Inc. The results are shown in Table 6.

(Dry Etching Conditions of BPSG Film)

| | |
|---|---|
| Chamber pressure | 2.7 Pa |
| RF power | 1,000 W |

-continued

| | |
|---|---|
| N₂ gas flow rate | 500 mL/min |
| H₂ gas flow rate | 30 mL/min |
| Treatment time | 60 sec |

TABLE 6

| Examples | BPSG film | Film thickness before treatment (Å) | Film thickness after dry etching (Å) | Film thickness after treatment (Å) |
|---|---|---|---|---|
| Example 2-1 | Film 1 | 351 | 297 | 2 or less |
| Example 2-2 | Film 2 | 353 | 304 | 2 or less |
| Example 2-3 | Film 3 | 352 | 301 | 2 or less |
| Example 2-4 | Film 4 | 350 | 298 | 2 or less |
| Example 2-5 | Film 5 | 349 | 303 | 2 or less |
| Example 2-6 | Film 6 | 355 | 299 | 2 or less |
| Example 2-7 | Film 7 | 346 | 300 | 2 or less |
| Example 2-8 | Film 8 | 350 | 295 | 2 or less |
| Example 2-9 | Film 9 | 351 | 296 | 2 or less |
| Example 2-10 | Film 10 | 345 | 299 | 2 or less |
| Example 2-11 | Film 11 | 348 | 290 | 2 or less |
| Example 2-12 | Film 12 | 349 | 292 | 2 or less |
| Example 2-13 | Film 13 | 353 | 302 | 2 or less |
| Example 2-14 | Film 14 | 350 | 303 | 2 or less |
| Example 2-15 | Film 15 | 349 | 297 | 2 or less |
| Example 2-16 | Film 16 | 348 | 299 | 2 or less |
| Example 2-17 | Film 17 | 350 | 301 | 2 or less |
| Example 2-18 | Film 18 | 351 | 306 | 2 or less |
| Example 2-19 | Film 19 | 347 | 308 | 2 or less |
| Example 2-20 | Film 20 | 346 | 307 | 2 or less |
| Example 2-21 | Film 21 | 355 | 306 | 2 or less |
| Example 2-22 | Film 22 | 353 | 298 | 2 or less |
| Example 2-23 | Film 23 | 349 | 296 | 2 or less |
| Example 2-24 | Film 24 | 347 | 299 | 2 or less |
| Comparative Example 2-1 | Film 25 | 346 | 301 | 48 |
| Comparative Example 2-2 | Film 26 | 346 | 300 | 31 |
| Comparative Example 2-3 | Film 27 | 349 | 303 | 32 |

As shown in Table 6, Films 1 to 24, which are BPSG films formed by using the composition for forming a coating type BPSG film of the present invention, could be sufficiently removed by ammonia per-water even after N₂/H₂ dry etching.

On the other hand, in Films 25 to 27, which contain no silicon skeletal structure, the thicknesses of the film treated with ammonia per-water after dry etching were each 30 Å or more, and thus it could not be sufficiently removed.

[Patterning Test by Positive Development]

A spin-on carbon film ODL-50 (Carbon content: 80% by mass) available from Shin-Etsu Chemical Co., Ltd., was formed on a silicon wafer so as to have a film thickness of 200 nm. The solutions of the composition for forming a coating type BPSG film, Sols. 1 to 24, were each applied thereon and heated at 240° C. for 60 seconds to form BPSG films, Films 1 to 24 with a film thickness of 35 nm, respectively.

Subsequently, the ArF resist solution for positive development (PR-1) described in Table 7 was applied on the BPSG film, and baked at 110° C. for 60 seconds to form a photoresist film having a film thickness of 100 nm. Further, the liquid immersion top coat (TC-1) described in Table 8 was applied on the photoresist film and baked at 90° C. for 60 seconds to form a top coat with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 43 nm 1:1 positive line and space pattern.

A cross-sectional shape of the thus obtained substrate was observed by an electron microscope (S-9380) manufactured by Hitachi Ltd., and pattern collapse of the same was observed by an electron microscope (CG4000) manufactured by Hitachi High-Technologies Corporation.

The composition of the ArF resist solution for positive development (PR-1) to be used for the above-mentioned patterning test by positive development is shown in Table 7.

TABLE 7

| No. | Polymer (Parts by mass) | Acid generator (Parts by mass) | Base (Parts by mass) | Solvent (Parts by mass) |
|---|---|---|---|---|
| PR-1 | ArF resist polymer 1 (100) | PAG1 (7.0) | Quencher (1.0) | PGMEA (2,500) |

Molecular weight, dispersity, and structural formula of ArF resist polymer 1 described in Table 7 are shown below.
ArF resist polymer 1: Molecular weight (Mw)=7,800
Dispersity (Mw/Mn)=1.78

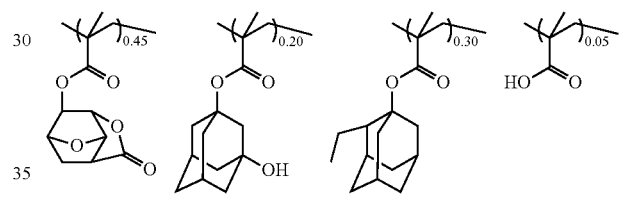

Structural formula of the acid generator: PAG1 described in Table 7 is shown below.

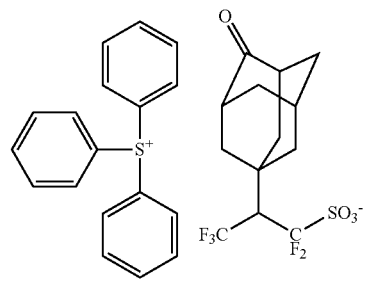

Structural formula of the base: Quencher described in Table 7 is shown below.

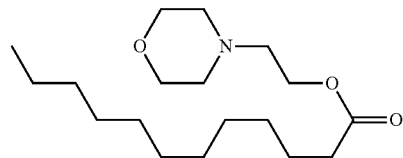 [SMILES: CCCCCCCCCCCC(=O)OCCN1CCOCC1]

The composition of the liquid immersion top coat (TC-1) to be used in the patterning test by positive development is shown in Table 8.

TABLE 8

| | Polymer (Parts by mass) | Organic solvent (Parts by mass) |
|---|---|---|
| TC-1 | Top coat polymer (100) | Diisoamylether(2700) 2-methyl-1-butanol(270) |

Molecular weight, dispersity, and structural formula of Top coat polymer described in Table 8 are shown below.
Top coat polymer: Molecular weight (Mw)=8,800
Dispersity (Mw/Mn)=1.69

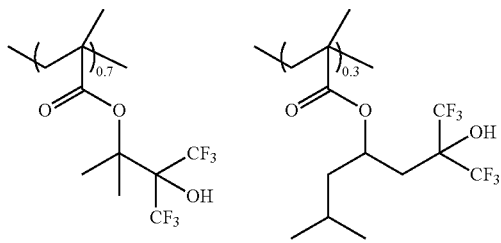

The results of observing the cross-sectional shape of the substrates and pattern collapse of the same obtained by the patterning test by positive development are shown in Table 9.

TABLE 9

| Examples | BPSG film | Film formability | Cross-sectional pattern shape after development | Pattern collapse |
|---|---|---|---|---|
| Example 3-1 | Film 1 | Good | Vertical shape | None |
| Example 3-2 | Film 2 | Good | Vertical shape | None |
| Example 3-3 | Film 3 | Good | Vertical shape | None |
| Example 3-4 | Film 4 | Good | Vertical shape | None |
| Example 3-5 | Film 5 | Good | Vertical shape | None |
| Example 3-6 | Film 6 | Good | Vertical shape | None |
| Example 3-7 | Film 7 | Good | Vertical shape | None |
| Example 3-8 | Film 8 | Good | Vertical shape | None |
| Example 3-9 | Film 9 | Good | Vertical shape | None |
| Example 3-10 | Film 10 | Good | Vertical shape | None |
| Example 3-11 | Film 11 | Good | Vertical shape | None |
| Example 3-12 | Film 12 | Good | Vertical shape | None |
| Example 3-13 | Film 13 | Good | Vertical shape | None |
| Example 3-14 | Film 14 | Good | Vertical shape | None |
| Example 3-15 | Film 15 | Good | Vertical shape | None |
| Example 3-16 | Film 16 | Good | Vertical shape | None |
| Example 3-17 | Film 17 | Good | Vertical shape | None |
| Example 3-18 | Film 18 | Good | Vertical shape | None |
| Example 3-19 | Film 19 | Good | Vertical shape | None |
| Example 3-20 | Film 20 | Good | Vertical shape | None |
| Example 3-21 | Film 21 | Good | Vertical shape | None |
| Example 3-22 | Film 22 | Good | Vertical shape | None |
| Example 3-23 | Film 23 | Good | Vertical shape | None |
| Example 3-24 | Film 24 | Good | Vertical shape | None |

As shown in Table 9, in the positive development, the substrates that used the BPSG film formed from the composition for forming a coating type BPSG film of the present invention as a resist under layer film gave a resist cross-section of a vertical shape. Also, pattern collapse was not found in such substrates.

[Patterning Test by Negative Development]

A spin-on carbon film ODL-50 (Carbon content: 80% by mass) available from Shin-Etsu Chemical Co., Ltd., was formed on a silicon wafer so as to have a film thickness of 200 nm. The solutions of the composition for forming a coating type BPSG film, Sols. 8 to 13 and 18 to 21 were each applied thereon and heated at 240° C. for 60 seconds to form BPSG films, Films 8 to 13 and 18 to 21 with a film thickness of 35 nm, respectively.

Subsequently, the ArF resist solution for negative development (PR-2) described in Table 10 was applied on the BPSG film, and baked at 100° C. for 60 seconds to form a photoresist film having a film thickness of 100 nm. Further, the liquid immersion top coat (TC-1) described in Table 8 was applied on the photoresist film and baked at 90° C. for 60 seconds to form a top coat with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), and baked at 100° C. for 60 seconds (PEB). Thereafter, while rotating with 30 rpm, butyl acetate was discharged for 3 seconds from a development nozzle as a developer, rotation was then stopped, and paddle development was performed for 27 seconds. The resulting wafer was rinsed with diisoamyl ether, spin dried, and baked at 100° C. for 20 seconds to evaporate the rinsing solvent. According to this patterning, 43 nm 1:1 negative line and space pattern was obtained.

A cross-sectional shape of the thus obtained substrate was observed by an electron microscope (S-4700) manufactured by Hitachi Ltd., and pattern collapse of the same was observed by an electron microscope (CG4000) manufactured by Hitachi High-Technologies Corporation.

The composition of the ArF resist solution for negative development (PR-2) to be used for the patterning test by negative development is shown in Table 10.

TABLE 10

| No. | Polymer (Parts by mass) | Acid generator (Parts by mass) | Base (Parts by mass) | Solvent (Parts by mass) |
|---|---|---|---|---|
| PR-2 | ArF resist polymer 2 (100) | PAG2 (7.0) | Quencher (1.0) | PGMEA (2,500) |

Molecular weight, dispersity, and structural formula of ArF resist polymer 2 described in Table 10 are shown below.
ArF resist polymer 2: Molecular weight (Mw)=8,600
Dispersity (Mw/Mn)=1.88

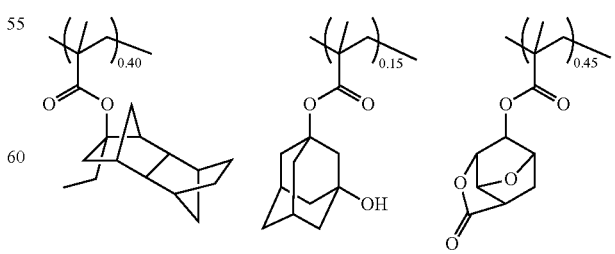

Structural formula of the acid generator: PAG2 described in Table 10 is shown below.

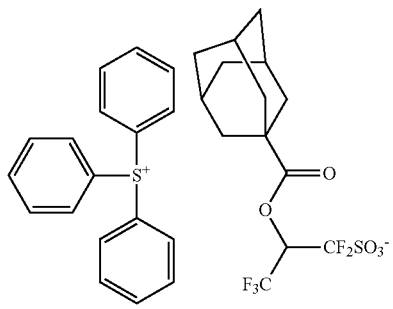

Meanwhile, the base: Quencher shown in Table 10 was used the same one as that used in PR-1 of the patterning test by positive development.

The results of observing the cross-sectional shape of the substrates and pattern collapse of the same obtained by the patterning test by negative development are shown in Table 11.

TABLE 11

| Examples | BPSG film | Film formability | Cross-sectional pattern shape after development | Pattern collapse |
|---|---|---|---|---|
| Example 4-1 | Film 8 | Good | Vertical shape | None |
| Example 4-2 | Film 9 | Good | Vertical shape | None |
| Example 4-3 | Film 10 | Good | Vertical shape | None |
| Example 4-4 | Film 11 | Good | Vertical shape | None |
| Example 4-5 | Film 12 | Good | Vertical shape | None |
| Example 4-6 | Film 13 | Good | Vertical shape | None |
| Example 4-7 | Film 18 | Good | Vertical shape | None |
| Example 4-8 | Film 19 | Good | Vertical shape | None |
| Example 4-9 | Film 20 | Good | Vertical shape | None |
| Example 4-10 | Film 21 | Good | Vertical shape | None |

As shown in Table 11, also in the negative development, the substrates that used the BPSG film formed from the composition for forming a coating type BPSG film of the present invention as a resist under layer film gave a resist cross-section of a vertical shape. Moreover, pattern collapse was not found in such substrates.

From the above results, it could be clarified that the coating type BPSG film formed by using the composition for forming a coating type BPSG film of the present invention can be easily wet etched by a removing liquid such as SC-1 (ammonia per-water), which does not cause damage to the substrate to be processed and the coating type organic under layer film or the CVD film mainly consisting of carbon, and peelability thereof can be maintained even after processing the organic under layer film by dry etching. Further, it could be also clarified that the coating type BPSG film formed by using the composition for forming a coating type BPSG film of the present invention may serve as a resist under layer film that has excellent adhesiveness to the photoresist pattern formed thereon, and does not cause pattern collapse even in fine pattern.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A composition for forming a BPSG film, comprising: one or more silicic acid skeletal structures represented by the formula (1); one or more phosphoric acid skeletal structures represented by the formula (2); one or more boric acid skeletal structures represented by the formula (3); and one or more silicon skeletal structures represented by the formula (4); wherein the composition contains a polysilane structure obtained by a coupling between units in the formula (4),

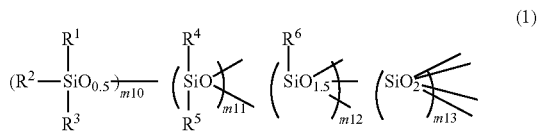

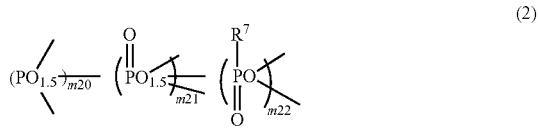

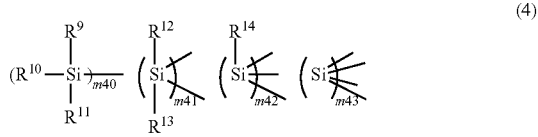

wherein $R^1$, $R^2$, $R^3$, $R^4$, $R^5$, $R^6$, $R^7$, and $R^8$ each represent a hydrogen atom or an organic group having 1 to 30 carbon atoms, wherein a hydrogen atom(s) in the organic group may be substituted by a halogen atom(s); $R^9$, $R^{10}$, $R^{11}$, $R^{12}$, $R^{13}$, and $R^{14}$ each represent a methyl group, a phenyl group, or a hydroxyl group; m10, m11, m12, and m13 each represent a molar fraction in the silicic acid skeletal structure, and satisfy m10+m11+m12+m13=1, 0≤m10≤0.3, 0≤m11≤0.5, 0≤m12≤0.7, and 0<m13≤1; m20, m21, and m22 each represent a molar fraction in the phosphoric acid skeletal structure, and satisfy m20+m21+m22=1, 0≤m20≤1, 0≤m21≤1, and 0≤m22<1; m30 and m31 each represent a molar fraction in the boric acid skeletal structure, and satisfy m30+m31=1, 0≤m30≤1, and 0≤m31≤1; and m40, m41, m42, and m43 each represent a molar fraction in the silicon skeletal structure, and satisfy m40+m41+m42+m43=1, 0≤m40≤1, 0≤m41≤1, 0≤m42≤1, and 0≤m43≤1.

2. The composition for forming a BPSG film according to claim 1, wherein the composition comprises a solvent and (A) one or more polymers selected from the group consisting of a hydrolysate, a condensate, and a hydrolysis condensate of a mixture containing one or more silicon compounds represented by the formulae (A-1-1) to (A-1-4), one or more phosphorus compounds represented by the formulae (A-2-1) to (A-2-6), one or more boron compounds represented by the formulae (A-3-1) to (A-3-3), and one or more polysilane compounds represented by the formula (A-4-1), $R^1R^2R^3SiOR$     (A-1-1)

$R^4R^5Si(OR)_2$     (A-1-2)

$R^6Si(OR)_3$     (A-1-3)

$Si(OR)_4$     (A-1-4)

wherein R represents a hydrocarbon group having 1 to 6 carbon atoms; and $R^1$, $R^2$, $R^3$, $R^4$, $R^5$, and $R^6$ have the same meanings as defined above, $$PX_3 \quad (A\text{-}2\text{-}1)$$

$$POX_3 \quad (A\text{-}2\text{-}2)$$

$$P_2O_5 \quad (A\text{-}2\text{-}3)$$

$$H(HPO_3)_{a1}OH \quad (A\text{-}2\text{-}4)$$

$$R^7PX_2 \quad (A\text{-}2\text{-}5)$$

$$R^7POX_2 \quad (A\text{-}2\text{-}6)$$

wherein $R^7$ has the same meaning as defined above; X represents a halogen atom, a hydroxyl group, or an alkoxy group having 1 to 6 carbon atoms; and a1 is an integer of 1 or more, $$BX_3 \quad (A\text{-}3\text{-}1)$$

$$B_2O_3 \quad (A\text{-}3\text{-}2)$$

$$R^8BX_2 \quad (A\text{-}3\text{-}3)$$

wherein $R^8$ and X have the same meanings as defined above, $$(R^9R^{10}R^{11}Si)_{a2}(R^{12}R^{13}Si)_{a3}(R^{14}Si)_{a4}(Si)_{a5} \quad (A\text{-}4\text{-}1)$$

wherein $R^9$, $R^{10}$, $R^{11}$, $R^{12}$, $R^{13}$, and $R^{14}$ have the same meanings as defined above; and a2, a3, a4, and a5 each represent a molar fraction, and satisfy a2+a3+a4+a5=1, $0 \le a2 \le 1$, $0 \le a3 \le 1$, $0 \le a4 \le 1$, and $0 \le a5 \le 1$.

3. The composition for forming a BPSG film according to claim 2, wherein the compound represented by the formula (A-4-1) has a weight average molecular weight of 1,000 or less.

4. The composition for forming a BPSG film according to claim 1, wherein the composition comprises: a solvent; (A) one or more polymers selected from the group consisting of a hydrolysate, a condensate, and a hydrolysis condensate of a mixture containing one or more silicon compounds represented by the formulae (A-1-1) to (A-1-4), one or more phosphorus compounds represented by the formulae (A-2-1) to (A-2-6), and one or more boron compounds represented by the formulae (A-3-1) to (A-3-3); and (B) one or more polysilane compounds represented by the formula (B-1), $$R^1R^2R^3SiOR \quad (A\text{-}1\text{-}1)$$

$$R^4R^5Si(OR)_2 \quad (A\text{-}1\text{-}2)$$

$$R^6Si(OR)_3 \quad (A\text{-}1\text{-}3)$$

$$Si(OR)_4 \quad (A\text{-}1\text{-}4)$$

wherein R represents a hydrocarbon group having 1 to 6 carbon atoms; and $R^1$, $R^2$, $R^3$, $R^4$, $R^5$, and $R^6$ have the same meanings as defined above, $$PX_3 \quad (A\text{-}2\text{-}1)$$

$$POX_3 \quad (A\text{-}2\text{-}2)$$

$$P_2O_5 \quad (A\text{-}2\text{-}3)$$

$$H(HPO_3)_{a1}OH \quad (A\text{-}2\text{-}4)$$

$$R^7PX_2 \quad (A\text{-}2\text{-}5)$$

$$R^7POX_2 \quad (A\text{-}2\text{-}6)$$

wherein $R^7$ has the same meaning as defined above; X represents a halogen atom, a hydroxyl group, or an alkoxy group having 1 to 6 carbon atoms; and a1 is an integer of 1 or more, $$BX_3 \quad (A\text{-}3\text{-}1)$$

$$B_2O_3 \quad (A\text{-}3\text{-}2)$$

$$R^8BX_2 \quad (A\text{-}3\text{-}3)$$

wherein $R^8$ and X have the same meanings as defined above, $$(R^9R^{10}R^{11}Si)_{a2}(R^{12}R^{13}Si)_{a3}(R^{14}Si)_{a4}(Si)_{a5} \quad (B\text{-}1)$$

wherein $R^9$, $R^{10}$, $R^{11}$, $R^{12}$, $R^{13}$, and $R^{14}$ have the same meanings as defined above; and a2, a3, a4, and a5 each represent a molar fraction, and satisfy a2+a3+a4+a5=1, $0 \le a2 \le 1$, $0 \le a3 \le 1$, $0 \le a4 \le 1$, and $0 \le a5 \le 1$.

5. The composition for forming a BPSG film according to claim 4, wherein the compound represented by the formula (B-1) has a weight average molecular weight of 1,000 or less.

6. The composition for forming a BPSG film according to claim 2, wherein the composition further comprises (C) one or more members selected from the group consisting of one or more silicon compounds represented by the formula (C-1), a hydrolysate thereof, a condensate thereof, and a hydrolysis condensate thereof, $$R^{1C}{}_{c1}R^{2C}{}_{c2}R^{3C}{}_{c3}Si(OR^{OC})_{(4-c1-c2-c3)} \quad (C\text{-}1)$$

wherein $R^{OC}$ represents a hydrocarbon group having 1 to 6 carbon atoms; $R^{1C}$, $R^{2C}$, and $R^{3C}$ each represent a hydrogen atom or a monovalent organic group having 1 to 30 carbon atoms; and c1, c2, and c3 are each 0 or 1, and satisfy $1 \le c1+c2+c3 \le 3$.

7. The composition for forming a BPSG film according to claim 4, wherein the composition further comprises (C) one or more members selected from the group consisting of one or more silicon compounds represented by the formula (C-1), a hydrolysate thereof, a condensate thereof, and a hydrolysis condensate thereof, $$R^{1C}{}_{c1}R^{2C}{}_{c2}R^{3C}{}_{c3}Si(OR^{OC})_{(4-c1-c2-c3)} \quad (C\text{-}1)$$

wherein $R^{OC}$ represents a hydrocarbon group having 1 to 6 carbon atoms; $R^{1C}$, $R^{2C}$, and $R^{3C}$ each represent a hydrogen atom or a monovalent organic group having 1 to 30 carbon atoms; and c1, c2, and c3 are each 0 or 1, and satisfy $1 \le c1+c2+c3 \le 3$.

8. The composition for forming a BPSG film according to claim 6, wherein one or more of $R^{1C}$, $R^{2C}$, and $R^{3C}$ in the formula (C-1) are an organic group having a hydroxyl group or a carboxyl group each substituted by an acid-labile group.

9. The composition for forming a BPSG film according to claim 7, wherein one or more of $R^{1C}$, $R^{2C}$, and $R^{3C}$ in the formula (C-1) are an organic group having a hydroxyl group or a carboxyl group each substituted by an acid-labile group.

10. The composition for forming a BPSG film according to claim 6, wherein the component (C) contains one or more members selected from the group consisting of one or more silicon compounds represented by the formulae (A-1-1) to (A-1-4), one or more phosphorus compounds represented by the formulae (A-2-1) to (A-2-6), and one or more boron compounds represented by the formulae (A-3-1) to (A-3-3), a mixture thereof, a hydrolysate thereof, a condensate thereof, and a hydrolysis condensate thereof.

11. The composition for forming a BPSG film according to claim 7, wherein the component (C) contains one or more members selected from the group consisting of one or more silicon compounds represented by the formulae (A-1-1) to (A-1-4); one or more phosphorus compounds represented by the formulae (A-2-1) to (A-2-6); one or more boron compounds represented by the formulae (A-3-1) to (A-3-3); a mixture thereof; a hydrolysate thereof; a condensate thereof; a hydrolysis condensate thereof; and a hydrolysate, a condensate, or a hydrolysis condensate of a mixture containing two compounds selected from the group consisting of the silicon compounds, the phosphorus compounds, and the boron compounds.

12. The composition for forming a BPSG film according to claim 1, wherein the composition further comprises an organic compound having 2 or more hydroxyl groups or carboxyl groups in one molecule.

13. A substrate for use in a semiconductor manufacturing process, comprising a BPSG film formed on a body to be processed by applying the composition for forming a BPSG film according to claim 1.

14. The substrate according to claim 13, wherein the BPSG film functions as at least one of a resist under layer film, a flattening film, and an insulating film.

15. The substrate according to claim 13, wherein the body to be processed is a semiconductor substrate on which a part or whole of semiconductor circuits have been formed, and the BPSG film is formed by applying the composition for forming a BPSG film by spin-coating onto the semiconductor substrate and then baking the same.

16. A patterning process comprising:
forming an organic under layer film on a body to be processed by using an organic under layer film material;
forming a BPSG film on the organic under layer film by using the composition for forming a BPSG film according to claim 1;
forming an upper layer resist film on the BPSG film;
forming a pattern with the upper layer resist film;
transferring the pattern to the BPSG film by etching using the upper layer resist film having the formed pattern as a mask; and
transferring the pattern to the organic under layer film by etching using the BPSG film having the transferred pattern as a mask to form a mask pattern for processing the body to be processed.

17. A patterning process comprising:
forming a hard mask mainly consisting of carbon on a body to be processed by a CVD method;
forming a BPSG film on the hard mask by using the composition for forming a BPSG film according to claim 1;
forming an upper layer resist film on the BPSG film;
forming a pattern with the upper layer resist film;
transferring the pattern to the BPSG film by etching using the upper layer resist film having the formed pattern as a mask; and
transferring the pattern to the hard mask by etching using the BPSG film having the transferred pattern as a mask to form a mask pattern for processing the body to be processed.

18. The patterning process according to claim 16, further comprising removing the BPSG film by wet etching after forming the mask pattern for processing the body to be processed.

19. The patterning process according to claim 17, further comprising removing the BPSG film by wet etching after forming the mask pattern for processing the body to be processed.

20. The patterning process according to claim 18, wherein the wet etching is performed by an alkaline solution.

21. The patterning process according to claim 19, wherein the wet etching is performed by an alkaline solution.

22. The patterning process according to claim 16, wherein the body to be processed is a material in which any of a metal film, an amorphous metal film, a metal carbide film, a metal oxide film, a metal nitride film, a metal oxycarbide film or a metal oxynitride film is formed on a semiconductor substrate on which a part or whole of semiconductor circuits have been formed, as a layer to be processed.

23. The patterning process according to claim 17, wherein the body to be processed is a material in which any of a metal film, an amorphous metal film, a metal carbide film, a metal oxide film, a metal nitride film, a metal oxycarbide film or a metal oxynitride film is formed on a semiconductor substrate on which a part or whole of semiconductor circuits have been formed, as a layer to be processed.

24. The patterning process according to claim 22, wherein the metal constituting the body to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

25. The patterning process according to claim 23, wherein the metal constituting the body to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

26. The patterning process according to claim 16, wherein pattern formation of the upper layer resist film is carried out by a lithography method using light with a wavelength of 300 nm or less or EUV light, an electron beam direct drawing method, a directed self-assembly method or a nano-imprinting lithography method.

27. The patterning process according to claim 17, wherein pattern formation of the upper layer resist film is carried out by a lithography method using light with a wavelength of 300 nm or less or EUV light, an electron beam direct drawing method, a directed self-assembly method or a nano-imprinting lithography method.

* * * * *